(12) United States Patent
Barsoum et al.

(10) Patent No.: US 10,720,644 B2
(45) Date of Patent: Jul. 21, 2020

(54) TWO-DIMENSIONAL, ORDERED, DOUBLE TRANSITION METALS CARBIDES HAVING A NOMINAL UNIT CELL COMPOSITION $M'_2M''_nX_n+1$

(71) Applicant: Drexel University, Philadelphia, PA (US)

(72) Inventors: Michel W. Barsoum, Moorestown, NJ (US); Babak Anasori, Norristown, PA (US); Yury Gogotsi, Warminster, PA (US)

(73) Assignee: Drexel University, Philadelphia, PA (US)

( * ) Notice: Subject to any disclaimer, the term of this patent is extended or adjusted under 35 U.S.C. 154(b) by 117 days.

(21) Appl. No.: 15/567,777

(22) PCT Filed: Apr. 20, 2016

(86) PCT No.: PCT/US2016/028354
§ 371 (c)(1),
(2) Date: Oct. 19, 2017

(87) PCT Pub. No.: WO2017/011044
PCT Pub. Date: Jan. 19, 2017

(65) Prior Publication Data
US 2018/0108910 A1 Apr. 19, 2018

Related U.S. Application Data

(60) Provisional application No. 62/149,890, filed on Apr. 20, 2015.

(51) Int. Cl.
*H01M 4/58* (2010.01)
*H01M 10/0525* (2010.01)
(Continued)

(52) U.S. Cl.
CPC .......... *H01M 4/58* (2013.01); *C01B 21/0602* (2013.01); *C01B 32/90* (2017.08); *C01B 32/907* (2017.08);
(Continued)

(58) Field of Classification Search
CPC ..... H01M 4/58; H01M 10/0525; C30B 29/68; C30B 29/36; C01B 32/90; C01B 32/907;
(Continued)

(56) References Cited

U.S. PATENT DOCUMENTS 4,801,368 A 1/1989 Yamashita et al.
6,180,049 B1 1/2001 Jang et al.
(Continued)

FOREIGN PATENT DOCUMENTS

CN 1726608 A 1/2006
CN 101891141 A 11/2010
(Continued)

OTHER PUBLICATIONS

Barsoum et al, "Room-Temperature Deintercalation and Self-Extrusion of Ga from Cr2GaN", Science, May 7, 1999, 284(5416), 937-939.
(Continued)

*Primary Examiner* — Robert S Carrico
*Assistant Examiner* — Kwang Han
(74) *Attorney, Agent, or Firm* — BakerHostetler

(57) ABSTRACT

The present disclosure is directed to compositions comprising at least one layer having first and second surfaces, each layer comprising: a substantially two-dimensional array of crystal cells, each crystal cell having an empirical formula of $M'_2M''_nX_{n+1}$, such that each X is positioned within an octahedral array of M' and M"; wherein M' and M" each comprise different Group IIIB, IVB, VB, or VIB metals; each X is C, N, or a combination thereof; n=1 or 2; and
(Continued)

wherein the M' atoms are substantially present as two-dimensional outer arrays of atoms within the two-dimensional array of crystal cells; the M" atoms are substantially present as two-dimensional inner arrays of atoms within the two-dimensional array of crystal cells; and the two dimensional inner arrays of M" atoms are sandwiched between the two-dimensional outer arrays of M' atoms within the two-dimensional array of crystal cells.

32 Claims, 24 Drawing Sheets

(51) Int. Cl.
  *C01B 32/90*    (2017.01)
  *C01B 32/907*    (2017.01)
  *C30B 29/36*    (2006.01)
  *C01B 21/06*    (2006.01)
  *C30B 29/60*    (2006.01)
  *C30B 29/38*    (2006.01)
  *C30B 29/68*    (2006.01)
  *C30B 7/02*    (2006.01)

(52) U.S. Cl.
  CPC ............... *C30B 7/02* (2013.01); *C30B 29/36* (2013.01); *C30B 29/38* (2013.01); *C30B 29/60* (2013.01); *C30B 29/68* (2013.01); *H01M 10/0525* (2013.01); *C01P 2002/20* (2013.01); *C01P 2002/70* (2013.01); *C01P 2002/85* (2013.01); *C01P 2006/40* (2013.01)

(58) Field of Classification Search
  CPC .............. C01P 2002/20; C01P 2002/70; C01P 2002/85; C01P 2006/40
  See application file for complete search history.

(56) References Cited

U.S. PATENT DOCUMENTS

| | | |
|---|---|---|
| 6,555,268 B1 | 4/2003 | Inoue et al. |
| 7,446,190 B2 | 11/2008 | Sadelain et al. |
| 2002/0068488 A1 | 6/2002 | Tuller et al. |
| 2003/0148184 A1 | 8/2003 | Omaru et al. |
| 2003/0224168 A1 | 12/2003 | Mack et al. |
| 2004/0048157 A1 | 3/2004 | Neudecket et al. |
| 2004/0229028 A1 | 11/2004 | Sasaki et al. |
| 2007/0065725 A1 | 3/2007 | Inoue |
| 2007/0066503 A1 | 3/2007 | Basaly |
| 2009/0017332 A1* | 1/2009 | Kisi .................... C04B 35/4508 428/697 |
| 2010/0236937 A1 | 9/2010 | Rosvall et al. |
| 2010/0322909 A1 | 12/2010 | Okada et al. |
| 2011/0017585 A1 | 1/2011 | Zhamu et al. |
| 2011/0104464 A1 | 5/2011 | Pyzik et al. |
| 2012/0247800 A1 | 10/2012 | Shah et al. |
| 2013/0092428 A1 | 4/2013 | Kawaguchi et al. |
| 2014/0162130 A1* | 6/2014 | Barsoum ................. C01B 21/06 429/231.8 |
| 2015/0210044 A1 | 7/2015 | Barsoum et al. |
| 2015/0306570 A1 | 10/2015 | Mayes et al. |
| 2016/0336088 A1 | 11/2016 | Barsoum et al. |

FOREIGN PATENT DOCUMENTS

| | | |
|---|---|---|
| EP | 0 948 067 A1 | 10/1999 |
| EP | 1 381 099 A1 | 1/2004 |
| JP | H08 78018 | 3/1996 |
| JP | H10 112316 | 4/1998 |
| JP | 2005 158725 | 6/2005 |
| JP | 2007 214137 A | 8/2007 |
| WO | WO 2002/081372 | 10/2002 |
| WO | WO 2002/096799 A2 | 12/2002 |
| WO | WO 2005/007566 | 1/2005 |
| WO | WO 2006/112869 A2 | 10/2006 |
| WO | WO 2007/093011 | 8/2007 |
| WO | WO 2007/093011 A1 | 8/2007 |
| WO | WO 2007/121931 A2 | 11/2007 |
| WO | WO 2009/063031 A2 | 5/2009 |
| WO | WO 2009/091826 A2 | 7/2009 |
| WO | WO 2010/128492 A1 | 11/2010 |
| WO | WO 2014/088995 A1 | 6/2014 |
| WO | WO 2016/049109   * | 3/2016   ............ H01L 33/02 |
| WO | WO 2016/126596 A2 | 8/2016 |
| WO | WO 2017/011044 A2 | 1/2017 |

OTHER PUBLICATIONS

Barsoum et al, "The Topotactic Transformation of Ti3SiC2 into a Partially Ordered Cubic Ti(C0.67Si0.06) Phase by the Diffusion of Si into Molten Cryolite", Journal of the Electrochemical Society, 1999, 146(10), 3919-3923.

Barsoum, "Physical Properties of the MAX phases", Encyclopedia of Materials: Science and Technology, 2006, 11 pages.

Barsoum, et al., "Synthesis and Characterization of a Remarkable Ceramic: Ti3SiC2," J Amer. Chem. Soc., 1996 79(7), 1953-1956.

Barsoum, M. and El-Raghy, T., "The MAX Phases: Unique New Carbide and Nitride Materials", American Scientist, Jul.-Aug. 2001, 89:334-343.

Barsoum, M., "The $M_{N+1}AX_N$ phases: New Class of Solids", Progress in Solid State Chemistry, Jan. 1, 2000, 28(1-4), 201-281.

Chang et al., "Synthesis of a new graphene-like transition metal carbide by de-intercalating $Ti_3AlC_2$", Mater. Lett., Oct. 2013, 109, 295-298.

Chen et al, "Microstructure and Phase Transformation of Ti 3 AC 2 (A=Al, Si) In Hydrofluoric Acid Solution", Crystal Research and Technology, Oct. 27, 2014, 49(10), 813-819.

Chen et al., "In-situ synthesis of Ti3AlC2/TiC—Al2O3 composite from TiO2—Al—C system", Journal of Materials Science & Technology, 2006, 22, 455-458.

Coleman et al, "Two-Dimensional Nanosheets Produced by Liquid Exfoliation of Layered Materials", Science, Feb. 4, 2011, 331, 568-571.

Eis, PS et al, Accumulation of miR-155 and BIC RNA in Human B Cell Lymphomas. Proceedings of the National Academy of Sciences of the United States of America, Mar. 8, 2005, 102(10), 3627-3632, Abstract.

Eklund et al, "The $M_{n+1}AX_n$ Phases: Materials Science and Thin-Film Processing", Thin Solid Films, 2010, 518, 1851-1878.

Ettmayer et al., "Crystal structure of Cr3(C,N)2 and CrVC2", Monatshefte fur Chemie und Verwandte Teile Anderer Wissenschaften, Jul. 1966, vol. 97, Issue 4, 1258-1262.

European Patent Application No. 12803351.1: Supplementary European Search Report dated Jan. 30, 2015, 14 pages.

Finkel et al., "Magnetotransport properties of the ternary carbide Ti3SiC2: Hall effect, magnetoresistance, and magnetic susceptibility", Physical Review B, Jan. 15, 2002, vol. 65, Issue 3, 4 pages.

Ghidiu et al., "Conductive two-dimensional titanium carbide 'clay' with high volumetric capacitance", Nature, Dec. 2014, 516, 78-81.

Halim et al., "Transparent Conductive Two-Dimensional Titanium Carbide Epitaxial Thin Films", Chem. Mater., 2014, vol. 26, No. 7, 2374-2381, Abstract; p. 2376, Scheme 1, p. 2379, col. 1, para. 2; p. 2379, col. 2, para. 2.

Henadaoui et al., "Ti—Al—C MAX Phases by Aluminothermic Reduction process", International Journal of Self-Propagating High-Temperature Synthesis, 2008, 17, 125-128.

Hu et al. "Two-dimensional $Sc_2C$: A reversible and high-capacity hydrogen storage material predicted by first principles calculations", International Journal of Hydrogen Energy, Jul. 2014, 39, 20, 10606-10612.

Hu et al., "MXene: A New Family of Promising Hydrogen Storage Medium", J. Phys. Chem A, 2013, 117, 14523-14260.

Hu, C., "Low Temperature Thermal Expansion, High Temperature Electrical Conductivity, and Mechanical Properties of Nb4AlC3 Ceramic Synthesized by Spark Plasma Sintering", Journal of Alloys and Compounds, Nov. 13, 2009, 487(1-2), 675-681.

(56) References Cited

OTHER PUBLICATIONS

International Patent Application No. PCT/US13/072733: The International Search Report and the Written Opinion dated Mar. 28, 2014, pp. 1-12.
International Patent Application No. PCT/US13/64503: The International Search Report and the Written Opinion dated Jan. 24, 2014, pp. 1-13.
Korzhavyi et al, "Ab Initio Study of Phase Equilibria in $TiC_x$", Physical Review Letters, Dec. 18, 2001, 88(1), 1-4.
Kulkarni et al, Thermal Expansion and Stability of Ti2SC in Air and Inert Atmospheres, Journal of Alloys and Compounds, 2009, 469, 395-400.
Mogilevsky et al, "The Structure of Multilayered Titania Nanotubes Based on Delaminated Anatase", Chemical Physics Letters, 2008, 460, 517-520.
Myhra, et al., "Crystal-Chemistry of the $Ti_3AlC_2$ and $Tl_4AlN$ Layered Carbide/Nitride Phases—Characterization by XPS", Journal of Physics and Chemistry of Solids, Apr. 2001, vol. 62(4), 811-817.
Nadeau, "Clay Particle Engineering: a Potential New Technology with Diverse Applications", Applied Clay Science, 1987, 2, 83-93.
Naguib et al, "Mxene: A Promising Transition Metal Carbide Anode for Lithium-ion Batteries", Electrochemistry Communications, 2012, 16, 61-64.
Naguib et al, "New Two-dimensional Niobium and Vanadium Carbides as Promising Materials for Li-Ion Batteries", American Chemical Society, Oct. 2013, 135(43), 15966-15969.
Naguib et al, Synthesis of a New Nanocrystalline Titanium Aluminum Fluoride Phase by Reaction of Ti2aic With Hydrofluoric Acid, RSC Adv. 1: 1493-1499, 2011. [retrieved on Mar. 7, 2014]. Retrieved from the internet: <URL: http://pubs.rsc.org .ezproxy.neu.ed u/en/Content/Articlelanding/2011/RA/c1raO0390a#/div, Abstract.
Naguib et al, "Two-Dimensional Nanocrystals Produced by Exfoliation of $Ti_3AlC_2$", Advanced Materials, 2011, 23, 4248-4253.
Naguib et al, "Two-Dimensional Transition Metal Carbides", American Chemical Society, Feb. 2012, 6(2), 1322-1331.
Naguib et al., "Mxenes: A new family of two-dimensional materials", Advanced Materials, 2014, 26, 992-1005.
Nan et al., "Percolation phenomena in niobium-doped TiC1-x", Materials Science and Engineering B-Solid State Materials for Advanced Technology, Feb. 1991, vol. 7, Issue 4, 283-286.
Peng et al., "Unique lead adsorption behavior of activated hydroxyl group in two-dimensional titanium carbide", Journal of The American Chemical Society, 2014, 136, 4113-4116.
Rao et al, "A Study of the Synthetic Methods and Properties of Graphenes", Science and Technology of Advanced Materials, 11, Oct. 27, 2010, 1-15.
Rudy, "Crystal structure of Ta2VC2", Journal of the Less-Common Motale , Jan. 1970, vol. 20, Issue 1, 49-55.
Savoskin et al, "Carbon Nanoscrolls Produced From Acceptor-Type Graphite Intercalation Compounds", 2007, Carbon, 45, 2797-2800.
Schmidt, et al., "XPS Studies of Amino Acids Absorbed on Titanium Dioxide Surfaces", Fresenius Journal of Analytical Chemistry, May 1991, 341, 412-415.
Spanier et al, "Vibrational Behavior of the Mn+1AXn phases from First-Order Raman Scattering „M=Ti ,V,Cr, A=Si, X=C,N)", Physical Review B, Jan. 2005, 71, 1-4.
Srinivasan, "Batteries for Advanced Transportation Technologies (BATT) Program. The fourth quarter 2014 FY report", Berkeley National Laboratory Document, Nov. 19, 2014, http://bmr.lbl.gov/wp-content/uploads/sites/3battfiles/reports/BATT_2014_4th_Quarterly_Report.pdf, 74 pages.
Stankovich et al, "Graphene-based Composite Materials", Nature, Jul. 2006, 442, 282-286.
Su et al., "High-Quality Thin Graphene Films from Fast Electrochemical Exfoliation", ACS Nano, 2011, 5(3), 2332-2339.
Tang et al., "Are MXenes Promising Anode Materials for Li Ion Batteries? Computational Studies on Electronic Properties and Li Storage Capability of $Ti_3C_2$ and $Ti_3C_2X_2$ (X=F, OH) Monolayer", Journal of the American Chemical Society, 2012, 134, 16909-16916.
Tran et al, "Lithium Intercalation in Porous Carbon Electrodes", Material Research Society 1995 Spring Meeting, San Francisco, CA, Apr. 17-21, 1995, 12 Pages.
Travaglini et al, "The Corrosion Behavior of Ti3SiC2 in Common Acids and Dilute NaOH", Corrosion Science, Jun. 1, 2003, 45(6), 1313-1327.
Tzenov et al, "Synthesis and Characterization of TI3ALC2", Journal of the American Ceramic Society, Jan. 1, 2000, 83(4), 825-832.
Viculis et al, "A Chemical Route to Carbon Nanoscrolls", Science, Feb. 28, 2003, 299, p. 1361.
Viculis et al., "Intercalation and Exfoliation Routes to Graphite Nanoplatelets", Journal of Materials Chemistry, 2005, vol. 15, 974-978.

\* cited by examiner (A)

Current MXenes (B)

24 new MXenes (C)

MXenes with different surface terminaion groups (A)

(B)

FIG. 3 (cont'd)    (C)
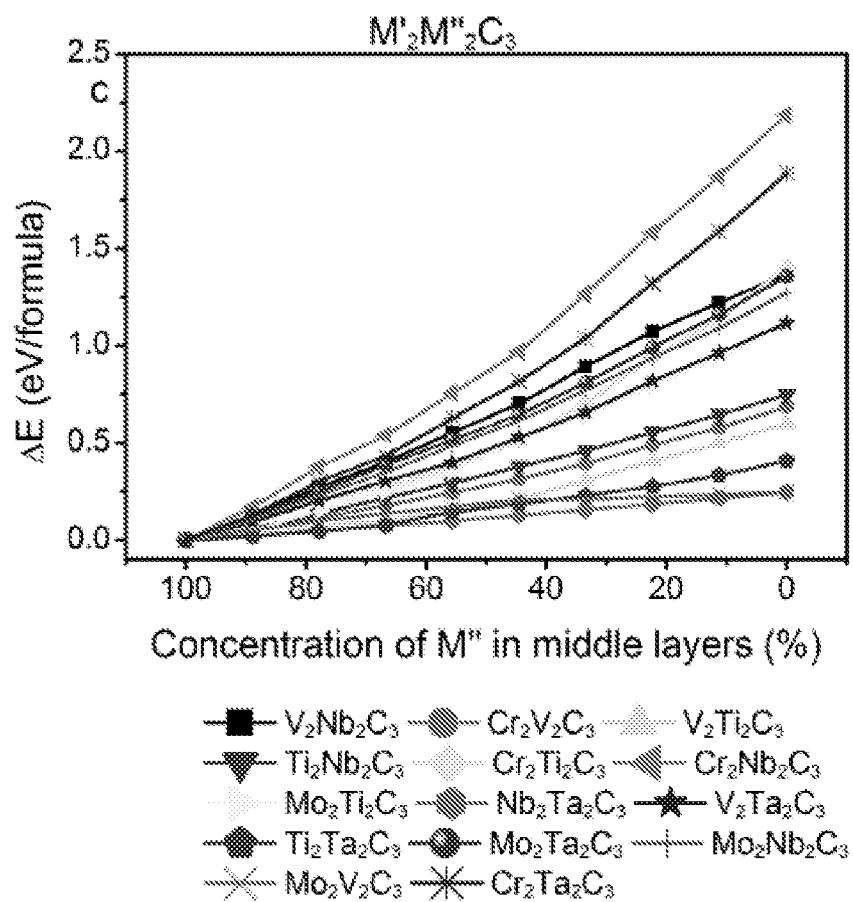

(C)

(D)

(C)

(D)

(G)

(H)

(A)

(B)

(C)

1

TWO-DIMENSIONAL, ORDERED, DOUBLE TRANSITION METALS CARBIDES HAVING A NOMINAL UNIT CELL COMPOSITION $M'_2M''_nX_{n+1}$

GOVERNMENT RIGHTS

This invention was made with government support under Contract No. W911NF-14-1-0568 awarded by the United States Army/Army Research Office. The government has certain rights in the invention.

CROSS-REFERENCE TO RELATED APPLICATIONS

This application is the National Stage Application of International Patent Application No. PCT/US2016/028354, filed Apr. 20, 2016, which claims priority to U.S. Patent Application Ser. No. 62/149,890, filed Apr. 20, 2015, the contents of which are incorporated by reference herein in their entirety.

TECHNICAL FIELD

The present disclosure is directed to novel ordered nanolaminate metal carbide compositions and methods of making the same.

BACKGROUND

Two-dimensional (2D) materials offer high specific surface areas, as well as electronic structures and exhibit properties that differ from those of their three-dimensional, 3-D, counterparts. Currently, however, there are relatively few materials which can be described as 2-D, atomically-scaled layered solids. Clearly the most studied freestanding 2-D material is graphene, but other materials include hexagonal BN, certain transition metal oxides, hydroxides, and silicates, including clays, $S_2N$, $MoS_2$ and $WS_2$ are also known. Currently, the number of non-oxide materials that have been exfoliated is limited to two fairly small groups, viz. hexagonal, van der Waals bonded structures (e.g. graphene and BN) and layered metal chalcogenides (e.g. $MoS_2$, $WS_2$, etc.).

Although graphene has attracted more attention than all other 2-D materials together, its simple chemistry and the weak van der Waals bonding between layers in multi-layer structures limit its use. Given the properties of graphene for applications ranging from composite reinforcement to electronics, there is interest in other new materials which may also be described as 2-D, atomically-scaled layered solids.

SUMMARY

This present disclosure is directed to expanding the nature of 2D, nanodimensioned materials. This disclosure is directed to compositions comprising free standing and stacked assemblies of two dimensional crystalline solids, and methods of making the same.

Various embodiments of this disclosure provide crystalline compositions comprising at least one layer having first and second surfaces, each layer comprising:

a substantially two-dimensional array of crystal cells, each crystal cell having an empirical formula of $M'_2M''_nX_{n+1}$, such that each X is positioned within an octahedral array of M' and M";

wherein M' and M" each comprise different Group IIIB, IVB, VB, or VIB metals;

each X is C, N, or a combination thereof;

n=1 or 2; and wherein the M' atoms are substantially present as two-dimensional outer arrays of atoms within the two-dimensional array of crystal cells;

the M" atoms are substantially present as two-dimensional inner arrays of atoms within the two-dimensional array of crystal cells; and the two dimensional inner arrays of M" atoms are sandwiched between the two-dimensional outer arrays of M' atoms within the two-dimensional array of crystal cells.

In independent embodiments, M' is or comprises Sc, Cr, Hf, Mo, Ti, V, Zr, of a combination of two or more thereof, and/or M' is or comprises Ti, V, Cr, Mo, of a combination of two or more thereof, provided that both M' and M" do not contain the same metals.

In other independent embodiments, M" is or comprises Ti, V, Nb, Ta, of a combination of two or more thereof.

In still other independent, $M'_2M''_nX_{n+1}$, (n=1) is or comprises $Mo_2TiC_2$, $Mo_2VC_2$, $Mo_2TaC_2$, $Mo_2NbC_2$, $Nb_2VC_2$, $Ta_2TiC_2$, $Ta_2VC_2$, $Nb_2TiC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$. $M'_2M''_nX_{n+1}$ (n=2) is or comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$. Each individual composition represents an individual embodiment.

The surface of these crystalline compositions may also be characterized as having surface terminations bonded to the outer arrays of atoms, the surface terminations comprising alkoxide, carboxylate, halide, hydroxide, hydride, oxide, sub-oxide, nitride, sub-nitride, sulfide, thiol, or a combination or subset thereof.

The crystalline compositions may be separately described in terms of an ordered or disordered state, with respect to M' and M." Independent embodiments of the ordered state include those where: (a) the two-dimensional outer arrays of atoms contain 80 atom % or more, 85 atom % or more, 90 atom % or more, 95 atom % or more, 98 atom % or more, or substantially all M' atoms, the balance to 100 atom % being M" atoms; and (b) the two-dimensional inner arrays of atoms contain 80 atom % or more, 85 atom % or more, 90 atom % or more, 95 atom % or more, 98 atom % or more, or substantially all M" atoms, the balance to 100 atom % being M' atoms; within the two-dimensional array of crystal cells.

The crystalline compositions may comprise an electrically conductive or semiconductive surface. In some embodiments, the exhibits a negative surface resistivity rate, $d\rho/dT$ at all temperatures in a range of from 0 K to 300 K, where $\rho$ is resistivity [in $\Omega$-cm] and T is a Kelvin temperature. In other embodiments, the crystalline compositions exhibit positive magnetoresistance (MR) response to a non-zero magnetic field from −5 Tesla to +5 Tesla.

Other embodiments provide for stacked assemblies comprising at least two crystalline layers. In various embodiments, the properties and characteristics of these stacked assembled mirror those described for the crystalline compositions. Additional embodiments of the stacked assemblies include those wherein lithium, sodium, potassium, and/or magnesium, atoms, ions, or both atoms and ions are intercalated between at least some of the layers.

Still other embodiments provide for energy-storing devices (such as batteries) or electrodes comprising the stacked assembly described herein.

Other embodiments includes those methods used to prepare either the crystalline compositions or stacked assemblies thereof.

BRIEF DESCRIPTION OF THE DRAWINGS

The following figures are presented as illustrative examples, and should not be considered to limit the scope of the disclosure in any way. Except where otherwise noted, the scales of the figures may be exaggerated for illustrative purposes.

DETAILED DESCRIPTION OF ILLUSTRATIVE EMBODIMENTS

Figure 1:
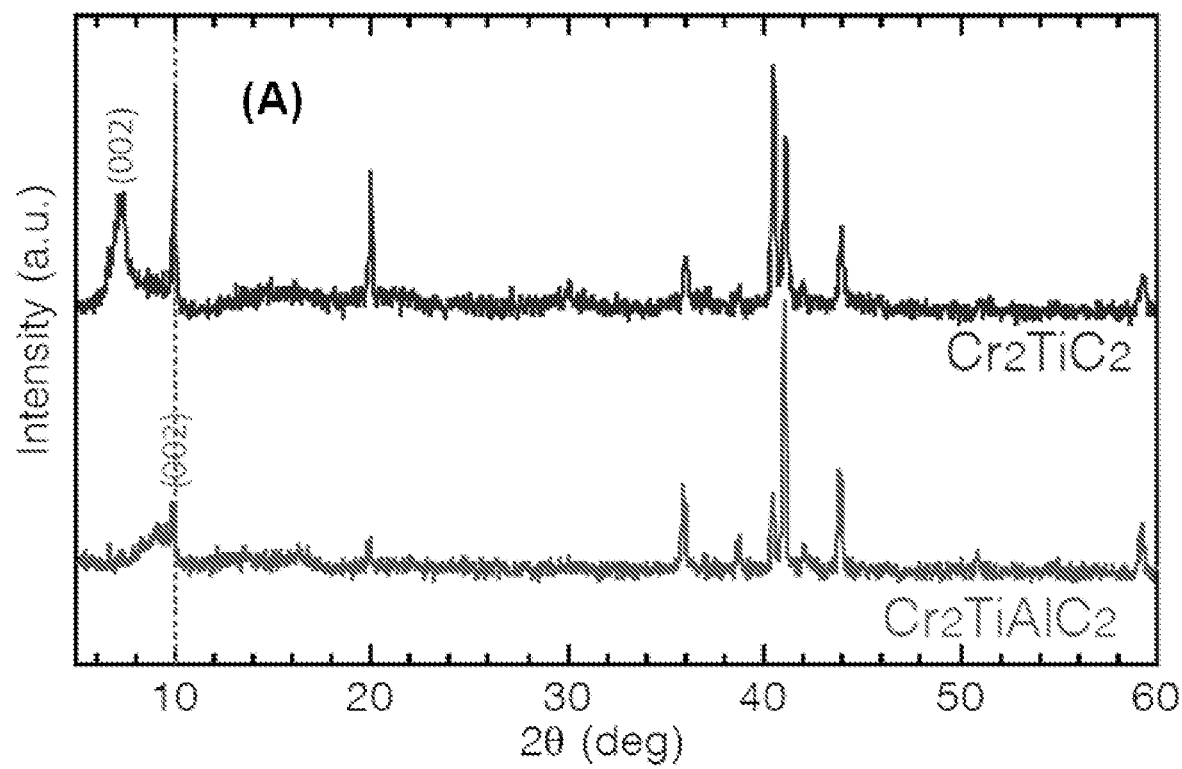
FIG. 1 shows XRD patterns of (A) ordered $(Cr_{2/3}Ti_{1/3})_3AlC_2$ and its corresponding $Cr_2TiC_2$ composition. Compare with (A) XRD patterns of delaminated $Mo_2Ti_2C_3T_x$ and $Mo_2TiC_2T_x$.
Figure 1:
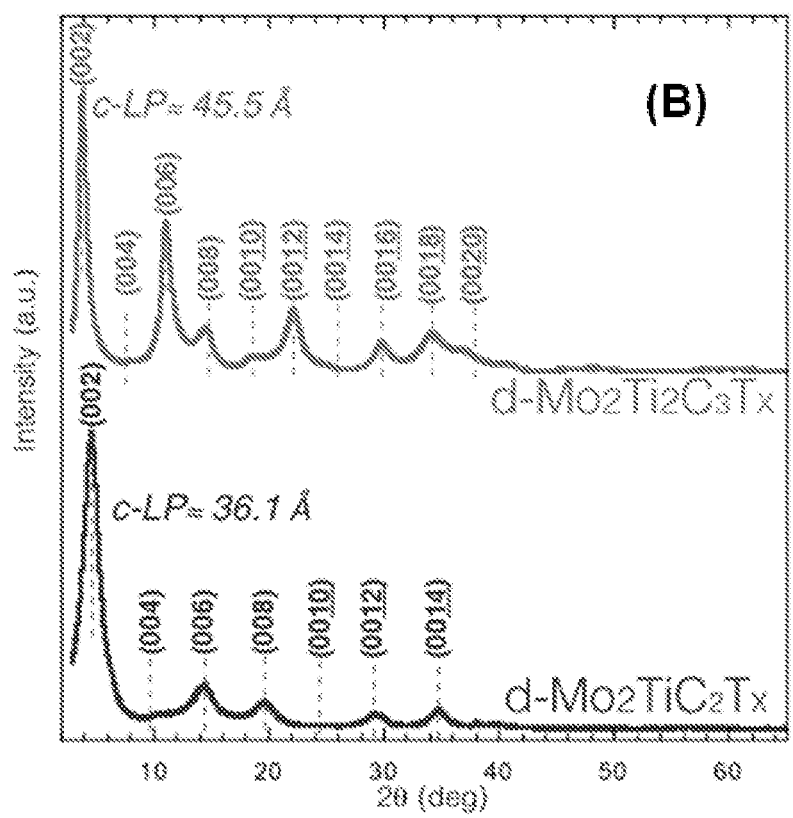

The present disclosure describes a new class of MXene materials, these having the stoichiometry $M'_2M''_nX_{n+1}$. More specifically, the disclosure is directed to compositions, uses, and methods of making these compositions, which include those comprising at least one layer having first and second surfaces, each layer comprising:

substantially two-dimensional array of crystal cells, each crystal cell having an empirical formula of $M'_2M''_nX_{n+1}$, such that each X is positioned within an octahedral array of M' and M";

wherein M' and M" each comprise different Group IIIB, IVB, VB, or VIB metals;

each X is C, N, or a combination thereof;

n=1 or 2; and wherein the M' atoms are substantially present as two-dimensional outer arrays of atoms within the two-dimensional array of crystal cells;

the M" atoms are substantially present as two-dimensional inner arrays of atoms within the two-dimensional array of crystal cells; and the two dimensional inner arrays of M" atoms are sandwiched between the two-dimensional outer arrays of M' atoms within the two-dimensional array of crystal cells.

The present disclosure may be understood more readily by reference to the following detailed description taken in connection with the accompanying Figures and Examples, which form a part of this disclosure. It is to be understood that this disclosure is not limited to the specific products, methods, conditions or parameters described and/or shown herein, and that the terminology used herein is for the purpose of describing particular embodiments by way of example only and is not intended to be limiting of any claimed disclosure. Similarly, unless specifically otherwise stated, any description as to a possible mechanism or mode of action or reason for improvement is meant to be illustrative only, and the disclosure herein is not to be constrained by the correctness or incorrectness of any such suggested mechanism or mode of action or reason for improvement. Throughout this text, it is recognized that the descriptions refer both to compositions and to the articles and devices derived therefrom, as well as the methods of manufacture and use.

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When values are expressed as approximations by use of the antecedent "about," it will be understood that the particular value forms another embodiment. In general, use of the term "about" indicates approximations that can vary depending on the desired properties sought to be obtained by the disclosed subject matter and is to be interpreted in the specific context in which it is used, based on its function, and the person skilled in the art will be able to interpret it as such. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, reference to values stated in ranges includes each and every value within that range.

It is to be appreciated that certain features of the disclosure which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the disclosure that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

The transitional terms "comprising," "consisting essentially of," and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps "and those that do not materially affect the basic and novel characteristic(s)" of the claimed disclosure. Embodiments described in terms of the phrase "comprising" (or its equivalents), also provide, as embodiments, those which are independently described in terms of "consisting of" and "consisting essentially of." For those embodiments provided in terms of "consisting essentially of," the basic and novel characteristic(s) is the novel structures described herein. For example, the term "consisting essentially of a composition of formula stoichiometry $M'_2M''_nX_{n+1}$, is intended to include not only the descriptions of this structure provided herein, but also the presence of any additional elements that do not compromise the essential nanolaminate character of this material.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C."

It is to be understood that while the disclosure has been described in conjunction with the preferred specific embodiments thereof, that the foregoing description and the examples that follow are intended to illustrate and not limit the scope of the disclosure. It will be understood by those skilled in the art that various changes may be made and equivalents may be substituted without departing from the scope of the disclosure, and further that other aspects, advantages and modifications will be apparent to those skilled in the art to which the disclosure pertains. In addition to the embodiments described herein, the present disclosure contemplates and claims those disclosures resulting from the combination of features of the disclosure cited herein and those of the cited prior art references which complement the features of the present disclosure. Similarly, it will be appreciated that any described material, feature, or article may be used in combination with any other material, feature, or article, and such combinations are considered within the scope of this disclosure.

As used herein, the terms "MXene," "MXene compositions," or "MXene materials" refer to those compositions having either single or multilayer, essentially two-dimension crystalline solids, as known in the art, for example as described in U.S. Pat. No. 9,193,595, which issued Nov. 24, 2015 and which is incorporated by reference in its entirety. Similarly, the terms "ordered, double transition metal MXene," "ordered, double transition metal MXene composition or material," "$M'_2M''_nX_{n+1}$," "$M'_2M''_nX_{n+1}T_x$," or "two-dimensional, ordered, double transition metals carbides" may be used interchangeably and refer to compositions which exhibit the double layering arrangement as described herein, whether present as individual layers, stacked layers, or stacked assemblies, or whether in suspension, deposited as a coating, incorporated into another material, or free-standing.

Analogous to other so-called two-dimensional, atomically-scaled layered solid materials, such as graphene or hexagonal BN, these two-dimensional, ordered, double transition metals carbides may be free-standing or be present in stacked compositions. As used herein, the term "free standing" refers to individual layers wherein the adjacent composite crystal layers are not bonded to one another by covalent bonds or connected by metal-lattice bonds, but may be joined by intervening hydrogen (or even weaker) bonding, such that each layer can be individually physically manipulated. However, this term does not preclude the deposition of these layers or stacked layers on substrates or within polymer or other matrix (e.g., glass) compositions.

The term "crystalline compositions comprising at least one layer having first and second surfaces, each layer comprising a substantially two-dimensional array of crystal cells" refers to the unique character of these materials. For purposes of visualization, the two-dimensional array of crystal cells may be viewed as an array of cells extending in an x-y plane, with the z-axis defining the thickness of the composition, without any restrictions as to the absolute orientation of that plane or axes. It is preferred that the at least one layer having first and second surface contain but a single two-dimensional array of crystal cells (that is, the z-dimension is defined by the dimension of approximately one crystal cell), such that the planar surfaces of said cell array defines the surface of the layer, it should be appreciated that real compositions may contain portions having more than single crystal cell thicknesses.

That is, as used herein, "a substantially two dimensional array of crystal cells" refers to an array which preferably includes a lateral (in x-y dimension) array of crystals having a thickness of a single unit cell, such that the top and bottom surfaces of the array are available for chemical modification.

The term "substantially" as in a "substantially two-dimensional array of crystal cells," or "the M' atoms are substantially present as two-dimensional outer arrays of atoms within the two-dimensional array of crystal cells," or "the M" atoms are substantially present as two-dimensional inner arrays of atoms within the two-dimensional array of crystal cells" is intended to connote that these arrays are two-dimensional or comprise the respective transition metals, as far as practically possible. The term is intended to allow for the inevitable imperfection or defect within the structure, and such defects to not detract from the intended configuration or composition.

The orientations and relative positions of the separate arrays of M' and M" atoms in the substantially two dimensional array of crystal cells is another unique feature of these disclosed compositions. These so-called "sandwich" arrays may be ordered or disordered (see elsewhere herein). The presence of the ordered arrays appears to impart unique character to these compositions. The terms "ordered" and "disordered" as referring to the nature of the $M'_2M''_nX_{n+1}$ materials describes the amount of mixing of the M' and M" elements that occur within and between the inner and outer layers. Theoretically, depending on the nature of the specific transition metal elements incorporated into the $M'_2M''_nX_{n+1}$ structures, the inner layer may contain the M' element in any integer or sub-integer proportion from 0 atom % to 100 atom %, the balance to 100 atom % being the M" element. Within the labeling convention of the present disclosure, in which the M' atoms are substantially present as within the outer arrays of atoms within the two-dimensional array of crystal cells and the M" atoms are substantially present as within the inner arrays of atoms within the two-dimensional array of crystal cells, the term "ordered array" refers to those compositions in which the outer array of atoms comprises 80 atom % or more of the M' transition metal (the balance being the M" transition metal) and, accordingly, the inner array comprises at 80 atom % or more of the M" transition metal (the balance being the M' transition metal). In other independent embodiments, the term "ordered" refers to those compositions in which the outer array of atoms comprises 85 atom % or more, 90 atom % or more, 95 atom % or more, 98 atom % or more, or substantially all of the M' transition metal (the balance being the M" transition metal); and accordingly, the term "ordered" also refers to those compositions in which the inner array of atoms comprises 85 atom % or more, 90 atom % or more, 95 atom % or more, 98 atom % or more, or substantially all (i.e., 100 atom %) of the M" transition metal (the balance being the M' transition metal). The term "disordered" refers to those compositions in which the inner and outer layers are less ordered than in the ordered compositions.

It should also be appreciated that, analogous to graphene or hexagonal BN compositions, this description of a planar or two-dimensional array should not be interpreted to describe a necessarily flat structure; rather such compositions may also take the form of a curved or undulating plane, a scroll, or a cylinder or tube (e.g., analogous to the structure of a carbon or BN nanotube).

Given the difficulties in obtaining crystallographic evidence as to the crystallinity of materials having such few layers (e.g., less than about 5 cell layers), owing to the reduced level or lack of constructive interference of such few layers, these materials may be characterized by measuring the thickness of the individual layers (measured, for example, by Transmission Electron Micrography or atomic force microscopy). Depending on the particular empirical formula of the given material, the thickness of a given single cell layer will be on the order of about 0.3 to about 0.7 nm (preferably about 0.5 nm) for $M'_2M''_1X_2$, $M_3X_2$ compositions, and about 0.6 to about 0.9 nm (preferably about 0.75 nm) for $M'_2M''_2X_3$, $M_4X_3$ compositions.

These $M'_2M''_nX_{n+1}$ materials (even individual or exfoliated layers) can also be characterized by measuring the X-ray diffraction (XRD) spectra of (optionally cold pressed) stacked layers. That is, such stacking provides a sample of sufficient thickness (number of layers) to allow for sufficient constructive interference so as to provide for a measurable XRD pattern to be obtained.

Returning to earlier described embodiment, some crystalline compositions comprise at least one layer having first and second surfaces, each layer comprising:

substantially two-dimensional array of crystal cells, each crystal cell having an empirical formula of $M'_2M''_nX_{n+1}$, such that each X is positioned within an octahedral array of M' and M";

wherein M' and M" each comprise different Group IIIB, IVB, VB, or VIB metals;

each X is C, N, or a combination thereof;

n=1 or 2; and wherein the M' atoms are substantially present as two-dimensional outer arrays of atoms within the two-dimensional array of crystal cells;

the M" atoms are substantially present as two-dimensional inner arrays of atoms within the two-dimensional array of crystal cells; and the two dimensional inner arrays of M" atoms are sandwiched between the two-dimensional outer arrays of M' atoms within the two-dimensional array of crystal cells.

As described herein, the M' and M" atoms, elements, or transition metals can be selected from one or more members of the Groups IIIB, IVB, VB, or VIB or (aka) Groups 3-6 of the periodic table, either alone or in combination, said members including Cr, Hf, Lu, Mo, Nb, Sc, Ta, Ti, V, W, Y, and Zr. Generally, M' and M" each is a single individual type of such atom, element, or transition metal, and each are different from one another. But M', M", or both M' and M" can contain two or more transition metal elements, provided that both M' and M" do not contain the same metal(s).

In some embodiments, M' is Sc, Cr, Hf, Mo, Ti, V, Zr, of a combination of two or more thereof. In some embodiments, M' is Ti, V, Cr, Mo, of a combination of two or more thereof.

In some embodiments, M" is Sc, Nb, Ta, Ti, V, of a combination of two or more thereof.

In some embodiments, n is 1; in other embodiments, n is 2.

In some embodiments, when n is 1, M' is Cr, Hf, Mo, Ti, V, Zr, of a combination of two or more thereof. In some embodiments, when n is 1, M' is Ti, V, Cr, Mo, of a combination of two or more thereof.

In some embodiments, when n is 1, M" is Nb, Ta, Ti, V, of a combination of two or more thereof.

In some embodiments, when n is 2, M' is Mo, Ti, or V, Cr, Nb, of a combination of two or more thereof. In some embodiments, when n is 2, M' is Mo, Ti, V, of a combination of two or more thereof and M" is Sc, Cr, Nb, Ta, Ti, V, of a combination of two or more thereof. In each of the preceding cases, M' and M" do not contain the same metals.

In some of these embodiments, $M'_2M''_nX_{n+1}$, is or comprises $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$. In other embodiments, $M'_2M''_nX_{n+1}$, is or comprises $Mo_2TiC_2$, $Mo_2VC_2$, $Mo_2TaC_2$, or $Mo_2NbC_2$.

$M'_2M''_nX_{n+1}$, may also be or comprise $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$. In other embodiments, $M'_2M''_nX_{n+1}$, is or comprises $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$. In other embodiments, $M'_2M''_nX_{n+1}$, is or comprises $Nb_2VC_2$, $Ta_2TiC_2$, $Ta_2VC_2$, or $Nb_2TiC_2$. Additional embodiments include all of the structures described in the Examples. Each individual composition represents an individual embodiment.

In certain aspects of the descriptions of $M'_2M''_nX_{n+1}$, one or more of $Cr_2TiC_2$, $Cr_2VC_2$, $Cr_2TaC_2$, $Cr_2NbC$, $Cr_2Ti_2C_3$, $Cr_2V_2C_3$, $Cr_2Nb_2C_3$, or $Cr_2Ta_2C_3$, is specifically excluded as embodiments.

In various embodiments, the composition's layer has first and second surfaces which are capable of being physically or chemically interrogated or modified. This feature distinguishes these compositions from stacked sputtered matrices or so-called MAX phase compositions. While it may be possible to describe sputtered matrices or MAX phase compositions as containing two-dimensional arrays of crystal cells, in each case these are embedded within vertically integrated and practically bound to other layers within the respective matrices (e.g., in the case of sputtered matrices, to other neighboring sputtered layers or the substrate; in the case of MAX-phase compositions, to interleaved A-group element arrays), either by covalent, metallic, or lattice bonds, and which cannot be separately accessed. By contrast, in various embodiments of the present compositions, each layer has two available or accessible surfaces sandwiching each substantially two-dimensional array of crystal cells, each of which surfaces can be accessed for physical or chemical interrogation or modification.

It is important to note that, as-prepared, the $M'_2M''_nX_{n+1}$ surfaces are not M-terminated (e.g., terminated by the corresponding M' outer layer), but primarily covered by any range of surface terminations. Oxide, OH, F groups or some combination thereof tend to be frequently present. The designation $T_x$ is used herein, as in $Mo_2TiC_3T_x$, to reflect that the surfaces of the $M'_2M''_nX_{n+1}$ compositions are surface terminated, with components described elsewhere herein. As the $M'_2M''_nX_{n+1}$ surfaces are always coated, the suffix $T_x$ should be considered implicit in the description, unless specifically said to be absent, whether or not the suffix is present or absent.

Having said this, the ability to functionalize the surfaces of the layers of the present disclosure to provide enrichment of a particular functional group provides a considerable synthetic and structural flexibility. Because of the arrangement of the M atoms within the $M'_2M''_nX_{n+1}$ framework, wherein each X is positioned within an octahedral array of M atoms, the "un-functionalized" surface comprises largely M atoms. For example, in the absence of imperfections, a substantially planar array of crystal cells having an empirical formula $M'_2M''_nX_{n+1}$ will provide or present external surfaces comprising a planar array of M' atoms (see, e.g., Mo atoms in FIG. 4). At the same time, owing to the chemical reactivity of Mo (or any of the M' atoms), these surfaces will be coated with one or more organic or inorganic moieties, generally comprising heteroatoms or having heteroatom linking groups.

For example, in certain embodiments, at least one of the surfaces are coated with a coating comprising H, N, O, or S atoms, for example, a hydride, oxide, sub-oxide, nitride, sub-nitride, sulfide, or sub-sulfide. In preferred embodiments, the coating comprises a hydrated or anhydrous oxide, a sub-oxide, or some combination thereof. As used herein the terms "sub-oxide," "sub-nitride," or "sub-sulfide" is intended to connote a composition containing an amount reflecting a sub-stoichiometric or a mixed oxidation state of the M' metal at the surface of oxide, nitride, or sulfide, respectively. Accordingly, the surfaces of the present disclosure may also contain oxides, nitrides, or sulfides in similar sub-stoichiometric or mixed oxidation state amounts.

In other embodiments, at least one surface is coated with a coating having a pendant moiety which is linked to the surface by an N, O, or S atom (e.g., an M'-N, M'-O, or M'-S bond, respectively). Such surface coatings then may comprise at least one hydroxide, alkoxide, carboxylate, amine, amide, or thiol. These pendants may contain organic moieties, including saturated, unsaturated, and/or aromatic moieties. These organic moieties may optionally include heteroatoms, be linear or branched, and/or may contain one or more functional groups, for example amines and derivatives therefrom, (thio)carboxylic acids and derivatives therefrom, hydroxy or ether groups, and/or thiol groups. The moieties and/or optionally available functional groups may exist in their neutral or ionized state.

In other embodiments, the coating of at least one surface comprises at least one halide, for example F, Cl, Br, or I, preferably F. As used herein, the terms "halide" and, e.g., "fluoride" are intended to reflect the presence of metal-halogen or metal-fluorine bonds, respectively, without regard to the specific nominal charge on the halogen or fluorine.

In certain embodiments, the compositions of the present disclosure comprises at least one individual layer having first and second surfaces, each layer comprising a substantially two-dimensional array of crystal cells having an empirical formula $Mo_2TiC_2$ with at least one surface coated with a coating comprising a hydroxide, an oxide, a sub-oxide, or a combination thereof, and so represented as $Mo_2TiC_2T_x$. In other embodiments, the coating comprises fluorine or fluoride.

In other embodiments, the crystalline composition comprises at least one individual layer having first and second surfaces, each layer comprising a substantially two-dimensional array of crystal cells having an empirical formula $Mo_2Ti_2C_2$ with at least one surface coated with a coating comprising a hydroxide, an oxide, a sub-oxide, or a combination thereof, and so represented as $Mo_2Ti_2C_2T_x$. In other embodiments, the coating comprises fluorine or fluoride.

The skilled artisan will be able to interchange the pendant groups by methods known in the art. Without the need for an exhaustive delineation of such methods, in one non-limiting example, a hydroxyl or alkoxyl surface may be prepared by providing an excess hydroxide or alkoxide so as to displace the halide from an initially presented M-halide surface or so as to hydrate or alkoxylate a metal oxide or sub-oxide surface. Similarly, an originally presented M-hydroxide surface may be converted to oxide or sub-oxide surface by application of heat or other dehydrating conditions. Nitrogen and sulfur surfaces may be analogously interconverted by methods known in the art for making such conversions. Similarly, hydrides may be prepared by exposing precursors to reducing conditions, either electrolytically or by contacting with reducing agents such as hydrides (e.g., $NaBH_4$), hydrogen gas, or ammonia.

In certain embodiments, the compositions of the present disclosure comprises at least one individual layer having first and second surfaces, each layer comprising a substantially two-dimensional array of crystal cells having an empirical formula $Mo_2TiC_2$ with at least one surface coated with a coating comprising a hydroxide, an oxide, a sub-oxide, or a combination thereof, and so represented as $Mo_2TiC_2T_x$. In other embodiments, the coating comprises fluorine or fluoride.

In other embodiments, the crystalline composition comprises at least one individual layer having first and second surfaces, each layer comprising a substantially two-dimensional array of crystal cells having an empirical formula $Mo_2Ti_2C_2$ with at least one surface coated with a coating comprising a hydroxide, an oxide, a sub-oxide, or a combination thereof, and so represented as $Mo_2Ti_2C_2T$. In other embodiments, the coating comprises fluorine or fluoride.

In other embodiments, the crystalline compositions of the instant disclosure may be characterized as being ordered or disordered or being in an ordered or disordered state, where these terms are defined elsewhere. In certain of these embodiments, the $M'_2M''_nX_{n+1}$ frameworks are in a ordered state, such that:

(a) the two-dimensional outer arrays of atoms contain 80 atom % or more, 85 atom % or more, 90 atom % or more, 95 atom % or more, 98 atom % or more, or substantially all M' atoms, the balance to 100 atom % being M" atoms;

(b) the two-dimensional inner arrays of atoms contain 80 atom % or more, 85 atom % or more, 90 atom % or more, 95 atom % or more, 98 atom % or more, or substantially all M" atoms, the balance to 100 atom % being M' atoms;

within the two-dimensional array of crystal cells.

In other embodiments, the ordered $M'_2M''_nX_{n+1}$ frameworks may be defined in terms of:

(a) the two-dimensional outer arrays of atoms contain 80 atom % or more, 85 atom % or more, 90 atom % or more, 95 atom % or more, 98 atom % or more, or substantially all M" atoms, the balance to 100 atom % being M' atoms;

(b) the two-dimensional inner arrays of atoms contain 80 atom % or more, 85 atom % or more, 90 atom % or more, 95 atom % or more, 98 atom % or more, or substantially all M' atoms, the balance to 100 atom % being M" atoms;

within the two-dimensional array of crystal cells.

While the crystalline composition may be defined in terms of X being C, N, or a combination thereof, generally X is C.

In certain embodiments, the compositions may be electrically conducting or semi-conducting, as well as those electronic devices (e.g., transistors, where the use of graphene and $MoS_2$ has been successfully demonstrated) which incorporate such compositions so as to take advantage of this property. Some of the factors that can be used to predict such properties are described elsewhere herein, including the Examples. In independent aspects, the composition comprises an electrically semi-conductive surface. Further, it is shown that variations in the nature of the surface coating affects that behavior. Such behavior is further elaborated in the Examples. It is possible to tune the electronic structure of exfoliated $M'_2M''_nX_{n+1}$ structures by varying the functional groups. Such further modifications of the functional groups themselves may provide additional flexibility in this regard.

These electronic transport phenomena shown in the Examples is believed to extend beyond the specific exemplified structures. Accordingly, in certain embodiments, the crystalline $M'_2M''_nX_{n+1}$ compositions described herein exhibit a negative resistivity rate, $d\rho/dT$ at all temperatures in a range of from 0 K to 300 K, where $\rho$ is resistivity, for example, in $\Omega$-cm, and T is a Kelvin temperature. In certain other embodiments, the crystalline $M'_2M''_nX_{n+1}$ compositions exhibit a positive magnetoresistance (MR) response to a non-zero magnetic field from −5 Tesla to +5 Tesla.

In certain embodiments, films or papers comprising these $M'_2M''_nX_{n+1}$ structures are sufficiently thin as to be transparent, while maintaining surface conductivity. In certain embodiments, such $M'_2M''_nX_{n+1}$ structured films or papers may exhibit optical transparencies (i.e., at least one wavelength in a range of about 250 nm to about 850 nm) in a range of from about 0% to about 95% or higher, from about 50% to about 95%, from about 70% to about 95%, or from about 70% to about 90%. Such thin films may be prepared by delaminating epitaxially grown thin films, either as-prepared or intercalated with one or more materials as described herein, or by spray or spin coating.

Additional embodiments provide for the use or incorporation of the disclosed $M'_2M''_nX_{n+1}$ compositions into other materials, or the incorporation of other materials within them. For example, various embodiments provide composites into which a $M'_2M''_nX_{n+1}$ structures composition is incorporated. More particularly, further embodiments provide polymer and/or glass composite compositions wherein the $M'_2M''_nX_{n+1}$ structures comprises between amounts in the range of about 0.1 wt % to about 90 wt %, relative to the combined weight of the glass and/or polymer and $M'_2M''_nX_{n+1}$ composition. Still other embodiments provide that the $M'_2M''_nX_{n+1}$ composition is present in a range from 0.1 to 1, from 1 to 2, from 2 to 5, from 5 to 10, from 10 to 20, from 20 to 30, from 30 to 40, from 40 to 50, from 50 to 60, from 60 to 70, from 70 to 80, from 80 to 90 wt %, relative to the combined weight of the glass and/or polymer and the $M'_2M''_nX_{n+1}$ composition comprising a glass and/or polymer, or a range combining two or more of these ranges.

A glass composite may comprise a silicate glass, for example a borosilicate or aluminosilicate glass.

A polymer composite may comprise one or more organic polymers, more specifically thermoset or thermoplastic polymers or polymer resins, elastomers, or mixtures thereof. Various embodiments include those wherein the polymer or polymer resin contains an aromatic or heteroaromatic moiety, for example, phenyl, biphenyl, pyridinyl, bipyridinyl, naphthyl, pyrimidinyl, including derivative amides or esters of terephthalic acid or naphthalic acid. Other embodiments provide that the polymer or polymer resin comprises polyester, polyamide, polyethylene, polypropylene, polyethylenenaphthalate (PEN), polyethylene terephthalate (PET), polybutylene terephthalate (PBT), polyether etherketone (PEEK), polyamide, polyaryletherketone (PAEK), polyethersulfone (PES), polyethylenenimine (PEI), poly (p-phenylene sulfide) (PPS), polyvinyl chloride (PVC), fluorinated or perfluorinated polymer (such as a polytetrafluoroethylene (PTFE or TEFLON®), polyvinylidene difluoride (PVDF), a polyvinyl fluoride (PVF or TEDLAR®)) (TEFLON® and TEDLAR® are registered trademarks of the E.I. DuPont de Nemours Company, of Wilmington, Del.)

As with other MXenes, it is believed that the planar nature of $M'_2M''_nX_{n+1}$ layers may be well suited to organizing themselves in those anisotropic polymers, for example having planar moieties, e.g., aromatic moieties, especially when (but not only when) these planar organic moieties are directionally oriented to be parallel in a polymer composite composition. Such embodiments include the inclusion of $M'_2M''_nX_{n+1}$ compositions into liquid crystal polymers. Moreover, the ability to produce $M'_2M''_nX_{n+1}$ compositions having both hydrophobic and hydrophilic pendants provides for compatibility with a wide-ranging variety of polymer materials.

Additional embodiments of the present disclosure provide polymer composites, including those wherein the polymer composite is in a form having a planar configuration—for example, a film, sheet, or ribbon—comprising a $M'_2M''X_n+_1$ layer or multilayer composition. Still further embodiments provide such polymer composites wherein the two-dimensional crystal layers of the $M'_2M''_nX_{n+1}$ materials are aligned or substantially aligned with the plane of a polymer composite film, sheet, or ribbon, especially when the organic polymers are oriented in the plane of that film, sheet, or ribbon.

Accordingly, still further embodiments provide that the $M'_2M''_nX_{n+1}$ composition-filled composite polymers, especially when these polymer composites have a planar configuration, such as that of film, sheet, or ribbon, especially an oriented film, sheet, or ribbon, exhibit a flexural strength (bending rigidity) and/or stiffness than that of the corresponding film, sheet, or ribbon of the same polymer without the $M'_2M''_nX_{n+1}$ composition. In some embodiments, this greater flexural strength and/or stiffness is independently at least 5%, at least 10%, or at least 25% higher than the flexural strength or toughness than that exhibited by an otherwise equivalent, but unfilled material.

Thus far, the compositions have been described in terms of having individual layers having first and second surfaces, each layer comprising a substantially two-dimensional array of crystal cells. However, additional embodiments provide for stacked assemblies of at least two layers having first and second surfaces, each Thus far, the crystalline compositions of the instant disclosure have been described in terms of "at least one layer" of such two-dimensional arrays of unit cells. As such, these compositions may comprise one, two, or more individual layers. The disclosure also contemplates stacked assemblies, wherein the stacked assemblies may be simply result from the successive deposition of individual delaminated layers onto a surface, for example, from a suspension, or the individual layers may be joined to Van der Waals forces, hydrogen bonding, ionic or covalent bonding at discrete points of contact bridging adjoining surfaces. Such stacked assemblies may be characterized as having an average surface area and interlayer distance.

In various embodiments of these stacked assemblies, each layer may retain the characteristics as described above, but be held in place or edge-wise connected such that the assembly has up to about 50 layers of crystal layers. In various embodiments, these number of crystal layers in these assemblies may be described as having a range from 2 to 5, from 5 to 10, from 10 to 15, from 15 to 20, from 20 to 25, from 25 to 30, from 30 to 40, from 40 to 50, or a range combining any two or more of these ranges, for example from 2 to about 50 or from about 5 to about 25.

In various embodiments, the composite layers characterized as having an average surface area. While the bounds of these areas are not necessarily limited to any particular values, in certain preferred embodiments, the average surface or planar area is defined by a range of areas, with individual embodiments having a lower range value of about 50 nm$^2$, about 100 nm$^2$, about 250 nm$^2$, about 500 nm$^2$, or about 1000 nm$^2$, and having an upper range value of about 10,000 nm$^2$, about 5000 nm$^2$, about 2500 nm$^2$, about 1000 nm$^2$, about 500 nm$^2$, about 250 nm$^2$, or about 100 nm$^2$, with exemplary ranges of about 100 nm$^2$ to about 2500 nm$^2$, of about 250 nm$^2$ to about 2500 nm$^2$, of about 500 nm$^2$ to about 1500 nm$^2$, of about 500 nm$^2$ to about 1000 nm$^2$, 50 nm$^2$ to about 250 nm$^2$, or about 750 nm$^2$ to about 1000 nm$^2$.

In other preferred embodiments, the average surface or planar area is defined by a range of areas, with individual embodiments having a lower range value of about 5 μm$^2$, about 10 μm$^2$, about 25 μm$^2$, about 50 μm$^2$, about 100 μm$^2$, about 250 μm$^2$, about 500 μm$^2$, or about 1000 μm$^2$ and having an upper range value of about 100,000 μm$^2$, 10,000 μm$^2$, about 1000 μm$^2$, about 500 μm$^2$, about 250 μm$^2$, about 100 μm$^2$, about 50 μm$^2$, about 25 μm$^2$, or about 10 μm$^2$, with exemplary ranges of about 10 μm$^2$ to about 250 μm$^2$, of about 25 μm$^2$ to about 250 μm$^2$, of about 50 μm$^2$ to about 150 μm$^2$, of about 50 μm$^2$ to about 100 μm$^2$, 5 μm$^2$ to about 25 μm$^2$, or about 75 μm$^2$ to about 125 μm$^2$.

While the surface of these composite layer may be of any shape, it is convenient to describe such shapes as having a major and minor planar dimension (or x-axis and y-axis dimensions, using the envisioned x-y plane as described above). For example, if a quadrilateral or pseudo-quadrilateral shape, the major and minor dimension is the length and width dimensions. In preferred embodiments, the ratio of the lengths of the major and minor axes is in the range of about 1 to about 10 (1:10) to about 10 to about 1 (10:1), about 1 to about 5 (1:5) to about 5 to about 1 (5:1), more preferably about 1 to about 3 (1:3) to about 3 to about 1 (3:1), or about 1 to about 2 (1:2) to about 2 to about 1 (2:1).

Additionally, in various embodiments, the interlayer distances (i.e., the distances between the composite crystal layers) in these stacked assemblies is in the range of about 0.2 nm to about 1 nm, preferably in the range of about 0.3 nm to about 0.5 nm. When prepared by the methods described below (i.e., removing the labile A-phase elements from MAX phase materials, see below), these interlayer distances may be consistent with the atomic radii of the removed elements. For example, the atomic diameter of Al is about 0.25 nm and that of Sn about 0.3 nm.

Certain embodiments of the present disclosure provide stacked assemblies which are capable of intercalating atoms and/or ions between at least some of the layers of two-dimensional crystal layers. Such spontaneous intercalation of cations from aqueous solutions was not theoretically or previously demonstrated. For example, these atoms and/or ions can be metal or metalloid atoms or ions, including alkali, alkaline earth, and transition metals. In some embodiments, these are alkali metal atoms and/or ions (e.g., Li, Na, K, and/or Cs); and most preferably lithium. In other embodiments, the atoms and/or ions include ammonium, magnesium, and aluminum. In some embodiments, these atoms and/or ions are able to move into and out of the stacked assemblies.

In certain embodiments, the cations intercalated spontaneously, on exposure of the cations to the $M'_2M''_nX_{n+1}$ materials, using alkaline or acidic aqueous media. Carbonates, carboxylates, hydroxides, and sulfates may be used to introduce the cations into between the $M'_2M''_nX_{n+1}$ layers. In some cases, notably $Al^{3+}$, the intercalation can additionally be promoted electrochemically. Generally, these intercalated structures may be incorporated into electrodes, double layer capacitors, or both, where said structures further comprise, for example, conductive carbon (e.g., onion-like carbon or carbon black) and fluoropolymer binders (including perfluorinated binders known in the art, e.g., PTFE).

These multilayer structures or assemblies may be used for the same types of applications described above for the $M'_2M''_nX_{n+1}$ layer compositions.

Additionally, the ability to intercalate lithium atoms and/or ions, together with the electrical properties of the $M'_2M''_nX_{n+1}$ layers described above, provides the opportunities that these stacked assemblies may be used as energy storing devices (e.g., anodes) comprising these intercalated stacked composition, or the energy storage devices themselves, for example, batteries, comprising these elements.

Accordingly, various embodiments of the present disclosure include Li-ion batteries and pseudo-capacitor electrodes, wherein the MXene layers or assemblies replace layered transition metal oxides, which show useful red-ox properties and Li-intercalation, but which have lower electrical conductivities than described herein for the MXene materials.

The ability of $M'_2M''_1X_{n+1}$ to intercalate ions, including lithium ions, so as to allow these materials to act as Li-ion batteries and/or pseudo-capacitor electrodes is a particularly useful feature. Similarly, the ability to intercalate a wide range of cations from aqueous solutions, both from multi-layer $M'_2M''X_{n+1}$ and $M'_2M''_nX_{n+1}$ "paper" made from a few layers of $M'_2M''_nX_{n+1}$ materials, makes these ionically intercalated materials useful for those embodiments comprising flexible and wearable energy storage devices. The fact that a variety of ions, as different as $Na^+$ and $Al^{3+}$, can be accommodated between the $M'_2M''_nX_{n+1}$ layers provide for embodiments comprising batteries as well as in metal-ion capacitors (battery-supercapacitor hybrids) which comprise these intercalated MXene as well.

In addition to the compositions of the MXene materials, various embodiments provide for the preparation of such materials. Certain embodiments provide methods of preparing compositions comprising: (a) removing substantially all of the A atoms from a compositionally consistent MAX-phase composition having an empirical formula of $M'_2M''_nAlX_{n+1}$ $M_{n+1}AX_n$; wherein M', M", X, and n are defined herein.

As used herein, the term "removing substantially all of the A atoms from a MAX-phase composition" connotes embodiments wherein at least 50 atomic % of the A atoms are removed from a finally recovered sample, relative to the original MAX phase composition. In other more preferred independent embodiments, more than about 60 atomic %, more than about 70 atomic %, more than about 80 atomic %, more than about 90 atomic %, more than about 95 atomic %, more than about 98 atomic %, and more than about 99 atomic % of the A atoms are removed from a finally recovered sample, relative to the original MAX phase composition.

Certain embodiments provide a process for removing these A atoms comprising treatment with an acid, preferably an acid capable of reacting with the Al atoms. Such acids may be organic or inorganic acids, and may be applied in the gas or liquid phase, provided the resulting Al product can be removed from the lattice. In this regard, strong acids which include fluorine atoms appear to be especially preferred. Aqueous hydrofluoric acid is among those acids which appear especially useful. Aqueous ammonium hydrogen fluoride ($NH_4F\cdot HF$) is another, more safely handled, acid which may be useful in effecting removal of the A atom. Other alkali metal bifluoride salts (i.e., $QHF_2$, where Q is Li, Na, or K, or combinations thereof) may also be useful for this purpose. Indeed, even conditions which generate aqueous HF in situ (for example, using at least one fluoride salt, such as an alkali metal, alkaline earth metal, or ammonium fluoride salt (e.g., LiF, NaF, KF, CsF, $CaF_2$, tetraalkyl ammonium fluoride (e.g., tetrabutyl ammonium fluoride)) in the presence of at least one mineral acid that is stronger than HF (such as HCl, $HNO_3$, or $H_2SO_4$); or a combination of two or more of these sources have been shown to provide mixtures capable of effectively removing the A atom from MAX phase materials. Uses of such reactants, and any combination thereof, are considered within the scope of this disclosure.

The extraction of the Al layers may be done at room, or even moderate, temperature, for example in the range of about 20° C. to about 800° C., preferably in temperature ranges wherein the lower temperature is about 20° C., about 25° C., about 30° C., about 40° C., about 50° C., about 60° C., about 80° C., about 100° C., about 200° C., or about 300° C., and wherein the upper temperature is about 600° C., about 500° C., about 400° C., about 300° C., about 250° C., about 200° C., about 150° C., about 100° C., about 80° C., or about 60° C. Exemplary examples of ranges include temperatures in the range of about 20° C. to about 100° C., about 20° C. to about 60° C., or about 30° C. to about 60° C. The extractions may be conducted using liquid or gas phase extraction methods. Gas phase reactions are generally to be done at the higher temperatures.

In further embodiments, the chemically treated materials are subjected to sonication, either using ultrasonic or mega sonic energy sources. This sonication may be applied during or after the chemical treatment.

In other embodiments, the exfoliation can be accomplished electrochemically. In various embodiments, MAX phase materials are selectively exfoliated to form the corresponding MXene by the application of potentiostatic or galvanostatic polarization. See Example 9, below.

It should also be recognized that, in addition to those embodiments described for the compositions provided above, other embodiments provide for compositions provided by the methods of preparation described herein. For example, those composition obtained from subjecting a MAX phase material to a chemical exfoliation process, said exfoliation process comprising treatment with aqueous HF and sonication, wherein a substantial portion of the A atoms are removed should also be considered within the scope of the present disclosure.

The following listing of embodiments is intended to complement, rather than displace or supersede, the previous descriptions.

Embodiment 1

A crystalline composition comprising at least one layer having first and second surfaces, each layer comprising:
a substantially two-dimensional array of crystal cells,
each crystal cell having an empirical formula of $M'_2M''_nX_{n+1}$, such that each X is positioned within an octahedral array of M' and M";
wherein M' and M" each comprise different Group IIIB, IVB, VB, or VIB metals;
each X is C, N, or a combination thereof;
n=1 or 2; and wherein
the M' atoms are substantially present as two-dimensional outer arrays of atoms within the two-dimensional array of crystal cells;
the M" atoms are substantially present as two-dimensional inner arrays of atoms within the two-dimensional array of crystal cells; and
the two dimensional inner arrays of M" atoms are sandwiched between the two-dimensional outer arrays of M' atoms within the two-dimensional array of crystal cells.

Embodiment 2

The crystalline composition of Embodiment 1, wherein n is 1 and M' is Sc, Cr, Hf, Mo, Ti, V, Zr, of a combination of two or more thereof.

Embodiment 3

The crystalline composition of Embodiment 1 or 2, wherein M' is Ti, V, Cr, Mo, of a combination of two or more thereof.

Embodiment 4

The crystalline composition of any one of Embodiments 1 to 3, wherein M" is Sc, Nb, Ta, Ti, V, of a combination of two or more thereof.

Embodiment 5

The crystalline composition of any one of Embodiments 1 to 4, wherein n is 1 and M" is Nb, Ta, Ti, or V, of a combination of two or more thereof.

Embodiment 6

The crystalline composition of any one of Embodiments 1, 3, or 4, wherein n is 2, M' is Sc, Cr, Mo, Ti, V, Nb, Zr, Hf of a combination of two or more thereof, and M" is Nb, Ta, Ti, or V, Zr, Hf, Sc, of a combination of two or more thereof, provided M' and M" do not contain the same metal.

Embodiment 7

The crystalline composition of Embodiment 1, wherein $M'_2M''_nX_{n+1}$, is or comprises $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$. In certain Aspects of this Embodiment, or any description of $M'_2M''_nX_{n+1}$, one or more of $Cr_2TiC_2$, $Cr_2VC_2$, $Cr_2TaC_2$, or $Cr_2NbC$ is specifically excluded.

Embodiment 8

The crystalline composition of Embodiment 1, wherein $M'_2M''_nX_{n+1}$, is or comprises $Mo_2TiC_2$, $Mo_2VC_2$, $Mo_2TaC_2$, or $Mo_2NbC_2$.

Embodiment 9

The crystalline composition of Embodiment 1, wherein $M'_2M''_nX_{n+1}$, is or comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$. In certain Aspects of this Embodiment, one or more of $Cr_2Ti_2C_3$, $Cr_2V_2C_3$, $Cr_2Nb_2C_3$, or $Cr_2Ta_2C_3$, is specifically excluded.

Embodiment 10

The crystalline composition of Embodiment 1, wherein $M'_2M''_nX_{n+1}$, is or comprises $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$.

Embodiment 11

The crystalline composition of Embodiment 1, wherein $M'_2M''_nX_{n+1}$, is or comprises $Nb_2VC_2$, $Ta_2TiC_2$, $Ta_2VC_2$, or $Nb_2TiC_2$.

Embodiment 12

The crystalline composition of any one of Embodiments 1 to 11, wherein at least one of said surfaces of each layer has surface terminations bonded to the outer arrays of atoms, the surface terminations comprising alkoxide, carboxylate, halide, hydroxide, hydride, oxide, sub-oxide, nitride, sub-nitride, sulfide, thiol, or a combination thereof.

Embodiment 13

The crystalline composition of any one of Embodiments 1 to 12, wherein at least one of said surfaces of each layer has surface terminations bonded to the outer arrays of atoms, the surface terminations comprising alkoxide, fluoride, hydroxide, oxide, sub-oxide, or a combination thereof.

Embodiment 14

The crystalline composition of any one of Embodiments 1 to 13, wherein the $M'_2M''_nX_{n+1}$ is in a ordered state, such that:
(a) the two-dimensional outer arrays of atoms contain 80 atom % or more, 85 atom % or more, 90 atom % or more, 95 atom % or more, 98 atom % or more, or substantially all M' atoms, the balance to 100 atom % being M" atoms;
(b) the two-dimensional inner arrays of atoms contain 80 atom % or more, 85 atom % or more, 90 atom % or more, 95 atom % or more, 98 atom % or more, or substantially all M" atoms, the balance to 100 atom % being M' atoms;
within the two-dimensional array of crystal cells.

Embodiment 15

The crystalline composition of any one of Embodiments 1 to 14, wherein the $M'_2M''_nX_{n+1}$ is in a ordered state, such that:

(a) the two-dimensional outer arrays of atoms contain 95 atom % or more M' atoms/5 atom % or less of M" atoms;
(b) the two-dimensional inner arrays of atoms contain 95 atom % or more M" atoms/5 atom % or less of M' atoms; within the two-dimensional array of crystal cells.

Embodiment 16

The crystalline composition of any one of Embodiments 1 to 15, wherein X is C.

Embodiment 17

The crystalline composition of any one of Embodiments 1 to 16, wherein the composition comprises an electrically conductive or semiconductive surface. In independent Aspects of this Embodiment, the composition comprises an electrically semiconductive surface Embodiment 18

The crystalline composition of any one of Embodiments 1 to 17, wherein the composition exhibits a negative resistivity rate, dρ/dT at all temperatures in a range of from 0 K to 300 K, where ρ is resistivity, for example, in Ω-cm, and T is a Kelvin temperature.

Embodiment 19

The crystalline composition of any one of Embodiments 1 to 18, wherein the composition exhibits a positive magnetoresistance (MR) response to a non-zero magnetic field from −5 Tesla to +5 Tesla.

Embodiment 20

A stacked assembly of at least two crystalline layers having first and second surfaces, each layer comprising:
a substantially two-dimensional array of crystal cells,
each crystal cell having an empirical formula of $M'_2M''_nX_{n+1}$, such that each X is positioned within an octahedral array of M' and M";
wherein M' and M" each comprise different Group IIIB, IVB, VB, or VIB metals;
each X is C, N, or a combination thereof;
n=1 or 2; and wherein
the M' atoms are substantially present as two-dimensional outer arrays of atoms within the two-dimensional array of crystal cells;
the M" atoms are substantially present as two-dimensional inner arrays of atoms within the two-dimensional array of crystal cells; and
the two dimensional inner arrays of M" atoms are sandwiched between the two-dimensional outer arrays of M' atoms within the two-dimensional array of crystal cells; and
wherein the layers are characterized as having an average surface area and interlayer distance.

Embodiment 21

The stacked assembly of Embodiment 20, wherein M' is Ti, V, Cr, Mo, of a combination of two or more thereof.

Embodiment 22

The stacked assembly of Embodiment 20 or 21, wherein M" is Ti, V, Nb, Ta, of a combination of two or more thereof.

Embodiment 23

The stacked assembly of any one of Embodiments 20 to 22, wherein n is 1, M' is Cr, Hf, Mo, Ti, V, Zr, of a combination of two or more thereof.

Embodiment 24

The stacked assembly of any one of Embodiments 20 to 23, wherein n is 1, and M" is Nb, Ta, Ti, V, of a combination of two or more thereof.

Embodiment 25

The composition of any one of Embodiments 20 to 22, wherein is 2, M' is Mo, Ti, V, of a combination of two or more thereof and M" is Cr, Nb, Ta, Ti, or V, of a combination of two or more thereof.

Embodiment 26

The stacked assembly of Embodiment 20, wherein $M'_2M''_nX_{n+1}$, comprises $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$. In certain Aspects of this Embodiment, one or more of $Cr_2TiC_2$, $Cr_2VC_2$, $Cr_2TaC_2$, or $Cr_2NbC$ is specifically excluded.

Embodiment 27

The stacked assembly of Embodiment 20, wherein $M'_2M''_nX_{n+1}$, comprises $Mo_2TiC_2$, $Mo_2VC_2$, $Mo_2TaC_2$, or $Mo_2NbC_2$.

Embodiment 28

The stacked assembly of Embodiment 20, wherein $M'_2M''_nX_{n+1}$, comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$. In certain Aspects of this Embodiment, one or more of $Cr_2Ti_2C_3$, $Cr_2V_2C_3$, $Cr_2Nb_2C_3$, or $Cr_2Ta_2C_3$, is specifically excluded.

Embodiment 29

The stacked assembly of Embodiment 20, wherein $M'_2M''_nX_{n+1}$, comprises $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$.

Embodiment 30

The stacked assembly of Embodiment 20, wherein $M'_2M''_nX_{n+1}$, comprises $Nb_2VC_2$, $Ta_2TiC_2$, $Ta_2VC_2$, or $Nb_2TiC_2$.

Embodiment 31

The stacked assembly of any one of Embodiments 20 to 30, wherein at least one of said surfaces of each layer has surface terminations bonded to the outer arrays of atoms, the surface terminations comprising alkoxide, carboxylate, halide, hydroxide, hydride, oxide, sub-oxide, nitride, sub-nitride, sulfide, thiol, or a combination thereof.

Embodiment 32

The stacked assembly of any one of Embodiments 20 to 31, wherein at least one of said surfaces of each layer has surface terminations bonded to the outer arrays of atoms, the surface terminations comprising alkoxide, fluoride, hydroxide, oxide, sub-oxide, or a combination thereof.

Embodiment 33

The stacked assembly of any one of Embodiments 20 to 32, wherein the $M'_2M''_nX_{n+1}$ is in a ordered state, such that:
(a) the two-dimensional outer arrays of atoms contain 80 atom % or more, 85 atom % or more, 90 atom % or more, 95 atom % or more, 98 atom % or more, or substantially all M' atoms, the balance to 100 atom % being M" atoms;
(b) the two-dimensional inner arrays of atoms contain 80 atom % or more, 85 atom % or more, 90 atom % or more, 95 atom % or more, 98 atom % or more, or substantially all M" atoms, the balance to 100 atom % being M' atoms;
within the two-dimensional array of crystal cells.

Embodiment 34

The stacked assembly of claim 20, wherein the $M'_2M''_nX_{n+1}$ is in a ordered state, such that:
(a) the two-dimensional outer arrays of atoms contain 95 atom % or more M' atoms/5 atom % or less of M" atoms;
(b) the two-dimensional inner arrays of atoms contain 95 atom % or more M" atoms/5 atom % or less of M' atoms;
within the two-dimensional array of crystal cells.

Embodiment 35

The stacked assembly of any one of Embodiments 20 to 34, wherein X is C.

Embodiment 36

The stacked assembly of any one of Embodiments 20 to 35, wherein the composition comprises an electrically conductive or semiconductive surface, preferably a semiconductive surface.

Embodiment 37

The stacked assembly of any one of Embodiments 20 to 36, wherein the composition exhibits a negative resistivity rate, $d\rho/dT$ at all temperatures in a range of from 0 K to 300 K, where $\rho$ is resistivity, for example in $\Omega$-cm, and T is a Kelvin temperature.

Embodiment 38

The stacked assembly of any one of Embodiments 20 to 37, wherein the composition exhibits a positive magnetoresistance (MR) response to a non-zero magnetic field from $-5$ Tesla to $+5$ Tesla.

Embodiment 39

The stacked assembly of any one of Embodiments 20 to 38, wherein the average area of the layers is in the range of about 100 $nm^2$ to about 10,000 $nm^2$ or about 100 $\mu m^2$ to about 10,000 $\mu m^2$.

Embodiment 40

The stacked assembly of any one of Embodiments 20 to 39, said assembly resulting from the deposition of delaminated flakes of the composition of any one of Embodiments 1 to 19 onto a surface.

Embodiment 41

The stacked assembly of any one of Embodiments 20 to 40, wherein lithium, sodium, potassium, and/or magnesium, atoms, ions, or both atoms and ions are intercalated between at least some of the layers.

Embodiment 42

The stacked assembly of any one of Embodiments 20 to 40, wherein lithium atoms, ions, or both atoms and ions are intercalated between at least some of the layers lithium.

Embodiment 43

An energy-storing device or electrode comprising the stacked assembly of any one of Embodiments 20 to 42.

Embodiment 44

A battery comprising the stacked assembly of any one of Embodiments 20 to 43.

Embodiment 43

The method of Embodiment 42, wherein the A atoms are removed by a process comprising a treatment with a fluorine-containing acid.

Embodiment 44

The method of Embodiments 43, wherein the fluorine-containing acid is aqueous hydrofluoric acid.

Embodiment 45

The method of Embodiment 43, wherein the fluorine-containing acid is a substantially anhydrous gas.

Embodiment 46

The method of Embodiment 43, wherein the fluorine-containing acid comprises aqueous ammonium hydrogen fluoride ($NH_4F.HF$), $NaHF_2$, or a mixture resulting from the combination of an alkali metal salt with a mineral acid.

EXAMPLES

The following Examples are provided to illustrate some of the concepts described within this disclosure. While each Example is considered to provide specific individual embodiments of composition, methods of preparation and use, none of the Examples should be considered to limit the more general embodiments described herein.

In the following examples, efforts have been made to ensure accuracy with respect to numbers used (e.g. amounts, temperature, etc.) but some experimental error and deviation should be accounted for. Unless indicated otherwise, temperature is in degrees C., pressure is at or near atmospheric.

Example 1: Methods and Materials

Example 1.1: Synthesis of MAX Phases

The Mo-based MAX phases were synthesized by ball milling Mo, Ti, Al and graphite powders (all from Alfa Aesar, Ward Hill, Mass.), with mesh sizes of −250, −325, −325 and −300, respectively, for 18 h using zirconia balls in plastic jars. The Mo:Ti:Al:C molar ratios were 2:1:1.1:2 and 2:2:1.3:2.7 for the $Mo_2TiAlC_2$ and $Mo_2Ti_2AlC_3$, respectively. Powder mixtures were heated in covered alumina crucibles at 5° C./min to 1,600° C. and held for 4 h under flowing argon. After cooling, the porous compacts were milled using a TiN-coated milling bit and sieved through a 400 mesh sieve, producing powder with a particle size<38 m. $Cr_2TiAlC_2$ was synthesized by heating an elemental mixture of Cr, Ti, Al and C at 1,500° C. for 1 h under Ar flow.

Example 1.2: Synthesis of MXenes

Two grams of $Mo_2TiAlC_2$ or $Mo_2Ti_2AlC_3$ powders were added, over about 60 sec, to 20 ml of 48-51% aqueous HF solution at ambient temperature (55° C. for $Mo_2Ti_2AlC_3$) and held for 48 h (90 h for $Mo_2Ti_2AlC_3$) while stirring with a magnetic Teflon coated bar, rotating at 200 rpm. The mixtures were washed 5 times by adding distilled water, shaking for 1 min, centrifuging at 3,500 rpm for 120 s for each cycle and finally decanted. After the last centrifuge, the pH of the supernatant was >6. The final product was mixed with distilled water and filtered on a membrane (3501 Coated PP, Celgard, USA).

Example 1.2.1. Synthesis of $Cr_2TiC_2$ $Cr_2TiAlC_2$ was synthesized simply from the elemental mixture. Cr, Ti, Al and graphite powders (all from Alfa Aesar, Ward Hill, Mass.), with mesh sizes of −325, −325, −325 and −300, respectively, were ball milled for 18 h using zirconia milling balls in plastic jars. The Cr:Ti:Al:C molar ratio was 2:1:1.1:2. Powder mixture was placed in an alumina crucible and heated at 5° C./min to 1,500° C. and held for 1 h under flowing argon. After cooling, the slightly sintered porous compacts were milled into a fine powder using a TiN-coated milling bit and sieved through a 400 mesh sieve, producing powder with a particle size<38 m.

LiF (Alfa Aesar, 1.28 g or 5 molar equivalents) was added to 20 mL of a 6M HCl solution followed by stirring with a magnetic Teflon stir bar for 5 min to dissolve the salt. Two grams of $Cr_2TiAlC_2$ was added to the solution over the course of 120 s to avoid any exothermic initial reaction to overheat the solution. The reaction mixture was then held at 55° C. for 42 h while stirring with a magnetic Teflon coated stir bar, rotating at 200 rpm. The mixtures were washed 5 times by adding distilled water, shaking for 1 min, centrifuging at 3,500 rpm for 120 s for each cycle and finally decanted. After the last centrifuge the pH of the supernatant was >6. The final product was mixed with a small amount of distilled water and filtered on a membrane (3501 Coated PP, Celgard, USA). The corresponding XRD patterns are shown in FIG. 1(A).

Example 1.3: Preparation and Testing of LIB Electrodes

Electrodes were prepared by mixing the MXene powders, carbon black and 10 wt. % polyvinylidene fluoride dissolved in 1-methyl-2-pyrrolidinone (all from Alfa Aesar, USA) in a 80:10:10 ratio by weight. The mixture was coated onto a copper foil using a doctor blade and dried under vacuum at 140° C. for 24 h. Coin cells were assembled using Li foil and two layers of Celgard separators. The electrolyte was 1 M solution of $LiPF_6$ in a 1:1 mixture of ethylene carbonate and diethyl carbonate. Electrochemical studies were performed using a potentiostat (VMP3, Biologic, France).

Example 1.4 Delamination of $Mo_2TiC_3T_x$ and Preparation of MXene 'Paper'

About 1 gram of multilayered $Mo_2TiC_3T_x$ powder was mixed with 10 ml of DMSO and stirred for 24 h at room temperature. The resulting colloidal suspension was centrifuged to separate the intercalated powder from the liquid DMSO. After decantation of the supernatant, 100 mL of deionized water was added to the residue and the mixture was sonicated for 1 h, before centrifuging it for 1 h at 3500 rpm. Lastly, the supernatant was decanted and filtered, using a Celgard membrane, and dried under vacuum.

In another exemplary method, about 1 g of the $Mo_2TiC_3T_x$ or $Mo_2Ti_2C_3T_x$ filtered powders was mixed with 10 ml of tetrabutylammonium hydroxide (TBAOH) and stirred for 4 h at room temperature. The resulting colloidal suspension was centrifuged to separate the intercalated powder from the liquid. After decanting the supernatant, about 50 ml of deionized water was added to the residue, centrifuged and the supernatant was again decanted in this case to remove any residual TBAOH. After that, 100 ml of deionized water was added to the residue and the mixture was sonicated for 1 h, before centrifuging it for another hour at 5000 rpm. Lastly, the supernatant containing single- or few-layer MXene flakes was passed through filtered using a Celgard membrane resulting in films that were dried under vacuum at RT.

Example 1.5: Electrochemical Capacitor Testing

Electrodes based on multilayered $Mo_2TiC_3T_x$ were prepared by rolling a mixture of $Mo_2TiC_3T_x$, acetylene carbon black (Alfa Aesar, USA) and polytetrafluoroethylene (PTFE) binder (60 wt. % solution in water, Aldrich, USA). Rolled films, approximately 80 m thick, were punched into 10 mm discs. The delaminated $Mo_2TiC_3T_x$ 'paper' was tested in 1 M $H_2SO_4$ electrolyte using 3-electrode Swagelok cells, where the MXene served as working electrode, an over-capacitive activated carbon film was used as a counter electrode, and Ag/AgCl in 1 M KCl was the reference electrode.

Example 1.6: Microstructural Characterization

XRD was carried out on a Rigaku Smartlab (Tokyo, Japan) diffractometer using Cu-Kα radiation (40 KV and 44 mA); step scan 0.02°, 3°–80° 2 theta range, step time of 7 s, 10×10 mm2 window slit. 10 wt. % of silicon powder was added to the MAX powders as an internal standard. A SEM (Zeiss Supra 50VP, Germany) equipped with EDX (Oxford Inca X-Sight, Oxfordshire, UK) was used. HR STEM and EDX analyses were carried out with a double corrected FEI Titan 3 operated at 300 kV, equipped with the Super-X EDX system. SAED characterization was performed using a FEI Tecnai G2 TF20 UT field emission microscope at 200 kV and a point resolution of 0.19 nm. The specimens were prepared by embedding the powder in a Ti grid, reducing the Ti-grid thickness down to 50 m via mechanical polishing and finally Ar+ ion milling to reach electron transparency.

Example 1.7: Density Functional Theory Simulations

First-principles calculations were carried out using DFT and the all-electron projected augmented wave (PAW) method as implemented in the Vienna ab initio simulation package (VASP). A plane-wave cutoff energy of 580 eV is sufficient to ensure convergence of the total energies to 1 meV per primitive cell. For the exchange-correlation energy, we use the Perdue-Burke-Emzerhof (PBE) version of the generalized gradient approximation (GGA). Considering the strong correlation effects in transition metals, electronic structure calculations and structural relaxations were performed using a spin-dependent GGA plus Hubbard U (GGA+U) method. Herein, the U values of Ti, V, Cr, Nb, Mo, and Ta atom were set to 4, 4, 3, 4, 5, and 4 eV, respectively.

Example 2: Density Functional Theory (DFT) Predictions

Figure 2:
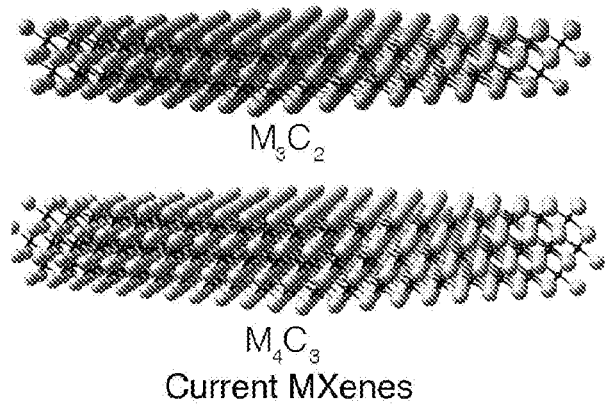
FIG. 2 illustrates schematic of MXene structures. (A) Currently available MXenes, M can be Ti, V, Nb, Ta as a monoatomic M layers and intermixing between them to make solid solutions. (B) Discovering the new families of double transition metals MXenes, with two structures as $M'_2M''C_2$ and $M'_2M''_2C_3$, adds at least 24 new 2D carbides, in which the surface M' atoms are different from the inner M'' atoms. M' and M'' atoms can be: Ti, V, Nb, Ta, Cr, Mo. (C) Each MXene can have three different surface termination groups (OH, O and F), adding to the variety of the newly discovered MXenes.
Figure 2:
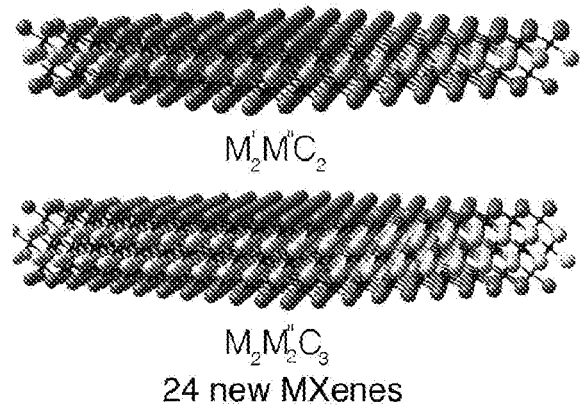
Figure 2:
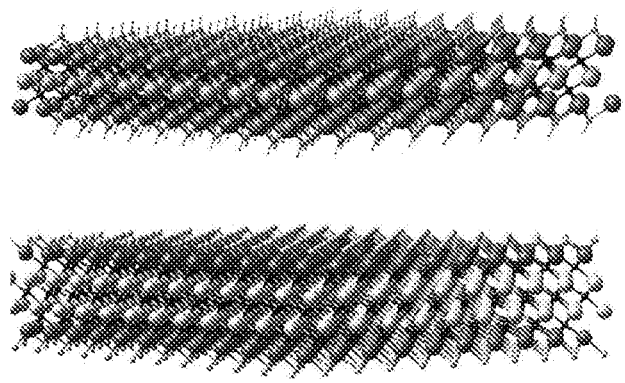

Density functional theory (DFT) was used to predict the stability of over twenty 20, ordered, double-M MXenes, viz. $M'_2M''C_2$ and $M'_2M''_2C_3$, as schematically shown in FIG. 2, where M' and M" were Ti, V, Nb, Ta, Cr or Mo. Of these, $Mo_2TiC_2$, $Mo_2Ti_2C_3$ and $Cr_2TiC_2$, were synthesized. The electrochemical activity of $Mo_2TiC_2$ was shown to be significantly different from that of $Ti_2C_3$. The potential of $Mo_2TiC_2$ in electrochemical energy storage was also explored.

Using Mo—Ti containing phases as a case study, initial studies were done using $Mo_2TiC_2$. The energy differences between a totally ordered $Mo_2TiC_2$ (inset on the far left in FIG. 3(A)) configuration, and partially ordered configurations (middle and right insets) are plotted in FIG. 3(A). These results unequivocally showed that the ordered $Mo_2TiC_2$ compostions—with a Mo—Ti—Mo stacking— had the lowest energy. Moreover, the total energy of $Mo_2TiC_2$ increased almost linearly as the fraction of Mo atoms in the M" sites.

Figure 3:
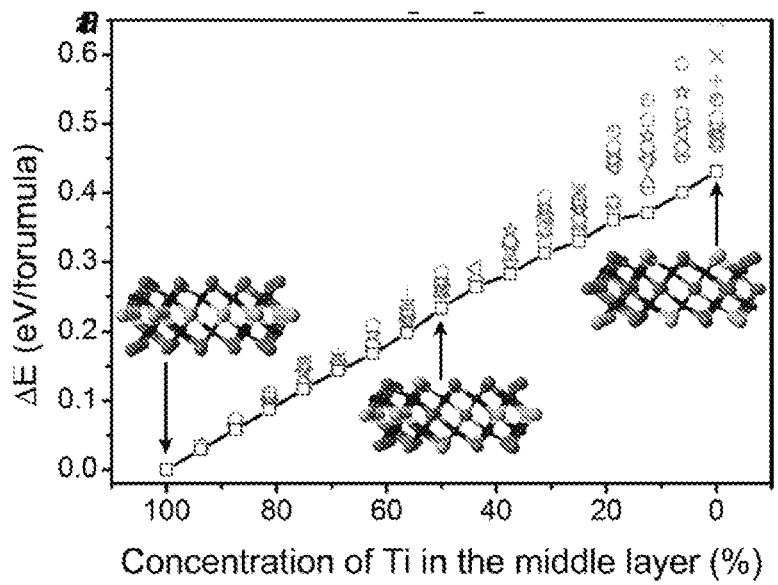
FIG. 3 provides energy diagram of M'M''Xenes predicting stability based on DFT calculations. (A) Total energy diagram of $Mo_2TiC_2$ monolayer as a function of Ti concentration in the middle layer, relative to fully ordered $Mo_2TiC_2$. The black line is a guide of eye for the lowest energy configuration of each composition. The insets show the stable structures of $Mo_2TiC_2$ monolayers with 100%, 50%, and 0% Ti in the middle layer (Ti atoms are green, Mo atoms are red, and C atoms are black). Total energy profiles of calculated $M'_2M''C_2$ (B) and $M'_2M''_2C_3$(C) M'M''Xenes FIG. 4 provides schematics for different ordering of (A) $M'_2M''C_2$ and (B) $M'_2M''_2C_3$ compositions, the values of 0%, 25%, 33%, 50%, 66%, 75%, and 100% representing the fraction of M' atoms occupying the outer arrays of atoms within the two-dimensional array of crystal cells, reflecting the different types of ordering in the two systems.
Figure 3:
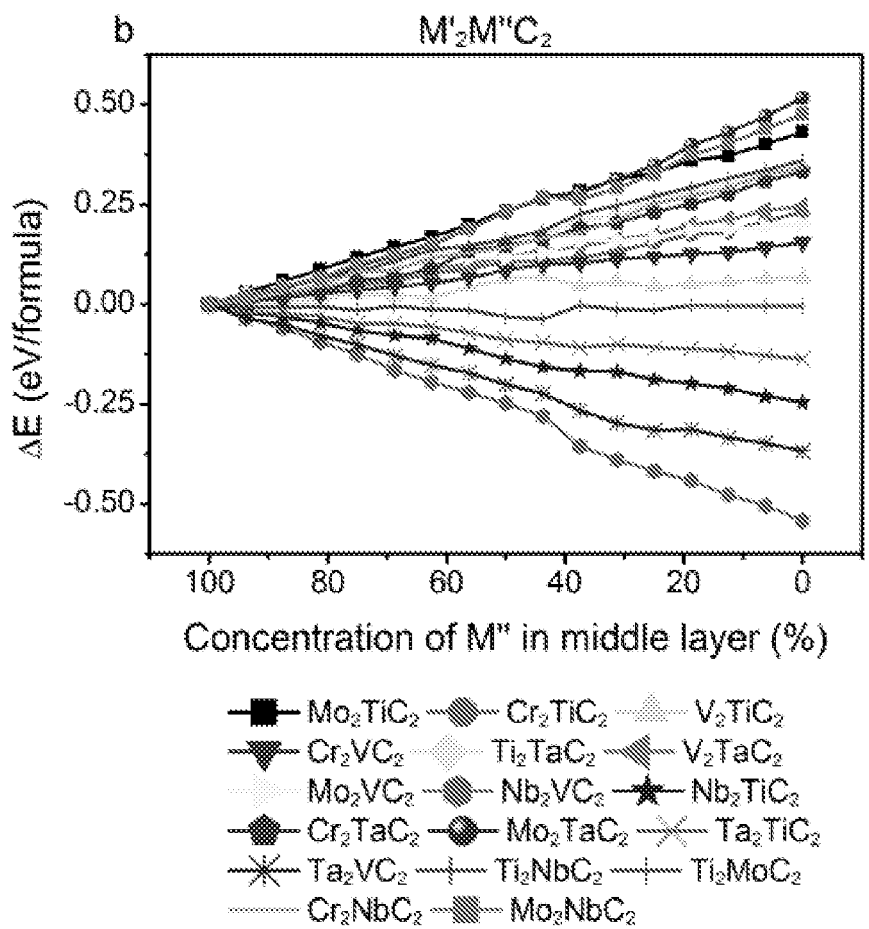

The same calculations were repeated for several other M' and M" elements and selected results are shown in FIG. 3(B). Based on these figures, it was clear that the stability depended on elements chosen. Thus at 0 K, the following MXenes prefer to be in a fully ordered state: $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$ and $V_2TiC_2$. Compositions comprising these cell stoichiometries, then, represent specific individual embodiments of the present disclosure. Interestingly enough, the following four MXenes—$Nb_2VC_2$, $Ta_2TiC_2$, $Ta_2VC_2$ and $Nb_2TiC_2$—were shown to be more stable in their disordered than in their ordered state (FIG. 3(B)). See also Table 1.

TABLE 1

Calculated net charges of atoms in different MXenes. Note that the charges in $Mo_2TiC_2$ and $Mo_3C_2$ are quite similar

| | M' | M" | C |
|---|---|---|---|
| $Mo_2TiC_2$ | 0.66 | 1.64 | −1.47 |
| $Mo_3C_2$ | 0.76 | 1.23 | −1.37 |
| $Ti_3C_2$ | 1.10 | 1.60 | −1.89 |

Figure 4:
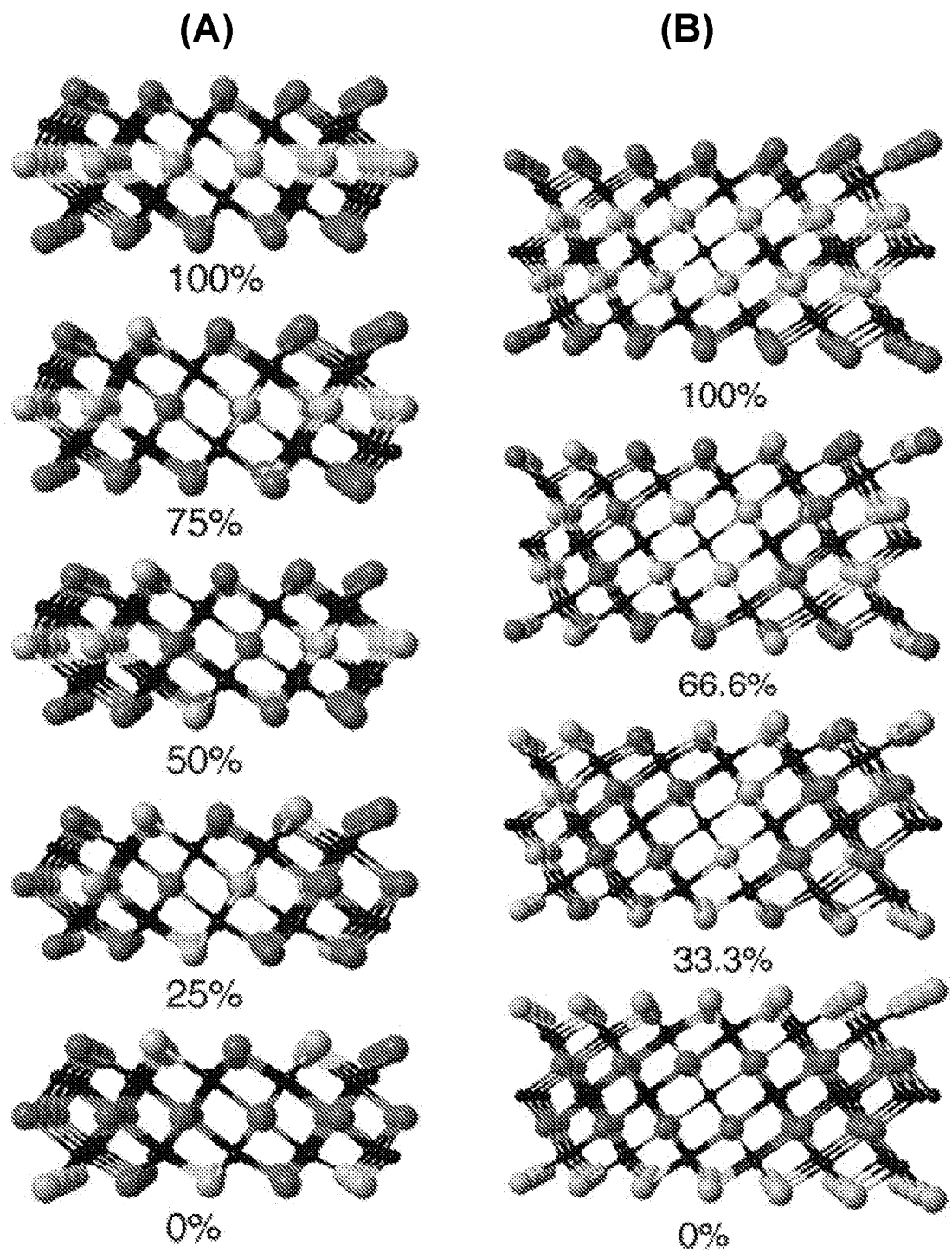

For the $M'_2M''_2C_3$ compositions, there were two fully ordered structures—$M'_2M''_2C_3$ and $M''_2M'_2C_3$ (see FIG. 4). Select energy differences between the two ordered structures are plotted in FIG. 3(C) in such a way that the more stable MXene is at 100%. Here again, the energy of the system increased monotonically from one ordered configuration to the other. Based on these results, at 0 K, $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C$, $V_2Nb_2C_3$ and $V_2Ti_2C_3$ are expected to be ordered, and within the scope of embodiments presented herein. By definition, in all cases, the first element in the formula sandwiches the second element. By extension their opposite is higher in energy.

Figure 5:
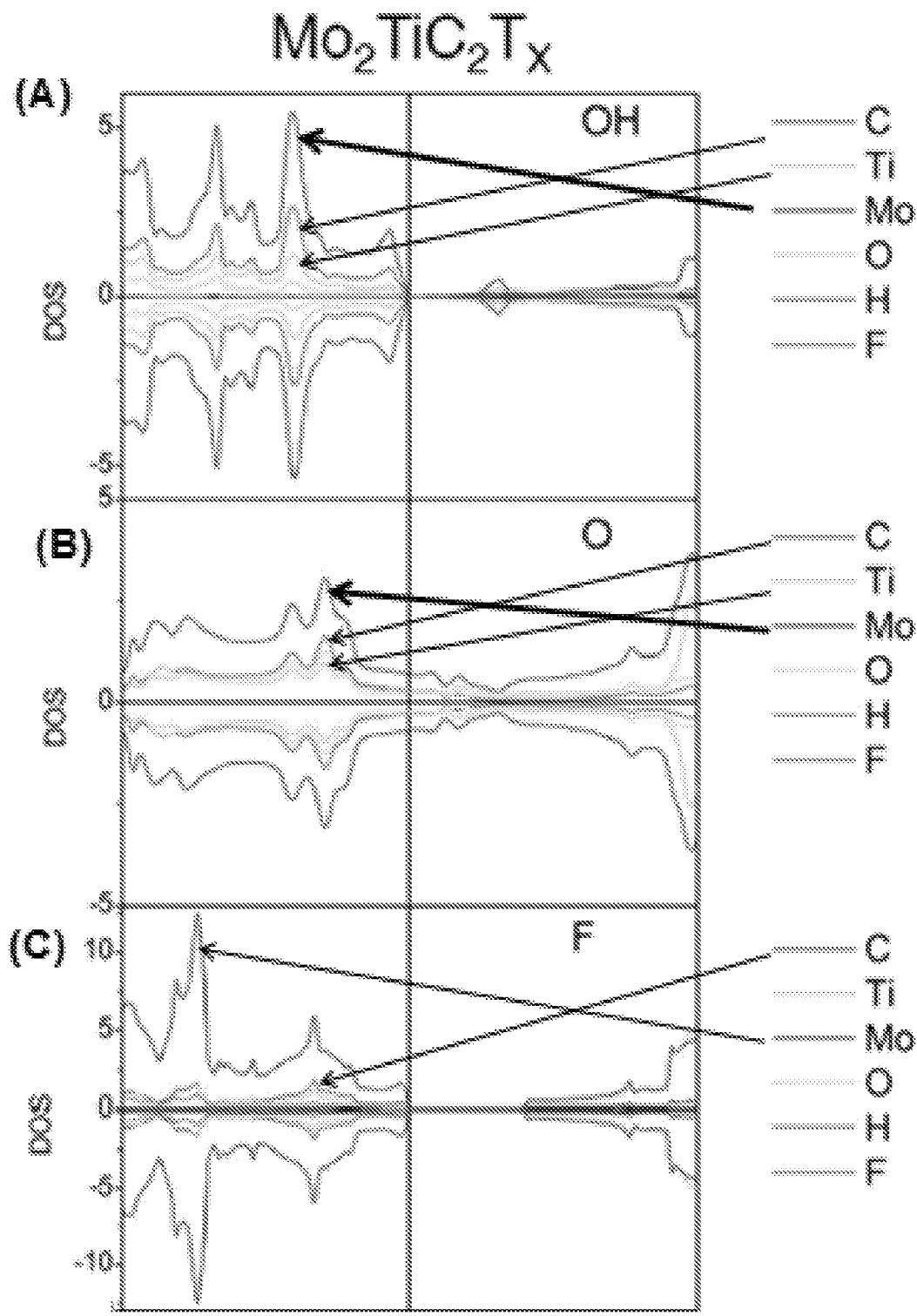
FIG. 5 illustrates electronic structures of selected MXenes. (A-N), Total densities of states for OH-, O-, and F-terminated $Mo_2Ti_2C_3$(A-G), $Mo_3C_2$(H—N), and $Ti_3C2$ (O-Q) MXenes. (R-T) represent $Mo_2TiC_2$ compositions with OH, O, and F terminations, respectively, where Mo is the main contributor of the DOS near the Fermi level.
Figure 5:
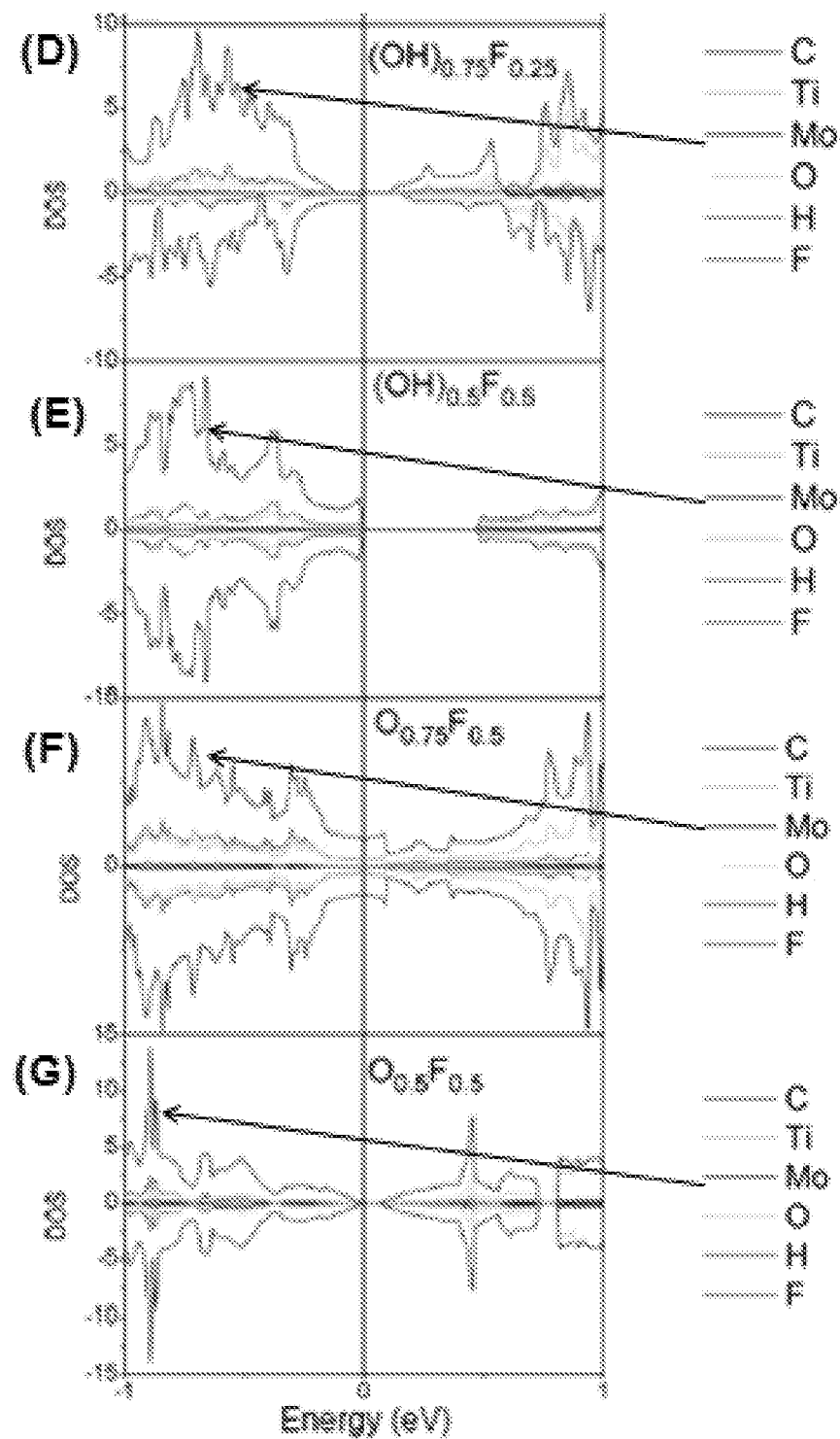
Figure 5:
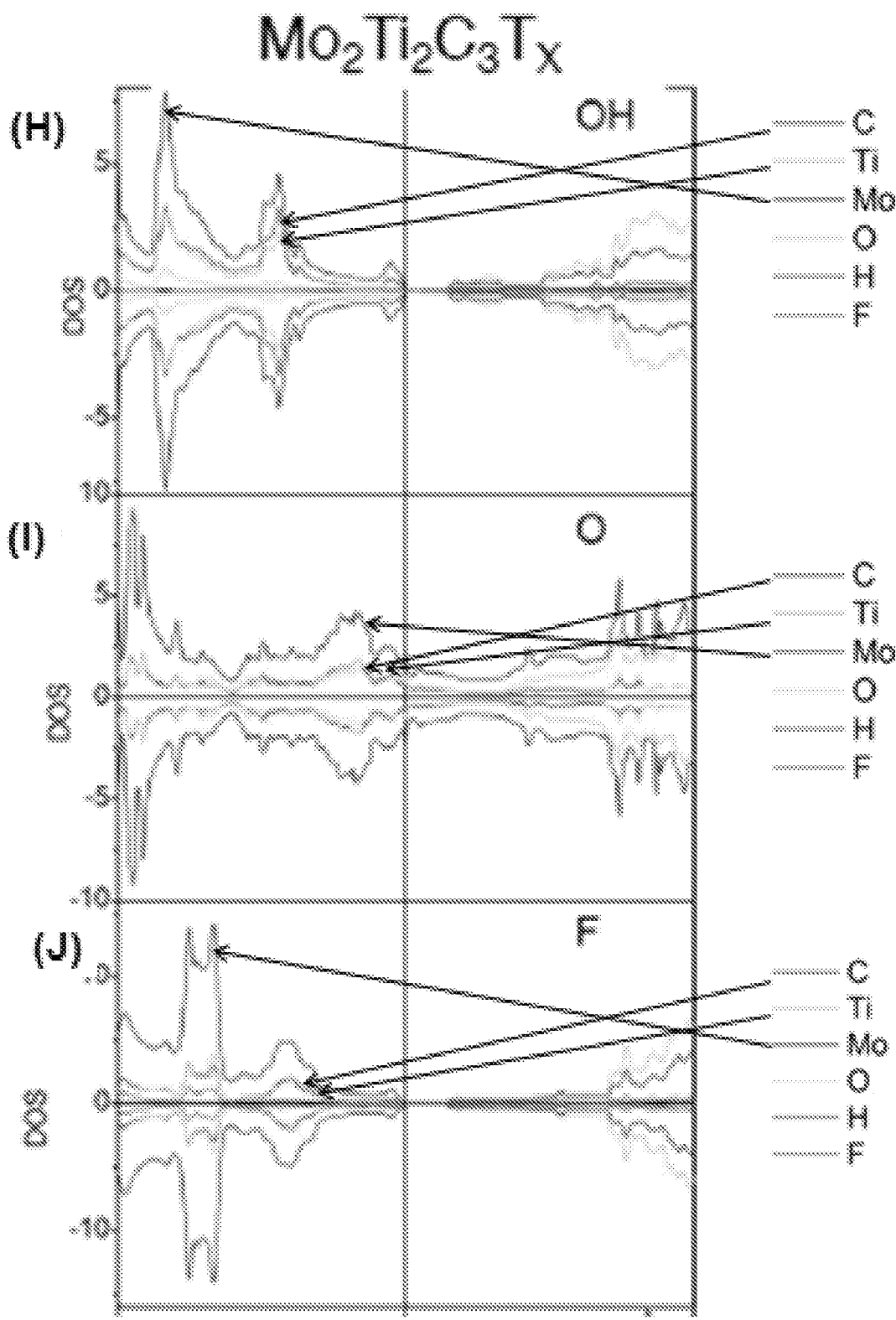
Figure 5:
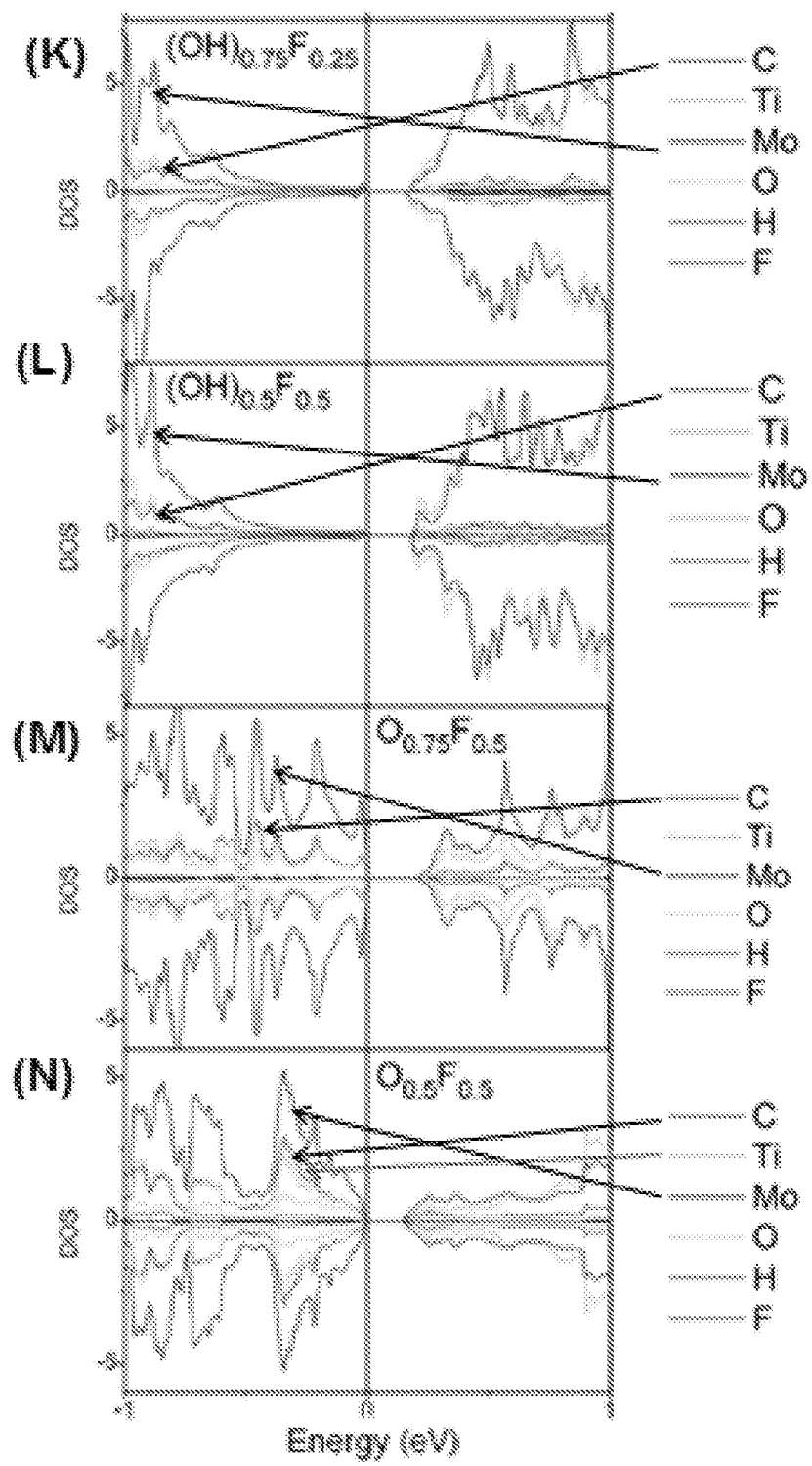
Figure 5:
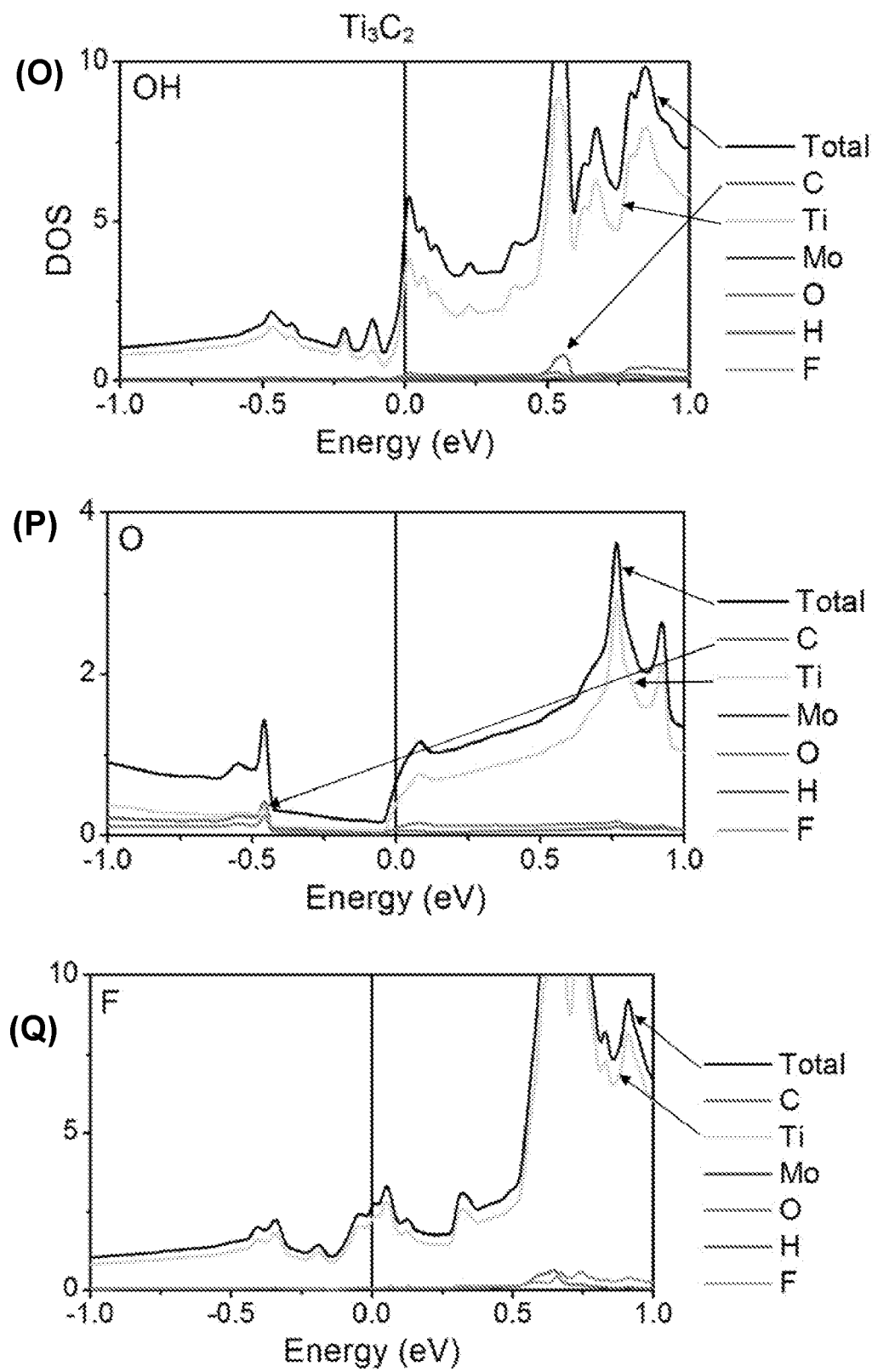

From the totality of these results one can infer another important generalization concerning Ta and Nb. In contradistinction to the Mo and Cr atoms that avoid the middle layers, Ta and Nb, when given the chance, avoid the outer ones. To obtain further insight into these MXenes, further DFT calculations were carried out on $Mo_2TiC_2$. FIGS. 5(A-N) plot the projected and total density of states (DOS) of $Mo_2TiC_2T_x$ and $Mo_2Ti_2C_3T_x$, where $T_x$ refers to the surface terminations, and T is OH, O and F, respectively. The respective figures for $Ti_3C_2T_x$ are FIGS. 5(O), (P), and (Q). Clearly, in all cases and regardless of termination, the DOS at $E_f$ was dominated by the M-M d-orbitals and was substantial. Interestingly in the $Mo_2TiC_2T_x$ case, the DOS at $E_f$ was dominated by the Mo—Mo d-orbitals and not the Ti orbitals. Thus, the Mo layers should control the electronic properties of $Mo_2TiC_2T_x$. Based on these predictions, $Mo_2TiC_2$, $Mo_2Ti_2C_3$ and $Cr_2TiC_2$ was chosen for synthesis, not only because they would serve as typical examples of $M'_2M''C_2$ and $M'_2M''_2C_3$, but also because neither Mo- nor Cr-based single-transition metal MXenes existed to date. Synthesis of the different MXenes followed previously published protocols, and is described in the Methods section.

Example 3: X-Ray Diffraction Data

Figure 6:
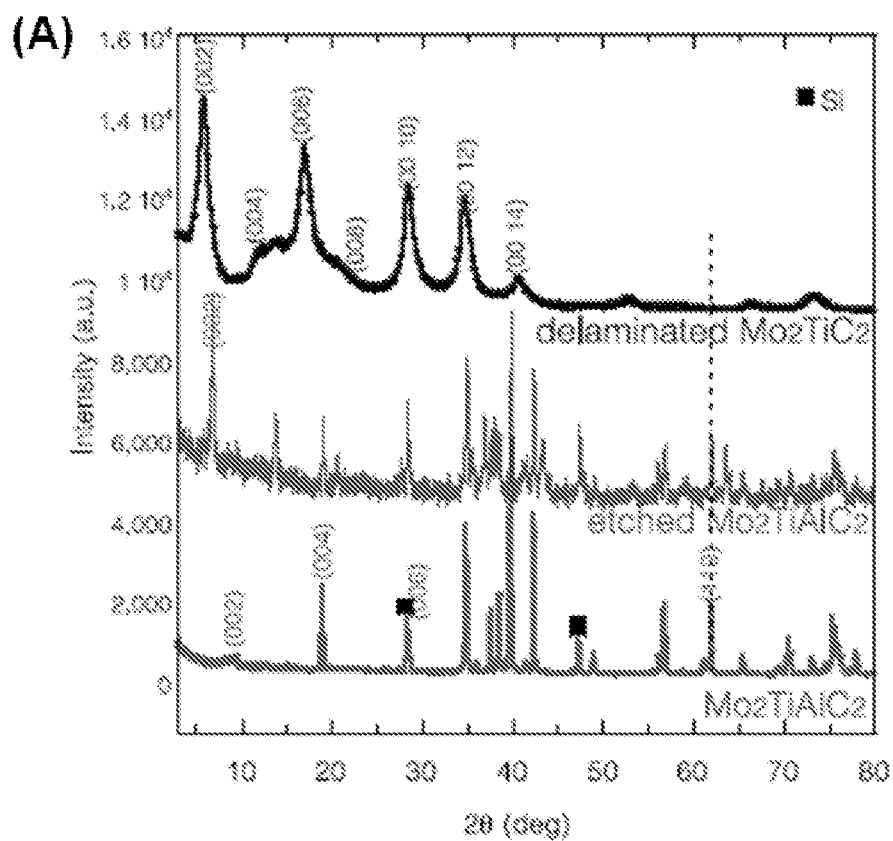
FIG. 6 provides schematics of synthesis and structure of $Mo_2TiC_2$ and $Mo_2Ti_2C_3$. (A) XRD patterns of $Mo_2TiAlC_2$ before (red) and after HF treatment (green) and after delamination (blue). In the delaminated sample, only c-direction peaks, (001) peaks, are visible, corresponding to a c-lattice parameter of 30.44 Å; (110) peak is no longer observed, showing loss of order in non-basal directions. (B) XRD patterns of $Mo_2Ti_2AlC_3$ before (pink), after HF treatment (purple) and after delamination (black). (C),(D), Schematics of $Mo_2TiAlC_2$ to $Mo_2TiC_2T_x$ and $Mo_2Ti_2AlC_3$ to $Mo_2Ti_2C_3T_x$ transformations, respectively; red, green, blue and black circles represent Mo, Ti, Al and C atoms, respectively. (E),(F), SEM images of $Mo_2TiAlC_2$ and $Mo_2TiC_2T_x$, respectively. Note the layers become open after etching in $Mo_2TiC_2T_x$. (G),(H) HRSTEM of $Mo_2TiAlC_2$ and $Mo_2TiC_2T_x$, respectively. Atoms are shown with the same colors as (B). Atomic ordering is confirmed by EDX mapping. No Al was observed in EDX of $Mo_2TiC_2T_x$. (I), Lower magnification TEM image of (F) showing the layered structure throughout the sample. (J),(K), SEM images of $Mo_2Ti_2AlC_3$ and $Mo_2Ti_2C_3T_x$, respectively. HRSTEM images of (L), $Mo_2Ti_2AlC_3$ and (M),(N), $Mo_2Ti_2C_3T_x$, respectively. Atoms are shown with the same colors as (B).
Figure 6:
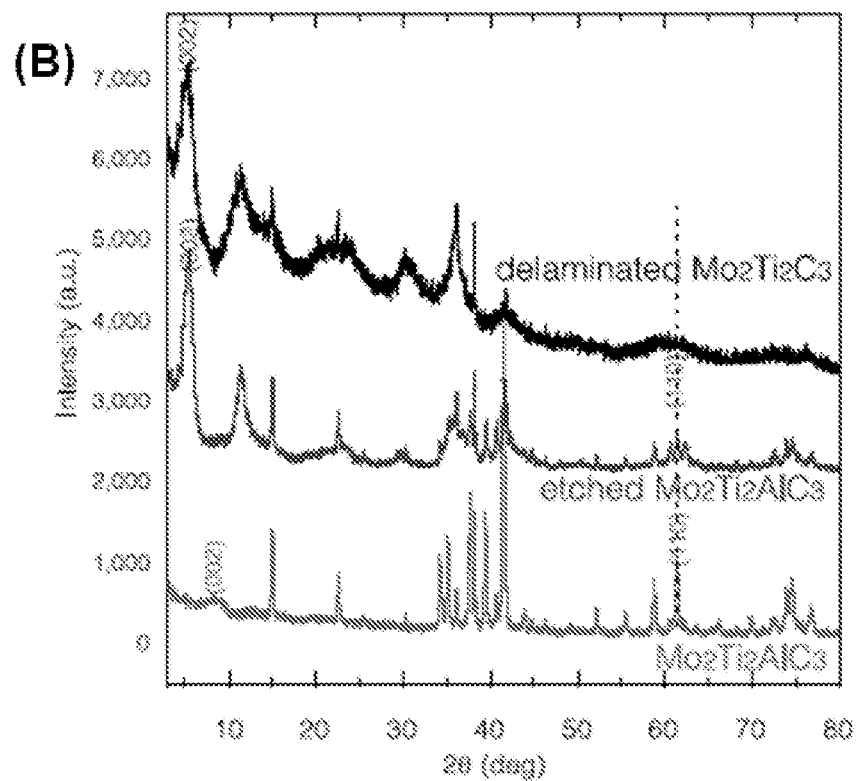
Figure 6:
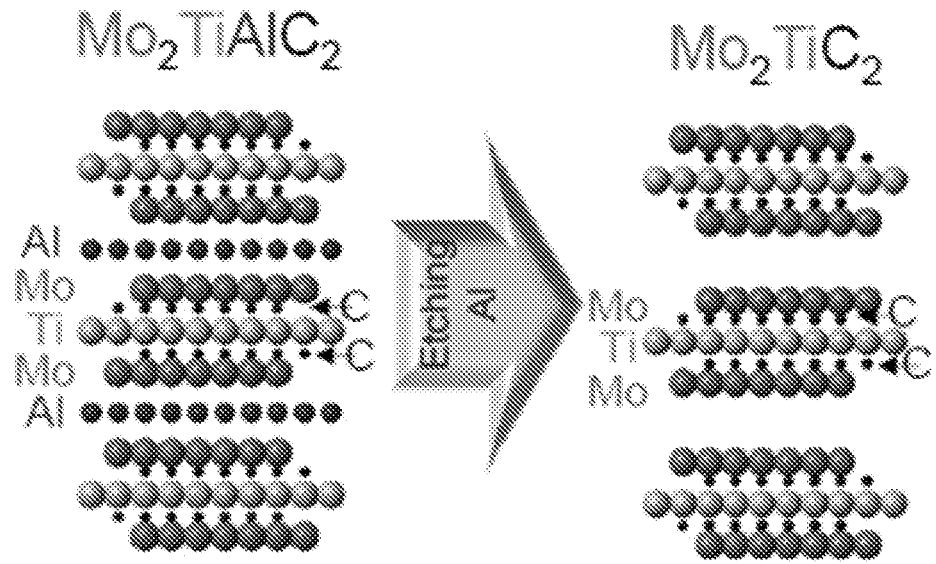
Figure 6:
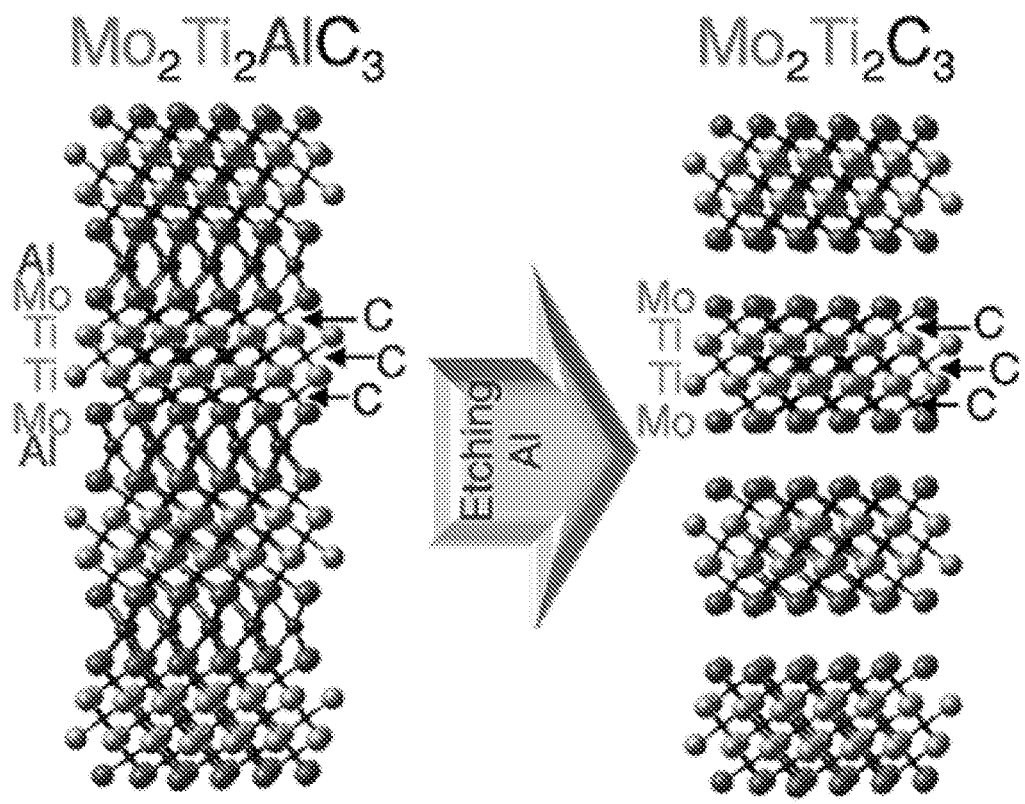
Figure 6:
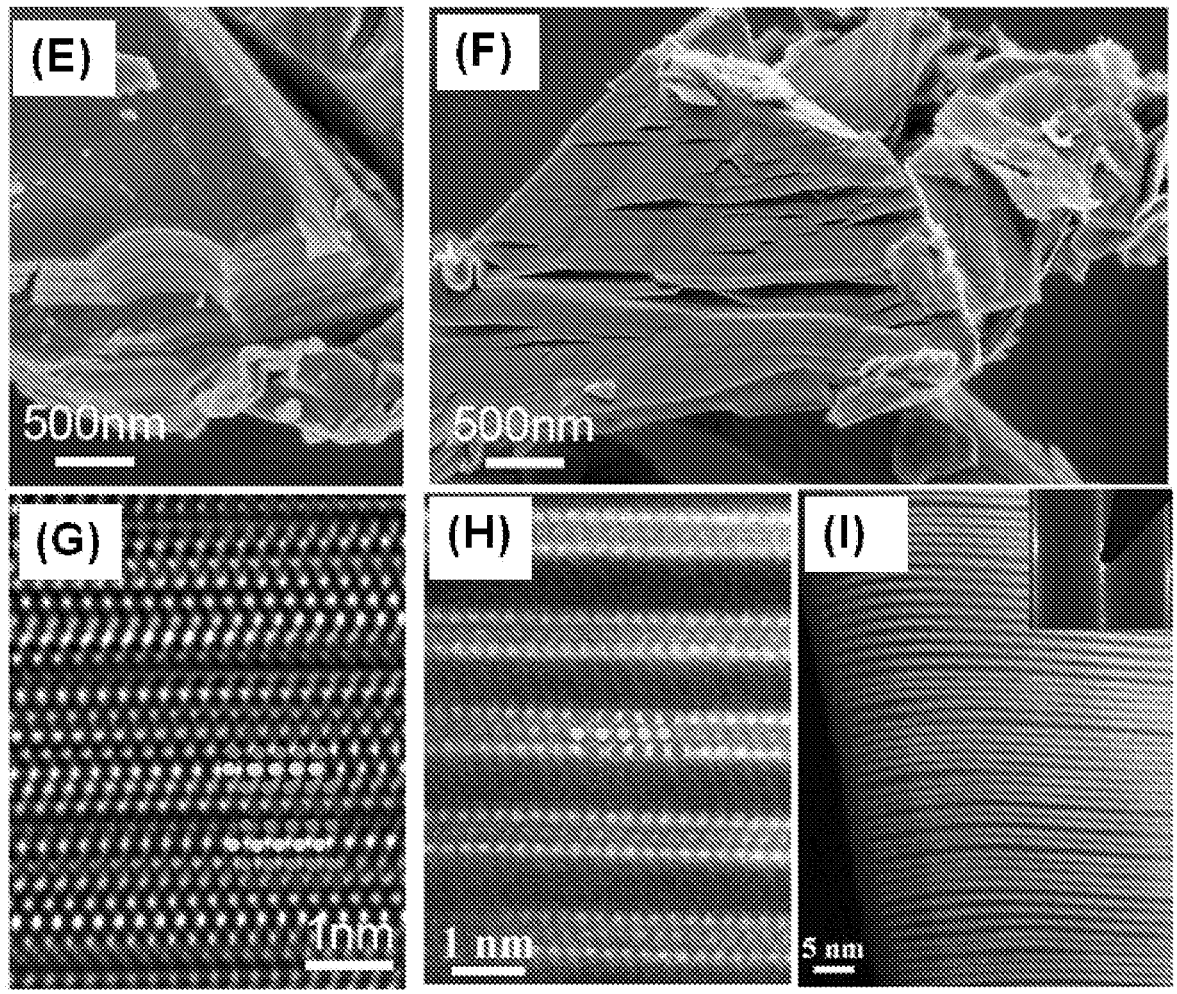
Figure 6:
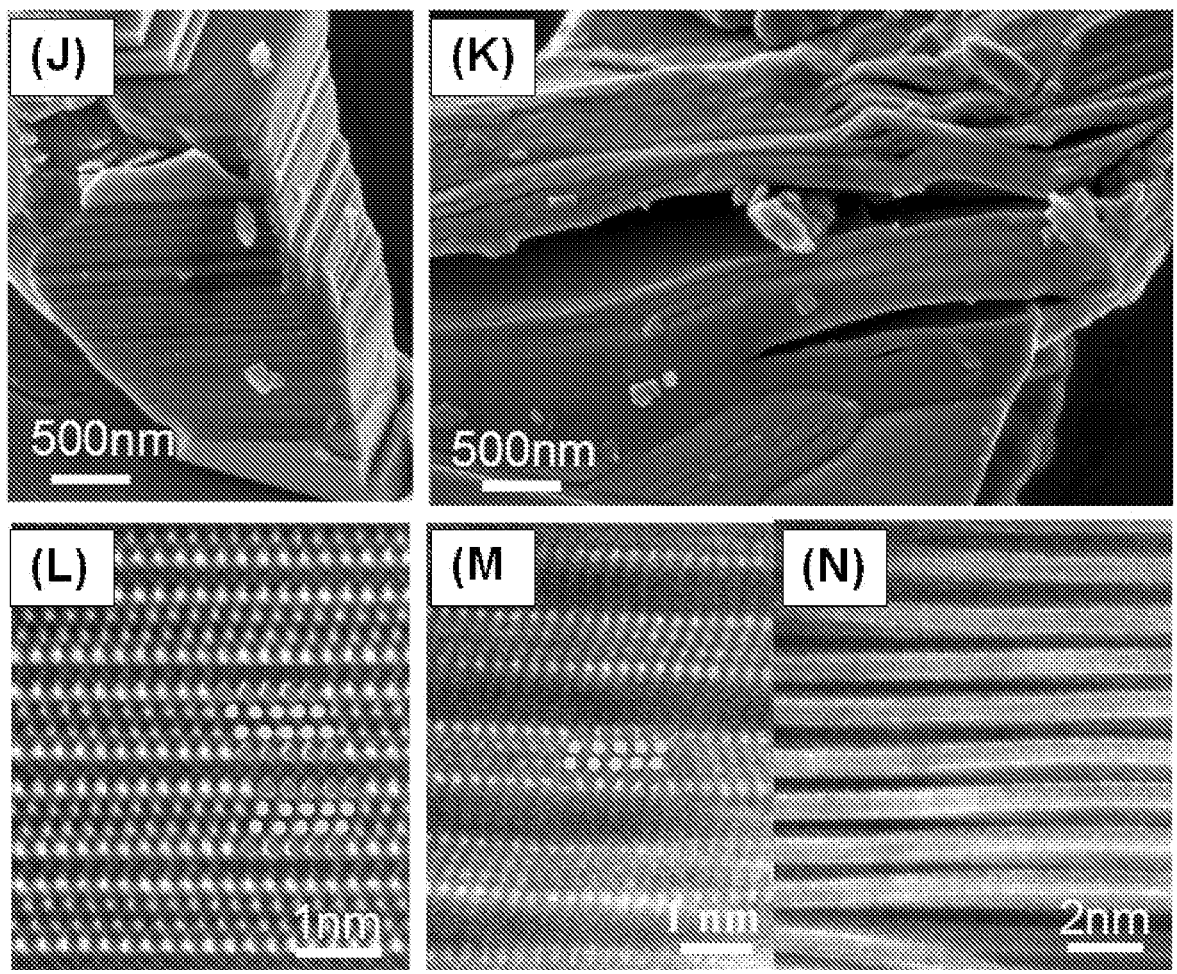

In agreement with the disappearance of the MAX phase peaks in the X-ray diffraction (XRD) patterns (FIGS. 6(A) and (B)), energy dispersive X-ray spectroscopy (EDX) confirmed a significant drop in the Al signals and concomitant increases in the F and O signals, implying that these MXene surfaces, like in all previous work, were terminated with O, OH and F. The MXene yield after etching was close to 100%.

A comparison of the XRD patterns of $Mo_2TiAlC_2$ before (lower red pattern, FIG. 6(A)), and after etching and delamination (middle and top patterns in FIG. 6(A)) clearly showed that all peaks belonging to $Mo_2TiAlC_2$ disappeared and were replaced by (0001) peaks attributed to $Mo_2TiC_2T_x$. The (0001) peaks broaden and downshift to lower angles, which is due to an increase in the c lattice parameter from 18.6 Å in $Mo_2TiAlC_2$ to 25.8 Å and 30.5 Å after etching and delamination, respectively (FIG. 6(A)). The large increases in c-lattice parameters upon etching were due to the presence of intercalated water and, quite possibly, cations between the MXene sheets. These results were consistent with our previous results on $V_2CT_x$, $Nb_2CT_x$ and $Nb_4C_3T_x$, reported previously. The widening of the (0001) peaks was related to a reduction in domain size along [0001] that occurs during the etching process. The further c-LP increase after delamination (compare middle and top patterns in FIG. 6(A)). most probably reflected the presence of additional $H_2O$ layers between the MXene sheets, like in previously reported $Nb_4C_3T_x$.

It is important to note here that the (1120) peak, around 62°, was present after etching (compare green and red in FIG. 6(A)), but disappears after delamination (top blue pattern in FIG. 6(A)). Based on previous work, this indicated that etching alone does not necessarily disrupt the stacking along non-basal directions. The fact that this peak disappeared upon delamination is strong evidence that when the delaminated layers are re-stacked they do so randomly, while still maintaining crystallographic ordered along [0001]. The exact same conclusions can be reached for $Mo_2Ti_2AlC_3$ (FIG. 6(B)). In this case, the c-lattice parameter of the starting $Mo_2Ti_2AlC_3$ powder was about 23.6 Å (bottom pattern in FIG. 6(B)) and increases to 34.6 Å after delamination (top pattern in FIG. 6(B)), with that of the etched sample (middle pattern in FIG. 6(B)) in between.

A schematic of the structure before and after etching of the Al layers together with the ordering of atoms in both phases are shown in FIGS. 6(C) and (D). Scanning electron microscope (SEM) images of the parent MAX phases (FIGS. 6(E) and (J)), and their MXenes (FIGS. 6(F) and (K)) confirmed the 3D to 2D transformation in both materials. So did the HR STEM images of $Mo_2TiAlC_2$ and $Mo_2TiC_2T_x$ shown in FIGS. 6(G) and (H), respectively. In the former, the Mo—Ti layers are interleaved with Al layers; in the latter the Al is absent. The atomic ordering of the Mo and Ti layers was confirmed by EDX mapping. Lower magnification TEM image of a $Mo_2TiC_2T_x$ flake (FIG. 6(I)) clearly showed its layered nature, even after etching. It was this order that gave rise to peaks approximately 62° in the XRD patterns.

A comparison of the HR STEM images of $Mo_2Ti_2AlC_3$ (FIG. 6(L)) and $Mo_2Ti_2C_3T_x$ (FIGS. 6(M) and (N)) again clearly showed the loss of the Al layers after etching. The ordering of Mo and Ti atoms, confirmed by EDX mapping. Not too surprisingly, and in agreement with previous work, after etching, the gaps between the MXene layers along [0001] were no longer as evenly spaced as they were in the parent phase (compare FIGS. 4(G) and (H), or FIGS. 6(L) and (N)). This is the first report on the existence of the $Mo_2Ti_2AlC_3$ MAX phase. See Table 2:

TABLE 2

Summary of EDX scans taken for 40 s at 250x magnification in the SEM. All results were normalized such that the moles of Mo + Ti ratios equal to 3 or 4 depending on whether one or two Ti layers are present. Carbon values are not included in table; $T_x$ represents the surface terminations.

| | Mo | Ti | Al | O | F |
|---|---|---|---|---|---|
| $Mo_2TiC_2Tx$ | 2.1 ± 0.6 | 0.9 ± 0.3 | 0.03 ± 0.03 | 1.9 ± 0.7 | 0.6 ± 0.3 |
| $d-Mo_2TiC_2Tx$ | 2.0 ± 0.1 | 1.0 ± 0.1 | 0 | 2.7 ± 0.1 | 0.3 ± 0.1 |
| $Mo_2Ti_2C_3Tx$ | 2.1 ± 0.2 | 1.9 ± 0.2 | 0.02 ± 0.02 | 2.2 ± 0.2 | 0.8 ± 0.1 |
| $d-Mo_2Ti_2C_3Tx$ | 2.1 ± 0.1 | 1.9 ± 0.1 | 0 | 2.5 ± 0.2 | 0.3 ± 0.2 |
| $Ti_3C_2Tx$ | — | 3 | 0.10 ± 0.05 | 2.0 ± 0.2 | 0.7 ± 0.2 |

TABLE 3

Structures of $Mo_2TiC_2T_x$ and $Mo_2Ti_2C_3T_x$, created by cutting a single slab of atoms from their respective bulk lattices, assuming AA stacking of the layers. For $Mo_2TiC_2$, the Mo, Ti, C atoms are sitting at (2/3, 1/3, z), (0, 0, 1/2), and (1/3, 2/3, z), respectively, whereas for $Mo_2Ti_2C_3$, the Mo, Ti, C1 and C2 atoms are sitting at (0, 0, z), (2/3, 1/3, z), (0, 0,0) and (1/3, 2/3, z), respectively. The space-group is $P6_3/mmc$; the c-lattice parameters for both MXenes were calculated from the location of the (00l) peaks in their respective XRD pattern (see FIG. S1 in Supporting information). The surface termination species O/F are sitting at (0, 0, z). Their relative contents were determined from the EDX measurements listed in Table 2.

| | $Mo_2TiC_2T_x$ | $Mo_2Ti_2C_3T_x$ |
|---|---|---|
| $R_w$ | 0.196 | 0.206 |
| a (Å) | 2.9357 | 2.9598 |
| c (Å) | 36.1 | 45.5 |
| z (Mo) | 0.5719 | 0.5843 |
| z (Ti) | — | 0.5272 |
| z (C) | 0.5414 | 0.5564 |
| z (O/F) | 0.3918 | 0.3736 |
| $U_{iso}$ (Mo) (Å$^2$) | 0.0036 | 0.0028 |
| $U_{iso}$ (Ti) (Å$^2$) | 0.0025 | 0.0016 |
| $U_{iso}$ (C) (Å$^2$) | 0.0039 | 0.0025 |
| $U_{iso}$ (O) (Å$^2$) | 0.0032 | 0.0045 |
| $U_{iso}$ (F) (Å$^2$) | 0.0038 | 0.0023 |
| Diameter (Å) | 49.24 | 56.46 |
| r (Mo—C) (Å) | 2.021 × 3 | 2.129 × 3 |
| r (Ti—C) (Å) | 2.260 × 6 | 2.110 × 3 |
| | — | 2.165 × 3 |
| r (Mo—O/F) (Å) | 2.142 × 3 | 1.916 × 1 |

TABLE 4

Calculated lattice parameters (Å) compared with experiments

| MXene | | a | r(Mo—C) | r(C—Ti) | r(Mo—O/F) |
|---|---|---|---|---|---|
| $Mo_2TiC_2T_x$ | Exp. | 2.935 | 2.022 | 2.259 | 2.142 |
| $Mo_2TiC_2(OH)_2$ | NM | 3.078 | 2.171 | 2.218 | 2.247 |
| | AFM5 | 3.172 | 2.209 | 2.252 | 2.268 |
| $Mo_2TiC_2O_2$ | NM | 3.040 | 2.120 | 2.189 | 2.150 |
| | AFM4 | 3.135 | 2.205 | 2.193 | 2.147 |
| $Mo_2TiC_2F_2$ | NM | 3.039 | 2.161 | 2.210 | 2.254 |
| | AFM5 | 3.198 | 2.178 | 2.223 | 2.272 |
| $Mo_2TiC_2(OH)_{1.5}F_{0.5}$ | NM | 3.063 | 2.138 | 2.219 | 2.226 |
| | AFM2 | 3.099 | 2.196 | 2.221 | 2.250 |
| $Mo_2TiC_2(OH)F$ | NM | 3.061 | 2.116 | 2.192 | 2.224 |
| | AFM6 | 3.150 | 2.182 | 2.219 | 2.237 |
| $Mo_2TiC_2O_{1.5}F_{0.5}$ | NM | 3.067 | 2.156 | 2.220 | 2.156 |
| | AFM7 | 3.166 | 2.218 | 2.228 | 2.119 |
| $Mo_2TiC_2OF$ | NM | 3.039 | 2.183 | 2.181 | 2.230 |
| | AFM5 | 3.076 | 2.221 | 2.199 | 2.218 |
| $Mo_2Ti_2C_3T_x$ | | 2.959 | 2.130 | 2.111 | 1.916 |
| $Mo_2Ti_2C_3(OH)_2$ | NM | 3.091 | 2.158 | 2.121 | 2.212 |
| | AFM7 | 3.151 | 2.184 | 2.177 | 2.274 |
| $Mo_2Ti_2C_3O_2$ | NM | 3.071 | 2.175 | 2.182 | 2.129 |
| | AFM4 | 3.125 | 2.202 | 2.197 | 2.150 |
| $Mo_2Ti_2C_3F_2$ | NM | 3.058 | 2.127 | 2.189 | 2.281 |
| | AFM3 | 3.149 | 2.186 | 2.220 | 2.249 |
| $Mo_2Ti_2C_3(OH)_{1.5}F_{0.5}$ | NM | 3.081 | 2.140 | 2.183 | 2.242 |
| | AFM6 | 3.105 | 2.144 | 2.195 | 2.259 |
| $Mo_2Ti_2C_3(OH)F$ | NM | 3.083 | 2.103 | 2.157 | 2.189 |
| | AFM2 | 3.104 | 2.130 | 2.157 | 2.222 |
| $Mo_2Ti_2C_3O_{1.5}F_{0.5}$ | NM | 3.085 | 2.083 | 2.139 | 2.158 |
| | AFM7 | 3.113 | 2.091 | 2.157 | 2.137 |
| $Mo_2Ti_2C_3OF$ | NM | 3.079 | 2.099 | 2.138 | 2.134 |
| | AFM2 | 3.125 | 2.113 | 2.167 | 2.136 |

When $Cr_2TiAlC_2$ powders were etched in 6M HCl with 5 molar equivalent of LiF, for 42 h at 55° C., a characteristic MXene peak emerged (FIG. 1(A)), presumed to be that of $Cr_2TiC_2T_x$. The c-lattice parameter is 24.3 Å. However, in contrast to $Mo_2TiC_2T_x$ (FIGS. 6(A)), it was not possible to achieve 100% yield and completely rid the etched powders of the parent MAX phase in the initial experiments. The same was true of $Mo_2Ti_2AlC_3$ (FIGS. 6(B)). Consequently, the electrochemical work focused on the $Mo_2TiC_2T_x$ powder that was the most pure of the three.

Figure 7:
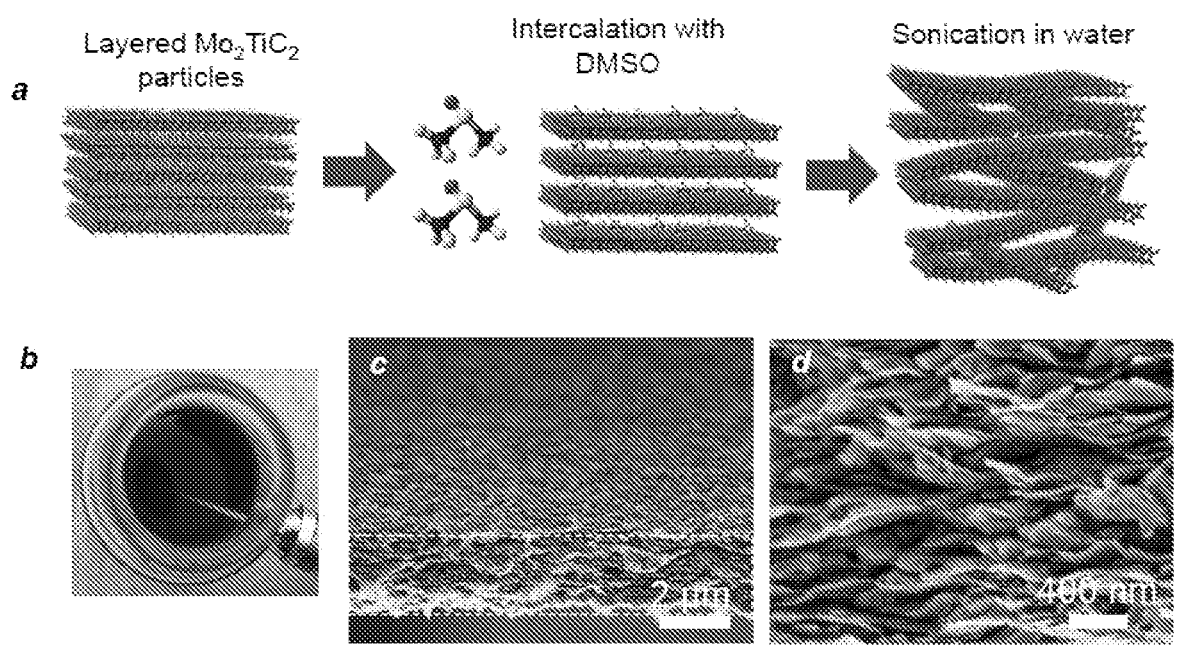
FIG. 7 shows schematic of delamination of $Mo_2TiC_2T_x$. (A) Schematic showing delamination process used to produce single or few-layered $Mo_2TiC_2$ sheets. (B) Photograph shows the Tyndall effect on a stable colloidal solution of $Mo_2TiC_2T_x$ in water. Low (C) and high (D) magnification cross-sectional SEM image of freestanding $Mo_2TiC_2T_x$ 'paper' fabricated by filtration of a stable colloidal solution; dotted lines in (c) show the film's cross section.

Example 4: Electrochemical Studies $Mo_2TiC_2T_x$ was delaminated by first intercalating dimethyl sulfoxide (DMSO) between the layers, followed by sonication in water, as shown schematically in FIG. 7(A). After delamination, the MXene was dispersed in water resulting in a stable colloidal solution (FIG. 7(B)), which was used to form freestanding conductive $Mo_2TiC_2T_x$ 'paper' (FIG. 7(C)) by vacuum filtration. SEM images (FIGS. 7(C, D)) showed that the MXene flakes are well aligned, but not too tightly packed.

Figure 8:
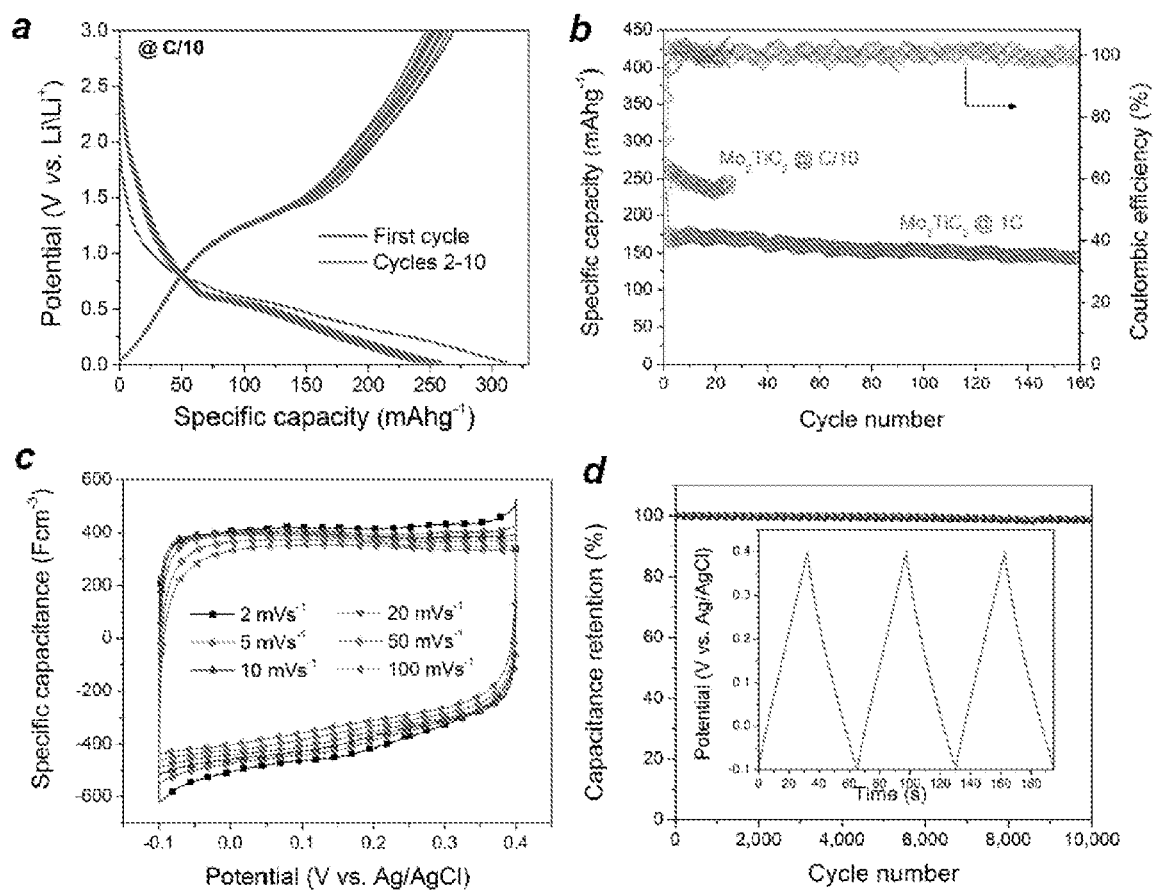
FIG. 8 provides electrochemical performance data of $Mo_2TiC_2T_x$ in LIB and supercapacitor. (A) Voltage profiles between 0.02 and 3 V vs. Li/Li+ at C/10 rate for the first 10 cycles. (B), Specific lithiation (squares) and dilithiation (circles) capacities versus cycle number at 1 C and C/10 rates. Right axis in panel (B) shows the Columbic efficacies for cells tested at these rates. (C), Cyclic voltammograms, at different scan rates, for a freestanding electrode in 1 M $H_2SO_4$. (D), Capacitance retention test of $Mo_2TiC_2T_x$ 'paper' in 1 M $H_2SO_4$. Inset shows galvanostatic cycling data collected at 1 A/g.

Since $Ti_3C_2T_x$, $Ti_2CT_x$ and other MXene have previously shown promising performance in energy storage devices, $Mo_2TiC_2T_x$ 'paper' was tested as electrodes for Li-ion batteries (LIBs) and supercapacitors using cyclic voltammetry (CV) and galvanostatic charge-discharge cycling (GV). To prove that the Mo-layers were at the surface and dictated the surface properties, the electrochemical properties of $Mo_2TiC_2T_x$ were compared to those of $Ti_3C_2T_x$. The CV curves (FIG. 8(C)) showed that much of the lithiation happened at voltages less than about 0.6 V vs. Li/Li+. However, although, there is a broad peak at ~1.3 V during charging, dilithiation continues up to a voltage of 3 V. A crucial and important distinction between previous and current results was the fact that here 85% of the total capacity was below 1 V compared to <66% for $Nb_2CT_x$. The discharge profile for a sample tested at a rate of C/10 (FIG. 8(A)) showed a clear voltage plateau starting at about 0.6 V, consistent with the appearance a discharge peak in the CVs (FIG. 8). The first cycle discharge and charge capacities—at C/10—were about 311 $mAhg^{-1}$ and 269 $mAhg^{-1}$, respectively, which translated to a Coulombic efficiency of 86%. The reason for this initial irreversible capacity was to be studied. After a few cycles, however, the Coulombic efficiency approached 100% (FIG. 8(B)). The first cycle irreversible capacities reported here (14% at C/10 and 27% at 1 C) are significantly lower than 45-60% reported for other MXenes. FIG. 7(C) shows the specific capacity and Coulombic efficiency of $Mo_2TiC_2T_x$ electrodes tested at 1 C and C/10 rates for 160 and 25 cycles respectively. At 1 C, the Mo2TiC2Tx electrode showed a stable capacity of about 176 mAhg-1 at the second cycle and retains about 82% of this capacity after 160 cycles. For the electrode tested at a rate of C/10, about 92% of the capacity of 260 mAhg-1 was retained after 25 cycles. At both rates, Coulombic efficiencies higher than 97% were observed after the first cycle.

The CV tests, performed at a scan rate of 0.2 mVs-1 in a potential range of 0.02 and 3 V vs Li/Li+. (FIG. 9(A)) show that much of the lithiation happens at voltages less than ~0.6 V vs. Li/Li+. However, although, there is a broad peak at ~1.3 V during charging, dilithiation continues up to a voltage of 3 V. The discharge profile for a sample tested at a rate of 1 C (FIG. 9(B)) shows a clear voltage plateau starting at about 0.6 V, consistent with the appearance a discharge peak in the CVs. A crucial and important distinction between previously studied MXene and $Mo_2TiC_2T$ is the fact that here 85% of the total capacity is below 1 V. In comparison, $Nb_2C$ showed less than 66% of reversible capacity below 1 V and this number was about 50% for $V_2C$, $Ti_3C_2$ and $Ti_2C$ MXenes. Another difference, as mentioned in main text of this paper, is the first cycle irreversible capacities reported here (27% at 1 C rate) are significantly lower that those reported for other MXenes that ranged between 45-60%.

Figure 9:
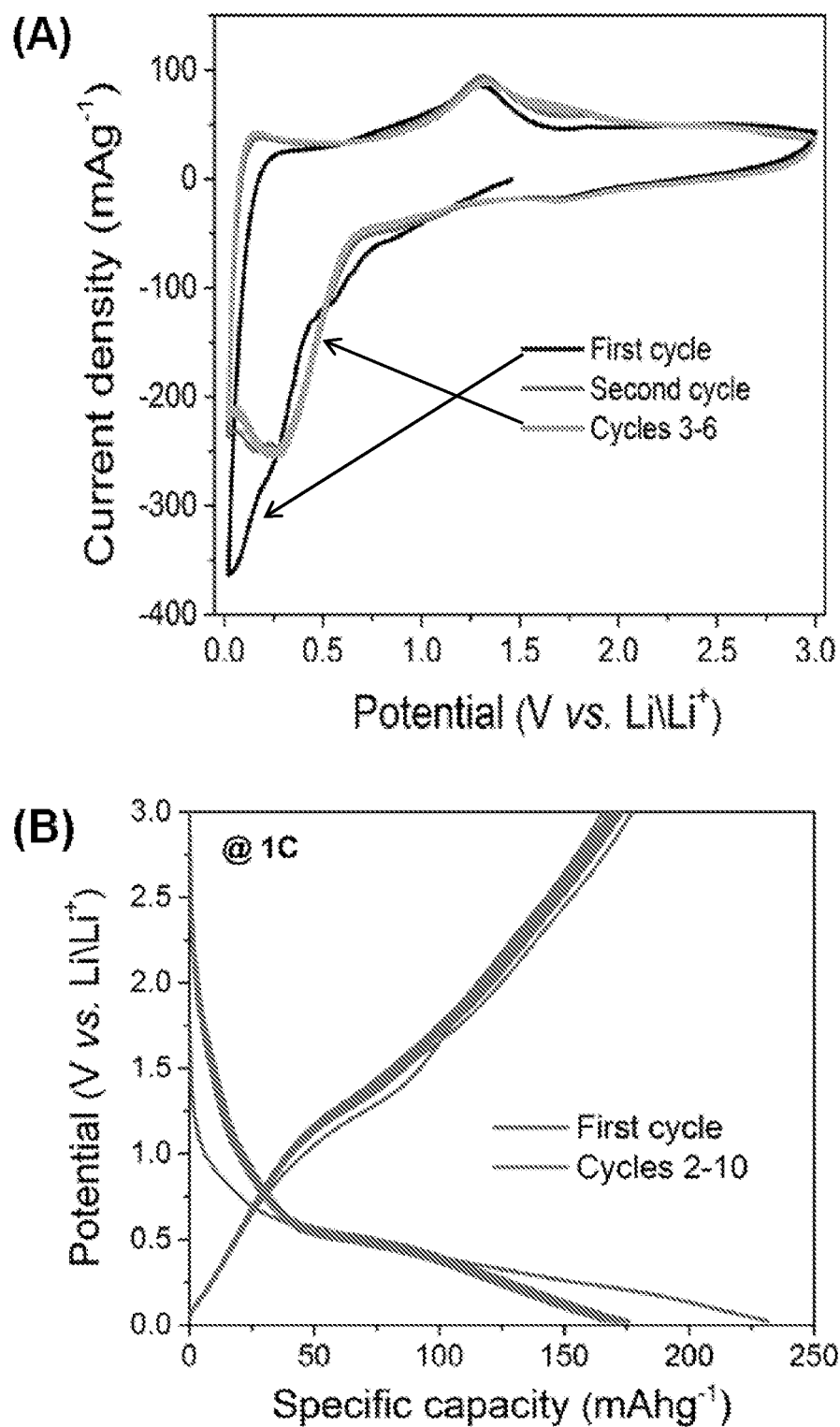
FIG. 9 shows results for electrochemical performance of $Mo_2TiC_2T_x$ as electrodes in LIB. (A) Cyclic voltammogram (CV) curve of multilayered $Mo_2TiC_2T_x$ at a scan rate of 0.2 $mVs^{-1}$ in a potential range of 0.02 and 3 V vs Li/Li+. (B) Voltage profiles at the same potential range at a rate of 1 C. (C) Specific volumetric capacitance at various scan rates for $Mo_2TiC_2T_x$ paper 3 m (squares) and 12 m thick (circles); (D) Nyquist plot for the 3 m thick electrode. Inset shows EIS data at high frequencies
Figure 9:
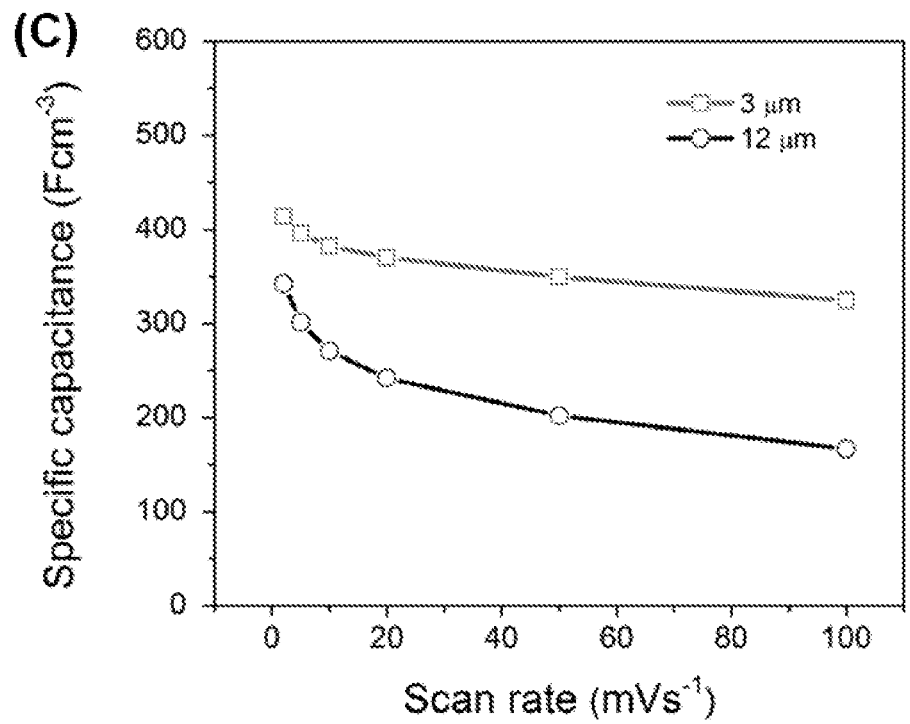
Figure 9:
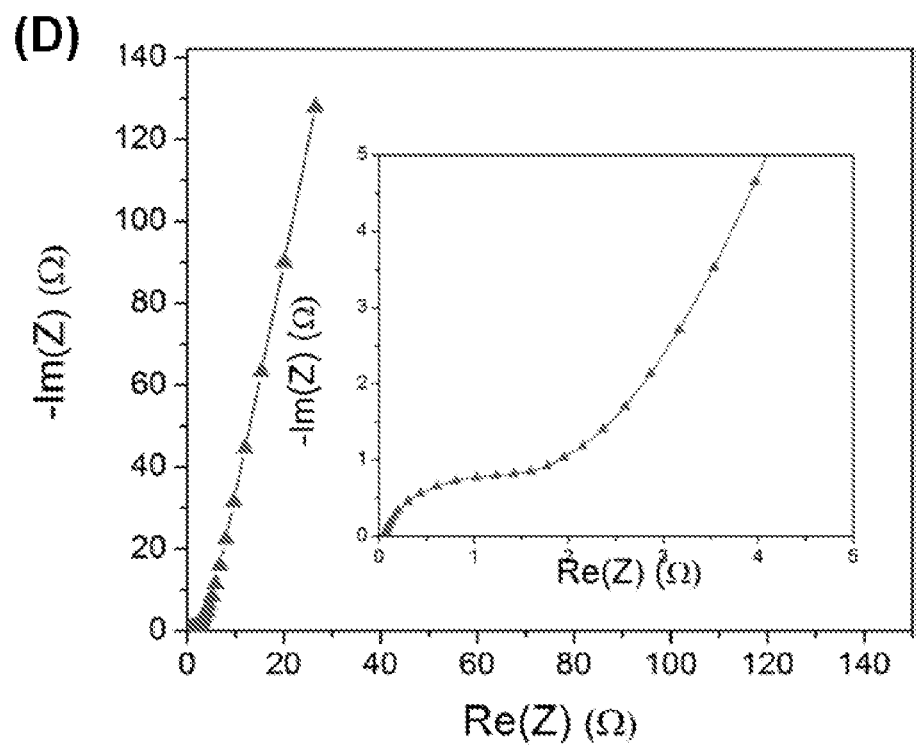

The CV curves (FIG. 9(A)) recorded at potentials between −0.1 to 0.4 V, showed near rectangular shapes confirming excellent capacitive performance of $Mo_2TiC_2T_x$ papers. The specific volumetric capacitances at various scan rates were calculated from the discharge portions of the corresponding CV curves and are shown in FIG. 9(C). For an electrode with a thickness of 3 m and at a scan rate of 2 $mVs^{-1}$, the volumetric capacitance was calculated to be about 412 F $cm^{-3}$. About 72% of this capacitance was retained at scan rates as high as 100 $mVs^{-1}$. When the thickness of the electrode was increased by four times to 12 m, the specific capacitance at 2 $mVs^{-1}$ scan rate dropped only by 17% to about 342 F $cm^{-3}$, demonstrating the promise of $Mo_2TiC_2T_x$ 'paper' electrode for device fabrication. Electrochemical impedance spectroscopy (EIS) tests show a near ideal behavior of the electrodes at low frequencies with an almost vertical slope of the Nyquist plots (FIG. 9(D)). EIS results also show the excellent conductivity of $Mo_2TiC_2T_x$ paper electrode with equivalent series resistance (ESR) of about 0.03Ω, measured from the X-intercept of the Nyquist plot in FIG. 9(D).

The behavior of $Mo_2TiC_2T_x$ was quite different from that of $Ti_3C_2T_x$, despite the fact that the two compounds have similar structures and differ only in that, in one case, the surface Ti layers are replaced by Mo. It follows that the difference can be directly attributed to the Mo atoms being in contact with the electrolyte. Said otherwise, it was reasonable to assume that the Ti atoms did not play a major role in the electrochemical behavior of $Mo_2TiC_2T_x$. For all intents and purposes, the latter acted as a pure Mo-based MXene.

Calculations of the formation energies of various $M_3C_2$ and $M_4C_3$ MXenes, from their elements (Table 5) indicated that pure Mo-based MXenes were highly unstable and are thus unlikely to be synthesized. Note these results did not mean that Mo—C bonds are unstable—after all, binary Mo-carbides are quite stable—but rather that the Mo and C atoms avoid, at all costs, to stack in a face centered cubic (FCC) arrangement characteristic of the $M_{n+1}X_n$ layers. DFT calculations had shown that hexagonal molybdenum carbides were more stable than their rock salt counterparts. By avoiding each other, the Mo layers were separated by an element that thrives in the FCC arrangement with C, viz. Ti. Consistent with this notion was that most binary Mo-carbide phases are hexagonal. The same notion explained why the Cr atoms (see below) also prefer the outside of the $Mn^{+1}C_n$ blocks. We note in passing, that it has already been shown that $Cr_2TiAlC_2$ and $(Cr_{0.5},V_{0.5})_{n+1}AlC_n$ for n=2 and 3, are at least partially ordered. This conclusion bolstered the importance of starting with ordered MAX phases in enlarging the number of MXene chemistries even further.

TABLE 5

Formation energies (eV/atom) from their elements of select $M_3C_2$ and $M_4C_3$ unterminated MXenes.

| Un-terminated MXenes | Formation energy (eV/atom) Transition metal (M) | | | | | |
|---|---|---|---|---|---|---|
| | Ti | V | Nb | Ta | Cr | Mo |
| $M_3C_2$ | −0.365 | −0.254 | 0.039 | −0.017 | 0.012 | 0.328 |
| $M_4C_3$ | −0.594 | −0.582 | −0.259 | −0.236 | −0.092 | 0.258 |

To shed light on why $Mo_2TiC_2T_x$ and $Ti_3C_2T_x$ behave differently, we compared Li adsorption on OH- and O-terminated $Mo_2TiC_2T_x$, $Ti_3C_2T_x$ and $Mo_3C_2T_x$. The calculated Li adsorption energies are listed in Table 6 from which it was obvious that Li would rather adsorb onto the O terminations rather than the OH-terminations. Not too surprisingly, and confirming that the Mo-outer layers dominate the surface properties, the adsorption energies for $Mo_2TiC_2T_x$ and $Mo_3C_2T_x$ surfaces were comparable and lower than those for $Ti_3C_2T_x$.

TABLE 6

Calculated Li adsorption energies (eV/atom) of
OH— and O—terminated $Mo_2TiC_2$, $Mo_3C_2$ and $Ti_3C_2$.
Note similarity between the two Mo-containing MXenes.

| Surface termination | Li adsorption energy (eV/atom) MXene composition | | |
|---|---|---|---|
| | $Mo_2TiC_2$ | $MO_3C_2$ | $Ti_3C_2$ |
| OH | 0.07 | 0.03 | 0.17 |
| O | −1.63 | −1.68 | −1.40 |

It has previously been shown that OH-terminated MXene surfaces can be converted to O-terminations by a reaction with Li during the first lithiation cycle resulting in $M_{n+1}X_nO_2$ MXenes and releasing $H_2$ gas. If it was assumed, for the sake of simplicity, that the same reaction occurred here, such that the surfaces were O-terminated, the following lithiation reaction could have been envisioned:

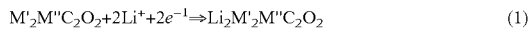
$$M'_2M''C_2O_2 + 2Li^+ + 2e^- \Rightarrow Li_2M'_2M''C_2O_2 \quad (1)$$

Assuming Eq. 1 is applicable the theoretical capacities for $Li_2Mo_2TiC_2O_2$, $Li_2Mo_3C_2O_2$ and $Li_2Ti_3C_2O_2$, were respectively, 181, 156 and 268 mAhg-1. A further reaction,

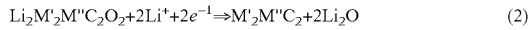
$$Li_2M'_2M''C_2O_2 + 2Li^+ + 2e^- \Rightarrow M'_2M''C_2 + 2Li_2O \quad (2)$$

was also possible. The enthalpy changes for Eq. 2 were −0.74 and −0.87 and +0.54 eV/formula unit for $Mo_2TiC_2O_2$ and $Mo_3C_2O_2$ and $Ti_3C_2O_2$, respectively. Thus reaction 2 may well explain why: i) a voltage plateau is obtained in the Mo-case and, ii) the voltage profiles of $Ti_3C_2T_x$ are different from $Mo_2TiC_2T_2$. With the extra Li ions, the theoretical Li capacity of $Mo_2TiC_2O_2$ increases to 356 mAhg$^{-1}$. The latter value assumes that only one Li layer intercalates between the MXene sheets. If more than one layer can intercalate, the theoretical capacity could be significantly higher (e.g., doubled, in a double-layer of Li is formed between the MXene sheets).

Figure 10:
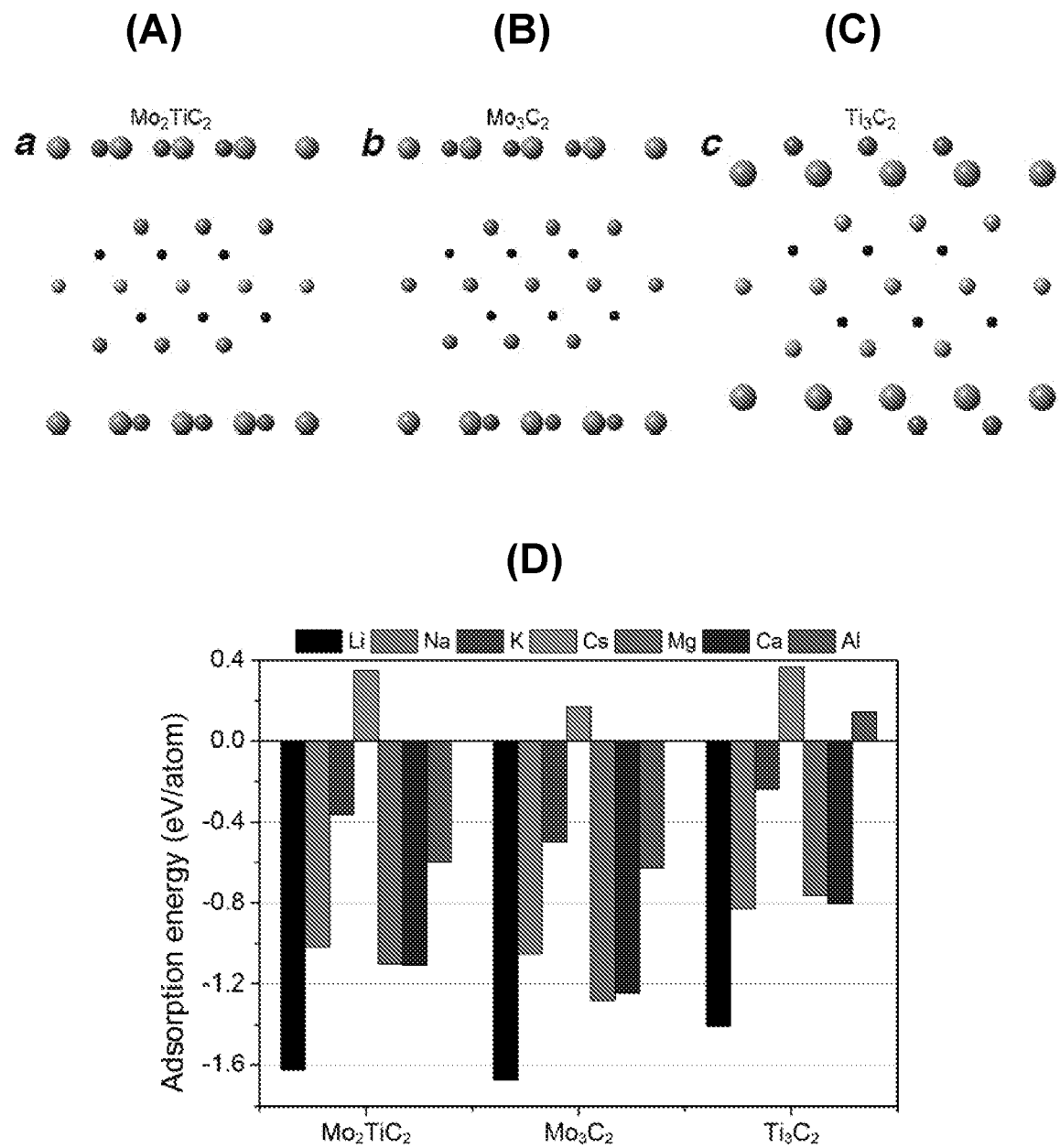
FIG. 10 shows lithium adsorption on F-terminated MXenes. LiF-like structure were observed immediately in Mo-based MXenes, (A), $Mo_2TiC_2$, (B), $Mo_3C_2$, (C), $Ti_3C_2$. Adsorption energies (eV/atom) of metal ions on: (D), O-terminated, (E), OH-terminated, (F), terminated $Ti_3C_2$, $Mo_3C_2$, and $Mo_2TiC_2$. F groups are more reactive than O terminations. Fluorides like compounds are formed spontaneously during the simulations on Mo surface. Heat of formation (eV/formula) for conversion reaction on: (G), O-terminated, (F), F-terminated $Ti_3C_2$, $Mo_3C_2$, and $Mo_2TiC_2$.
Figure 10:
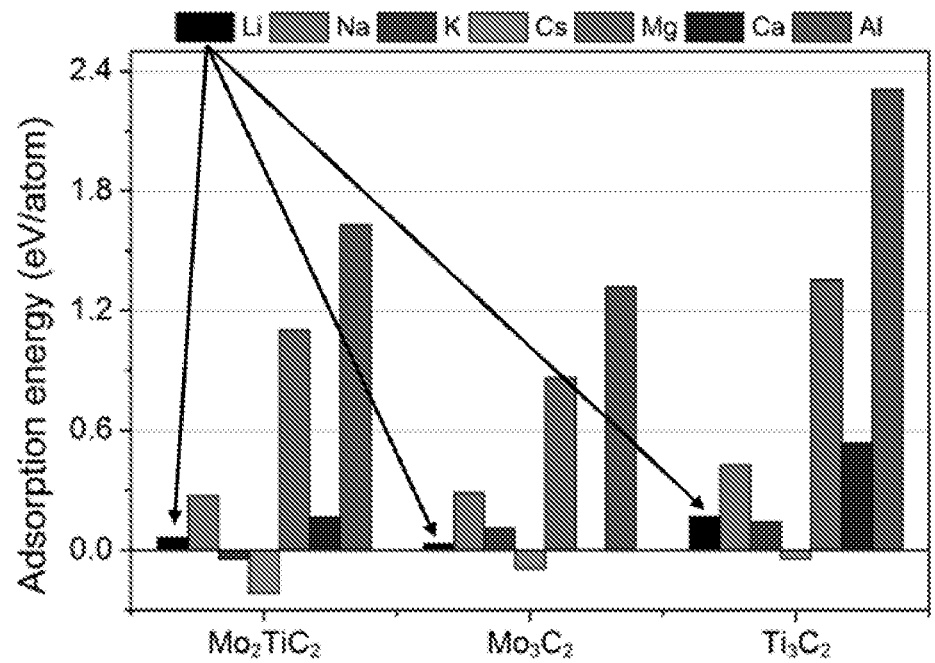
Figure 10:
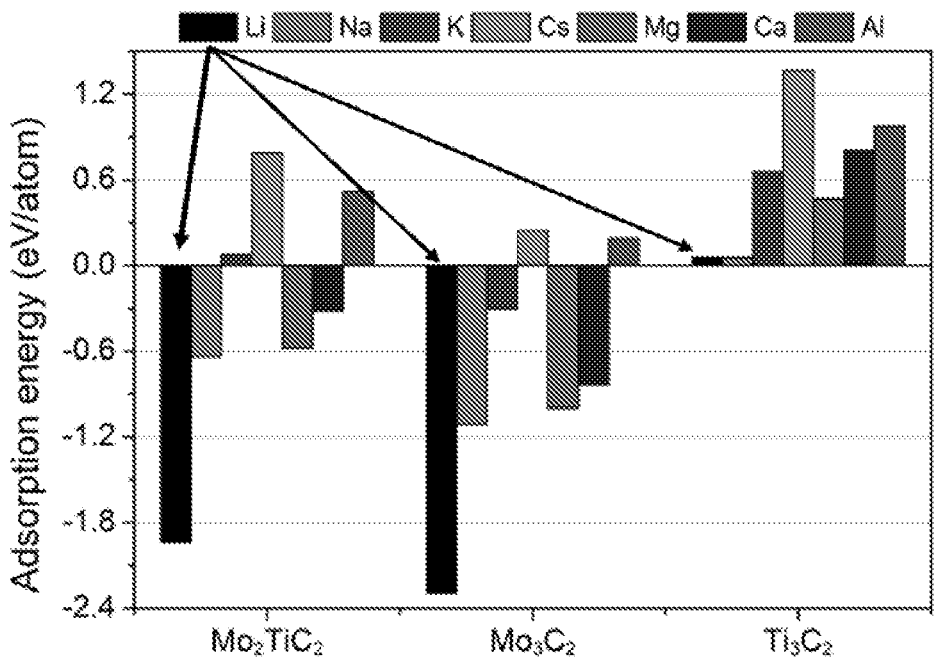
Figure 10:
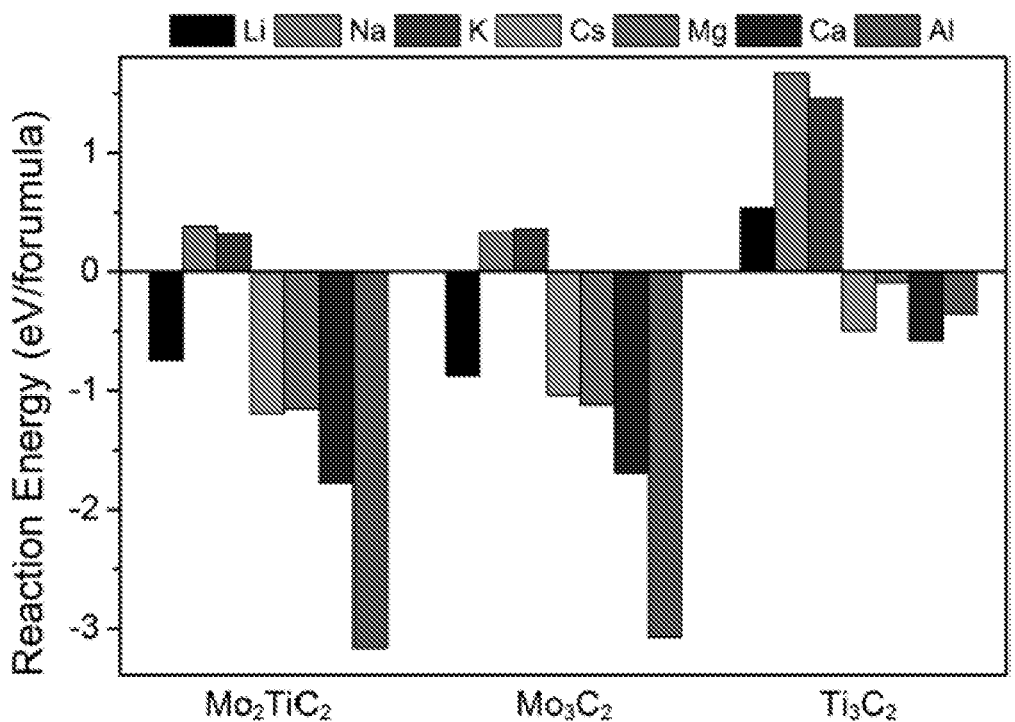
Figure 10:
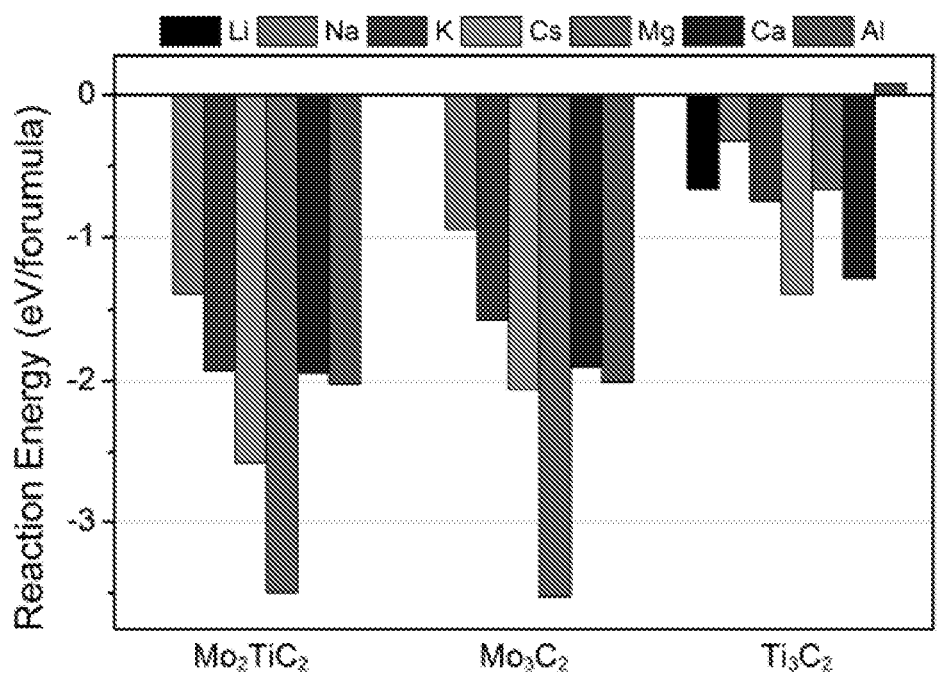

Like other MXenes, adsorption is not limited to $Li^+$. The adsorption of $Na^+$, $K^+$, $Cs^+$, $Mg^{2+}$, $Ca^{2+}$ and $Al^{3+}$ ions on $Mo_2TiC_2O_2$ surfaces was also computationally investigated. Like $Li^+$, $Mo_2TiC_2O_2$ can adsorb two metal ions per formula except for $Cs^+$ (FIG. 10). Similar reactions are predicted for $Mg^{2+}$, $Ca^{2+}$, and $Al^{3+}$, suggesting the $Mo_2TiC_2O_2$, like several other MXenes, can be used for various metal-ion batteries and electrochemical capacitors. Because $Ti_3C_2T_x$ has shown exceptional capacitance in aqueous electrolytes, the capacitive behavior of $Mo_2TiC_2T_x$ was also tested. Initially electrodes—fabricated using multilayered $Mo_2TiC_2$ in 1 M $H_2SO_4$— yielded capacities of the order of 5-6 $Fg^{-1}$. This implied that the electrolyte and/or cations were only present between the $M'_2M''C_2$ multilayers shown in FIG. 6(F), but could not penetrate between individual layers. To test this hypothesis, $Mo_2TiC_2T_x$ 'paper'—was fabricated and tested following the procedure outlined in FIG. 7(A)—as a supercapacitor electrode in 1 M $H_2SO_4$. At potentials between −0.1 to 0.4 V, the CV curves obtained (FIG. 8(C)) were more rectangular compared to those previously reported for $Ti_3C_2T_x$. The working potential window also shifted by about 0.2 V to more positive potentials. The charge was expected to be stored by intercalation of cations and possibly redox contributions from changes in the oxidation states of the Mo atoms, similar to $MoO_3$. At a scan rate of 2 mVs-1, the volumetric capacitance was calculated to be 412 $Fcm^{-3}$ (FIG. 10) and 72% of this capacitance was retained at 100 $mVs^{-1}$. Galvanostatic charge-discharge tests at a current density of 1 $Ag^{-1}$ show almost no degradation in performance after 10,000 cycles (FIG. 8(D)).

One of the main problems associated with delaminated MXene flakes is their tendency to re-stack so tightly that ions and/or electrolyte penetrate the space between the re-stacked flakes with difficulty. One solution to this problem is to add spacers to the delaminated solution to keep the flakes separated that in turn resulted in a considerable enhancement in capacities and drop-offs at higher rates. While Mo is heavier than Ti and a lower gravimetric capacitance is expected, this difference in atomic weights should not significantly affect the volumetric capacitance. There is no reason to believe that the values reported in this work cannot be further improved. Based on the DFT calculations, the following ordered, double-transition metal carbides should be stable at 0 K: $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$ and $V_2Ti_2C_3$. In this notation, the first M' element sandwiches the second M'' element. Based on the DFT calculations, we identified two general trends for the stabilities of these ordered MXenes. The first is that M-elements whose binary carbides do not crystallize in the rock salt structure, like Mo and Cr, avoid the center layers. The opposite is true for Nb and Ta; they prefer the middle layers. However, those do not imply that they are all realizable because:

i) the calculations were carried out at 0 K and do not take entropy into account. It is presumably entropy that results in less than perfect ordering in $Cr_2TiAlC_2$ and $V_2TiAlC_2$.

ii) It is not known if all 20 Al-based parent MAX phases are stable. The stability of MAX phases is a complicated function of the set of competing phases.

iii) The fact that the ordered compounds are stable does not imply that they can survive the etching process. Such is the case for $Cr_2AlC$, where all attempts in convert into a Cr-containing MXene have failed. The fact that we were able to synthesize $Cr_2TiC_xT_x$ here is thus noteworthy.

iv) The relative stabilities of these compounds and their ordering could also shift when surface terminations are taken into account.

These comments notwithstanding, it is reasonable to assume that the more stable the ordered phases, relative to their competition, the more likely they are to be realizable. To prove this concept $Mo_2TiC_2T_x$, $Mo_2Ti_2C_3T_x$ and $Cr_2TiC_xT_x$ were synthesized and showed that the electrochemical response of $Mo_2TiC_2T_x$ was significantly different from $Ti_3C_2T_x$. Thus, numerous new 2D structures with different carbides in outer and inner layers and various surface terminations are possible, greatly expanding the family of 2D materials.

Example 5: Transport Properties

Because their 2D nature results in low-quality conventional X-ray diffraction (XRD) patterns and rules out single crystal crystallography, X-ray atomic pair distribution function (PDF) analysis was used to determine the structure and positions of the M atoms in $Mo_2TiC_2T_x$ and $Mo_2Ti_2C_3T_x$. Then their transport properties were measured in the 10 to 300 K temperature range in the presence and absence of an external magnetic field. Supporting DFT calculations were carried out to compare the electronic properties of these double-M MXenes with their mono-M element $Ti_3C_2T_x$ counterpart and showed that although the latter is metallic, the new Mo-containing ones are not.

Example 5.1. Synthesis Delaminated d-$Mo_2TiC_2$ and d-$Mo_2Ti_2C_3$ $Mo_2TiC_3T_x$ or $Mo_2Ti_2C_3T_x$ powders were prepared according to methods described in Example 1.2.

To delaminate these powders, about 1 g of the $Mo_2TiC_3T_x$ or $Mo_2Ti_2C_3T_x$ filtered powders was mixed with 10 ml of tetrabutylammonium hydroxide (TBAOH) and stirred for 4 h at room temperature. The resulting colloidal suspension was centrifuged to separate the intercalated powder from the liquid. After decanting the supernatant, about 50 ml of deionized water was added to the residue, centrifuged and the supernatant was again decanted in this case to remove any residual TBAOH. After that, 100 ml of deionized water was added to the residue and the mixture was sonicated for 1 h, before centrifuging it for another hour at 5000 rpm. Lastly, the supernatant containing single- or few-layer MXene flakes was passed through filtered using a Celgard membrane resulting in films that were dried under vacuum at RT.

Example 5.2. Electronic Properties Measurement

DC transport measurements were performed in a Quantum Design Physical Property Measurement System (PPMS), equipped with an external Keithley current source and a nanovoltmeter. Two types of samples were characterized: i) Multilayer samples, in which the MXene powders were uniaxially pressed to 1 GPa to make thin discs<0.5 mm thick and ii) d-MXene films that were made by filtration and were strong enough for their resistivity to be measured directly.

A four-point probe geometry—with silver paint used to make electrical contacts—was used for the transport properties. Magnetic field dependent magnetoresistance (MR) on the multilayer $Mo_2TiC_2T_x$ and multilayer $Ti_3C_2T_x$ disks was measured with magnetic fields of up to +5 T applied out-of-the-plane of the samples.

DC transport measurements were performed to elucidate the effect of Mo introduction on the electronic properties. FIG. 11(A) shows the resistivity as a function of temperature measured on $Ti_3C_2T_x$ and the Mo-containing MXenes. The resistivities of the d-$Mo_2TiC_2T_x$ and d-$Mo_2Ti_2C_3T_x$ samples are lower than those of the multilayer samples, but the delaminated Mo-containing MXenes are almost one order of magnitude more resistive than the multilayer $Ti_3C_2T_x$.

In order to better reveal the difference between the Mo-containing MXenes and $Ti_3C_2T_x$, the resistivity values of a multilayered $Mo_2TiC_2T_x$ (red on left) and a multilayered $Ti_3C_2T_x$ (black on right) are plotted in FIG. 11(B). The overall resistivity between the two samples differs by roughly one order of magnitude and both samples exhibit a change in the behavior near 250 K, which is probably related to water and ions present between the MXene layers and will be discussed elsewhere. Notably, the behavior of $Ti_3C_2T_x$ from 130-250 K is metallic ($d\rho/dT>0$), in contrast to $Mo_2TiC_2T_x$, in which the resistivity increases with decreasing temperature ($d\rho/dT<0$) over the measured range of 10-250 K. At temperatures below ~130 K, the resistivity of $Ti_3C_2$ increases with decreasing temperature.

Figure 11:
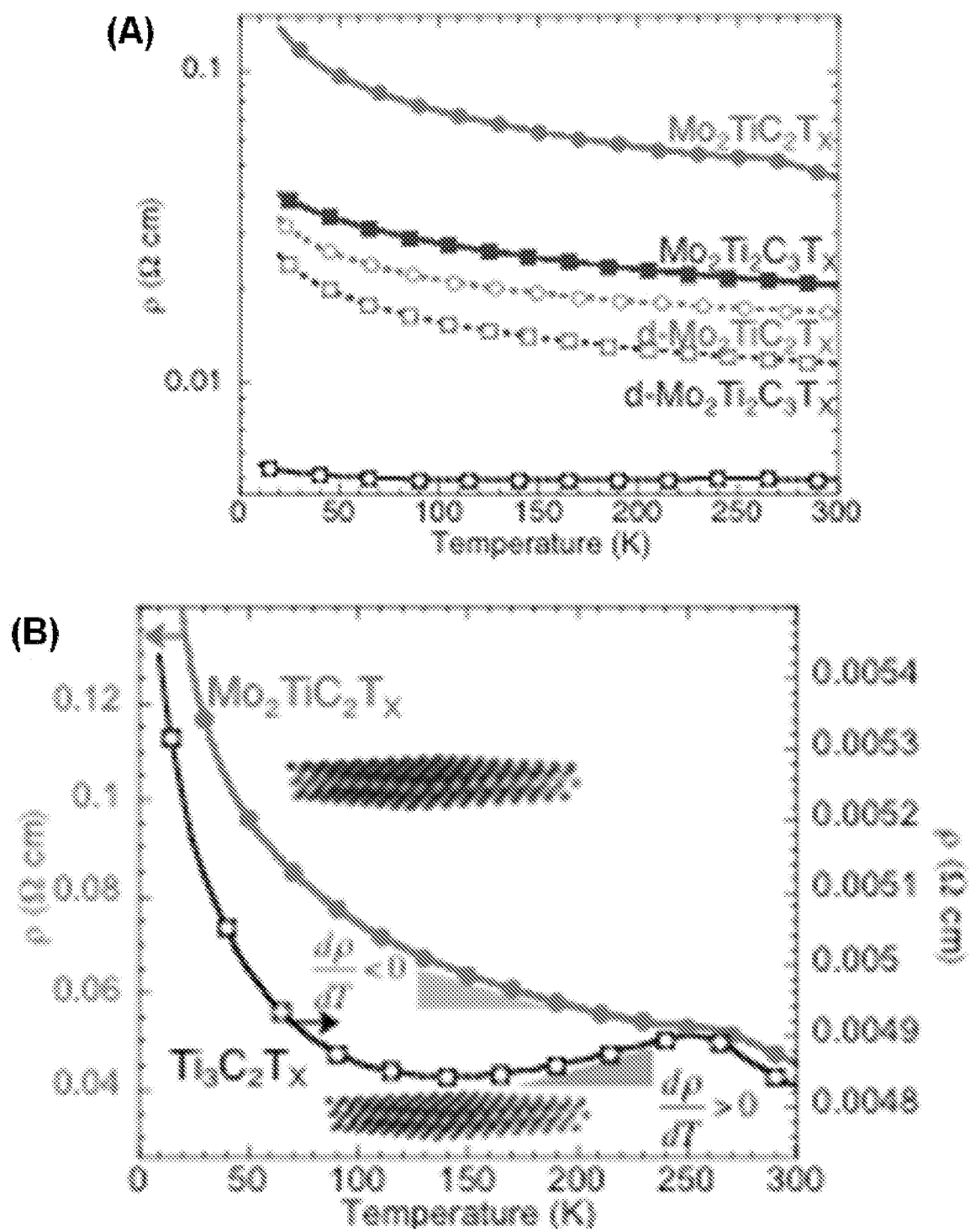
FIG. 11 shows transport properties (A) Temperature dependence of resistivity for a $Mo_2TiC_2T_x$ (red circles), $Mo_2Ti_2C_3T_x$ (blue squares), and $Ti_3C_2T_x$ (bottom black hexagons). The dashed lines represent delaminated films and the solid lines those of pressed multilayered powders. (B) Comparison of $Mo_2TiC_2T_x$ (left) and $Ti_3C_2T_x$ (right) resistivity results. The shaded triangles below each resistivity curve illustrate the difference of dρ/dT. (C) Corresponding magnetic field dependent magnetoresistance taken at 10 K.
Figure 11:
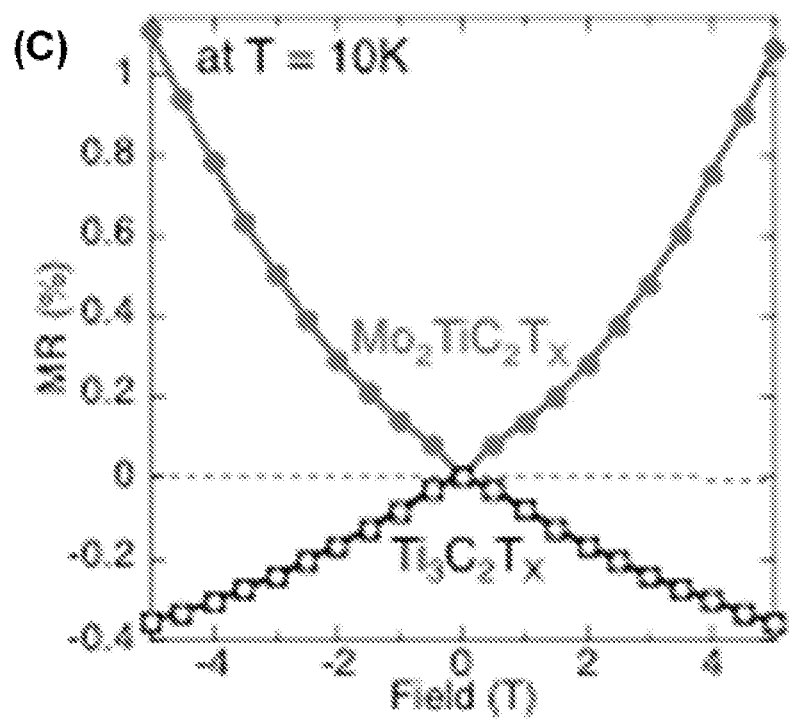

The $Mo_2TiC_2T_x$ results shown in FIG. 11(B) cannot be well fit an Arrhenius model describing simple semiconductor behavior or to variable range hopping models, as shown in FIG. S3 in Supporting Information. Said otherwise, there could be other explanations, such as interflake hopping processes for example, for the modest increases in resistivities with decreasing temperatures apparent in FIG. 11. Clearly more work is needed before more definite conclusions can be drawn. This comment notwithstanding, it is clear that when Mo carbide layers are sandwiching the titanium carbide layers in the Mo-based MXenes the resistance increases monotonically with decreasing temperature, whereas in the absence of Mo, the resistance, at least initially decreases with decreasing temperature (FIG. 11).

The temperature dependent resistivity were fit to the equation, $\rho=\rho_0 \exp(T_0/T)^{1/m}$, where $\rho_0$ is a prefactor. Best fits were achieved with a power-law model, $\rho=AT^P$, where A and p are constants ($R^2=0.999$ over the temperature range 20 to 100 K).

Since both MXenes have increasing resistivity at temperatures below 130 K, we measured their MR at 10 K to check if the mechanisms of the processes governing this behavior are the same. The MR measured in the two materials is opposite in sign, suggesting fundamentally different transport mechanisms in $Ti_3C_2T_x$ and $Mo_2TiC_2T_x$. The MR data, taken at 10 K in the regime where both samples exhibit $d\rho/dT<0$, are shown in FIG. 11(C). We define MR (%)=$(R_H-R_0)\times100/R_0$, where $R_H$ and $R_0$ are the 5 T and zero-field resistivity, respectively. In agreement with FIG. 3c, a negative MR was previously reported for $Ti_3C_2T_x$ within its $d\rho/dT<0$ regime and was attributed to weak localization. However, the presence of positive MR and a negative $d\rho/dT$ at all temperatures for $Mo_2TiC_2$ suggests a different transport mechanism is dominant in this Mo containing MXene than in $Ti_3C_2T_x$.

Example 5.3. Spin Density Calculations

Figure 12:
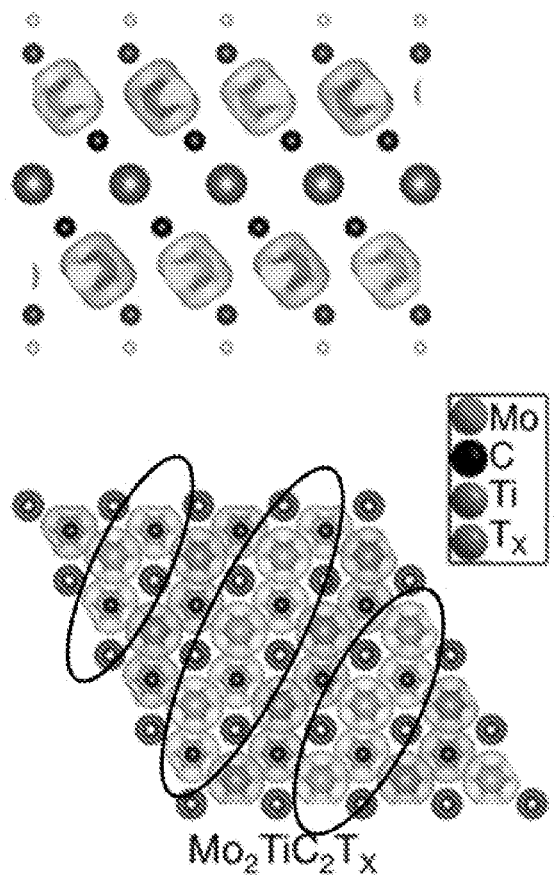
FIG. 12 shows spin density maps of Mo-MXenes. Top and side views of calculated spatial spin density distributions (up-down) of, (A) $Mo_2TiC_2(OH)_2$ and, (B) $Mo_2Ti_2C_2(OH)_2$ compositions. Yellow (circled)—spin up; blue (uncircled)—spin down. (C) Top (left) and side (right) views of $Mo_2TiC_2O_x$. Mo atoms in the upper layer.
Figure 12:
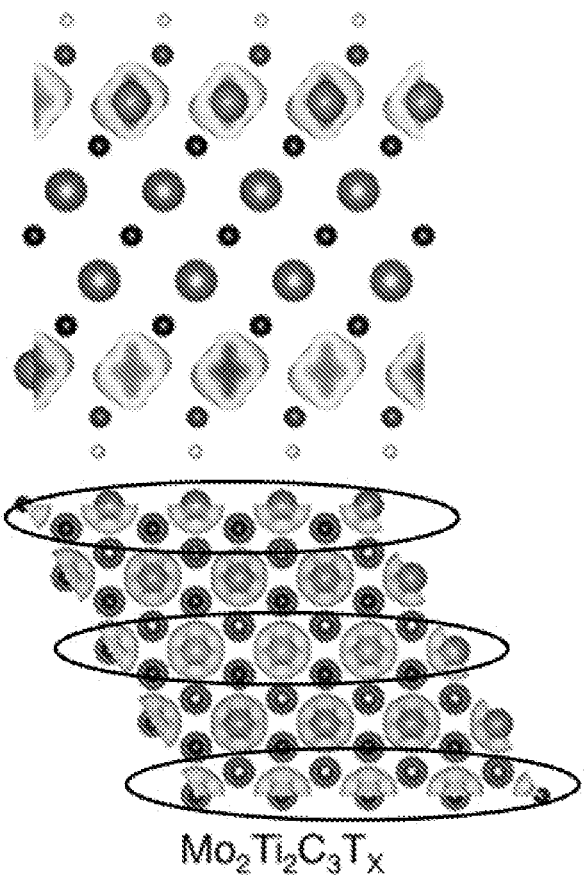
Figure 12:
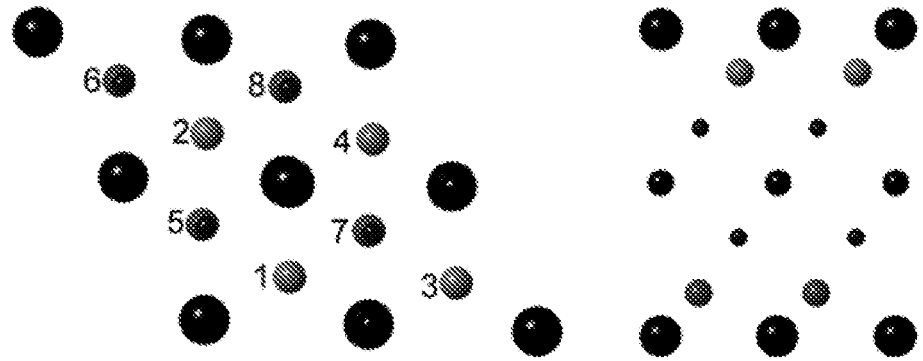

To gain more insight into the magnetic properties, the spatial spin electron density distributions for $Mo_2TiC_2(OH)_2$ and $Mo_2Ti_2C_2(OH)_2$ were computed. The results clearly showed that the unpaired spin concentrated on the Mo atoms, implying the magnetism of Mo-materials originated from unpaired Mo-3d orbitals. For single terminations, the spin-up and spin-down density was distributed equally. See, e.g., FIG. 12 and Tables 7 and 8.

TABLE 7

Considered magnetic orderings.

| Type | 1 | 2 | 3 | 4 | 5 | 6 | 7 | 8 |
|------|---|---|---|---|---|---|---|---|
| NM   | 0 | 0 | 0 | 0 | 0 | 0 | 0 | 0 |
| FM   | + | + | + | + | + | + | + | + |
| AFM1 | + | + | + | + | − | − | − | − |
| AFM2 | + | + | − | − | + | + | − | − |
| AFM3 | + | + | − | − | − | − | + | + |
| AFM4 | + | − | − | + | + | − | − | + |
| AFM5 | + | − | − | + | − | + | + | − |
| AFM6 | + | − | + | − | + | − | + | − |
| AFM7 | + | − | + | − | − | + | − | + |

+, spin up;
−, spin down.

TABLE 8

Calculated total energies (eV/f.u.) of Mo-MXenes with different magnetic ordering. The lowest total energy of each MXene is listed in bold (reference to NM state).

| | NM | FM | AFM1 | AFM2 | AFM3 | AFM4 | AFM5 | AFM6 | AFM7 |
|---|---|---|---|---|---|---|---|---|---|
| $Mo_2TiC_2(OH)_2$ | 0.000 | −0.384 | −0.461 | −0.673 | −0.567 | −0.444 | −0.677 | −0.673 | −0.567 |
| $Mo_2TiC_2O_2$ | 0.000 | −0.186 | −0.196 | −0.387 | −0.386 | −0.395 | −0.385 | −0.385 | −0.306 |
| $Mo_2TiC_2F_2$ | 0.000 | −0.342 | −0.535 | −0.521 | −0.401 | −0.402 | −0.583 | −0.521 | −0.402 |
| $Mo_2TiC_2(OH)_{1.5}F_{0.5}$ | 0.000 | −0.044 | −0.092 | −0.184 | −0.178 | −0.168 | −0.146 | −0.167 | −0.173 |
| $Mo_2TiC_2(OH)F$ | 0.000 | −0.095 | −0.347 | −0.410 | −0.304 | −0.334 | −0.410 | −0.419 | −0.304 |
| $Mo_2TiC_2O_{1.5}F_{0.5}$ | 0.000 | −0.368 | −0.245 | −0.560 | −0.560 | −0.560 | −0.552 | −0.560 | −0.568 |
| $Mo_2TiC_2OF$ | 0.000 | −0.161 | −0.389 | −0.366 | −0.235 | −0.389 | −0.416 | −0.366 | −0.412 |
| $Mo_2Ti_2C_3(OH)_2$ | 0.000 | 0.070 | 0.117 | −0.239 | −0.237 | −0.235 | −0.258 | −0.248 | −0.312 |
| $Mo_2Ti_2C_3O_2$ | 0.000 | −0.201 | −0.223 | −0.451 | −0.450 | −0.462 | −0.449 | −0.451 | −0.450 |
| $Mo_2Ti_2C_3F_2$ | 0.000 | −0.962 | −1.036 | −1.189 | −1.223 | −1.185 | −1.213 | −1.185 | −1.219 |
| $Mo_2Ti_2C_3(OH)_{1.5}F_{0.5}$ | 0.000 | −0.051 | −0.182 | −0.151 | −0.179 | −0.181 | −0.173 | −0.193 | −0.179 |
| $Mo_2Ti_2C_3(OH)F$ | 0.000 | −0.242 | −0.105 | −0.267 | −0.250 | −0.216 | −0.213 | −0.252 | −0.254 |
| $Mo_2Ti_2C_3O_{1.5}F_{0.5}$ | 0.000 | −0.117 | −0.082 | −0.121 | −0.119 | −0.083 | −0.120 | −0.119 | −0.129 |
| $Mo_2Ti_2C_3OF$ | 0.000 | −0.130 | 0.321 | −0.148 | −0.137 | 0.008 | 0.011 | 0.006 | 0.006 |

Although the mixed terminations also show overall AFM, the individual density of spin-up and spin-down was different. This should relate to the mixed Mo—O/F bonds. Calculations show that —OH and —F terminated $Mo_2M''_nX_{n+1}$, materials are both semiconductor, while OH-termination has a smaller band-gap ~0.05 eV. In contrast, O-terminated $Mo_2M''_nX_{n+1}$, materials show metallic behavior. Moreover, from EDX analysis, the surfaces of $Mo_2M''_nX_{n+1}$, materials should be terminated by both F and O/OH. Thus, the magnetic ordering and electronic structure of $Mo_2M''_nX_{n+1}$, materials with mixed terminations were examined. $Mo_2M''_nX_{n+1}$, materials with mixed terminations show semiconducting behavior, except for $Mo_2TiC_2$ at high —O concentrations. This suggested that the synthesized $Mo_2M''_nX_{n+1}$, materials could be intrinsic semiconductors.

As those skilled in the art will appreciate, numerous modifications and variations of the present disclosure are possible in light of these teachings, and all such are contemplated hereby. For example, in addition to the embodiments described herein, the present disclosure contemplates and claims those disclosures resulting from the combination of features of the disclosure cited herein and those of the cited prior art references which complement the features of the present disclosure. Similarly, it will be appreciated that any described material, feature, or article may be used in combination with any other material, feature, or article, and such combinations are considered within the scope of this disclosure.

The disclosures of each patent, patent application, and publication cited or described in this document are hereby incorporated herein by reference, in their entirety.

What is claimed:

1. A crystalline composition comprising at least one layer having first and second surfaces, each layer comprising:
   a substantially two-dimensional array of crystal cells,
   each crystal cell having an empirical formula of $M'_2M''_nX_{n+1}$, such that each X is positioned within an octahedral array of M' and M'';
   wherein M' and M'' each comprise different Group IIIB, IVB, VB, or VIB metals;
   each X is C, N, or a combination thereof;
   n=1 or 2; and wherein
   the M' atoms are substantially present as two-dimensional outer arrays of atoms within the two-dimensional array of crystal cells;
   the M'' atoms are substantially present as two-dimensional inner arrays of atoms within the two-dimensional array of crystal cells; and
   the two-dimensional inner arrays of M'' atoms are sandwiched between the two-dimensional outer arrays of M' atoms within the two-dimensional array of crystal cells.

2. The crystalline composition of claim 1, wherein n is 1 and M' is Sc, Cr, Hf, Mo, Ti, V, Zr, or a combination of two or more thereof.

3. The crystalline composition of claim 1, wherein M'' is Nb, Ta, Ti, V, Zr, Hf, or Sc, or a combination of two or more thereof.

4. The crystalline composition of claim 1, wherein n is 2, M' is Mo, Ti, V, Cr, Zr, Hf, Sc, or a combination of two or more thereof, and M'' is Nb, Sc, Ta, Ti, V, of a combination of two or more thereof.

5. The crystalline composition of claim 1, wherein $M'_2M''_nX_{n+1}$ comprises $Mo_2TiC_2$, $Mo_2VC_2$, $Mo_2TaC_2$, $Mo_2NbC_2$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$.

6. The crystalline composition of claim 1, wherein $M'_2M''_nX_{n+1}$ comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$.

7. The crystalline composition of claim 1, wherein $M'_2M''_nX_{n+1}$ comprises $Nb_2VC_2$, $Ta_2TiC_2$, $Ta_2VC_2$, or $Nb_2TiC_2$.

8. The crystalline composition of claim 1, wherein at least one of said surfaces of each layer has surface terminations bonded to the outer arrays of atoms, the surface terminations comprising alkoxide, carboxylate, halide, hydroxide, hydride, oxide, sub-oxide, nitride, sub-nitride, sulfide, thiol, or a combination thereof.

9. The crystalline composition of claim 1, wherein the $M'_2M''_nX_{n+1}$ is in a ordered state, such that:
   (a) the two-dimensional outer arrays of atoms contain 90 atom % or more M' atoms and 10 atom % or less of M'' atoms;
   (b) the two-dimensional inner arrays of atoms contain 90 atom % or more M'' atoms and 10 atom % or less of M' atoms;
   within the two-dimensional array of crystal cells.

10. The crystalline composition of claim 1, wherein X is C.

11. The crystalline composition of claim 1, wherein the composition comprises an electrically conductive or semiconductive surface.

12. The crystalline composition of claim 1, wherein the composition exhibits a negative resistivity rate, dρ/dT at all temperatures in a range of from 0 K to 300 K, where ρ is resistivity in Ω-cm and T is a Kelvin temperature.

13. The crystalline composition of claim 1, wherein the composition exhibits a positive magnetoresistance (MR) response to a non-zero magnetic field from −5 Tesla to +5 Tesla.

14. A stacked assembly of at least two crystalline layers having first and second surfaces, each layer comprising:
   a substantially two-dimensional array of crystal cells,
   each crystal cell having an empirical formula of $M'_2M''_nX_{n+1}$, such that each X is positioned within an octahedral array of M' and M";
   wherein M' and M" each comprise different Group IIIB, IVB, VB, or VIB metals;
   each X is C, N, or a combination thereof;
   n=1 or 2; and wherein
   the M' atoms are substantially present as two-dimensional outer arrays of atoms within the two-dimensional array of crystal cells;
   the M" atoms are substantially present as two-dimensional inner arrays of atoms within the two-dimensional array of crystal cells; and
   the two-dimensional inner arrays of M" atoms are sandwiched between the two-dimensional outer arrays of M' atoms within the two-dimensional array of crystal cells; and
   wherein the layers are characterized as having an average surface area and interlayer distance.

15. The stacked assembly of claim 14, wherein M' is Sc, Zr, Hf, Nb, Ti, V, Cr, Mo, or a combination of two or more thereof.

16. The stacked assembly of claim 14, wherein M" is Zr, Hf, Sc, Ti, V, Nb, Ta, or a combination two or more thereof.

17. The composition of claim 14, wherein n is 2, M' is Mo, Ti, V, of a combination of two or more thereof, and M" is Cr, Nb, Ta, Ti, or V, of a combination of two or more thereof.

18. The stacked assembly of claim 14, wherein $M'_2M''_nX_{n+1}$, comprises $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$.

19. The stacked assembly of claim 14, wherein $M'_2M''_nX_{n+1}$, comprises $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$.

20. The stacked assembly of claim 12, wherein $M'_2M''_nX_{n+1}$, comprises $Nb_2VC_2$, $Ta_2TiC_2$, $Ta_2VC_2$, or $Nb_2TiC_2$.

21. The stacked assembly of claim 14, wherein at least one of said surfaces of each layer has surface terminations bonded to the outer arrays of atoms, the surface terminations comprising alkoxide, carboxylate, halide, hydroxide, hydride, oxide, sub-oxide, nitride, sub-nitride, sulfide, thiol, of a combination of two or more thereof.

22. The stacked assembly of claim 14, wherein the $M'_2M''_nX_{n+1}$ is in a ordered state, such that:
   (a) the two-dimensional outer arrays of atoms contain 90 atom % or more M' atoms and 10 atom % or less of M" atoms;
   (b) the two-dimensional inner arrays of atoms contain 90 atom % or more M" atoms and 10 atom % or less of M' atoms;
   within the two-dimensional array of crystal cells.

23. The stacked assembly of claim 14, wherein X is C.

24. The stacked assembly of claim 14, wherein the composition comprises an electrically conductive or semiconductive surface.

25. The stacked assembly of claim 14, wherein the composition exhibits a negative resistivity rate, dρ/dT at all temperatures in a range of from 0 K to 300 K, where ρ is resistivity in Ω-cm and T is a Kelvin temperature.

26. The stacked assembly of claim 14, wherein the composition exhibits a positive magnetoresistance (MR) response to a non-zero magnetic field from −5 Tesla to +5 Tesla.

27. The stacked assembly of claim 14, wherein the average area of the layers is in the range of about 100 nm$^2$ to about 10,000 nm$^2$ or about 100 μm$^2$ to about 10,000 μm$^2$.

28. The stacked assembly of claim 14, said assembly resulting from the deposition of delaminated flakes of the composition of claim 1 onto a surface.

29. The stacked assembly of claim 14, wherein lithium, sodium, potassium, and/or magnesium, atoms, ions, or both atoms and ions are intercalated between at least some of the layers.

30. The stacked assembly of claim 14, wherein lithium atoms, ions, or both atoms and ions are intercalated between at least some of the layers lithium.

31. An energy-storing device or electrode comprising the stacked assembly of claim 14.

32. A battery comprising the stacked assembly of claim 14.

* * * * *